United States Patent [19]
Nishimura et al.

[11] Patent Number: 5,736,438
[45] Date of Patent: Apr. 7, 1998

[54] FIELD EFFECT THIN-FILM TRANSISTOR AND METHOD OF MANUFACTURING THE SAME AS WELL AS SEMICONDUCTOR DEVICE PROVIDED WITH THE SAME

[75] Inventors: Hisayuki Nishimura; Kazuyuki Sugahara; Shigenobu Maeda; Takashi Ipposhi; Yasuo Inoue; Toshiaki Iwamatsu; Mikio Ikeda; Tatsuya Kunikiyo; Junji Tateishi; Tadaharu Minato, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 483,411

[22] Filed: Jun. 7, 1995

Related U.S. Application Data

[62] Division of Ser. No. 142,564, Oct. 28, 1993, Pat. No. 5,514,880.

[30] Foreign Application Priority Data

Oct. 28, 1992 [JP] Japan .................... 4-290293

[51] Int. Cl.⁶ .................................... H01L 21/84
[52] U.S. Cl. .................................... 438/166; 438/162
[58] Field of Search ................... 437/21, 24, 83, 437/101, 233, 40 TFT, 41 TFT; 117/7, 8, 9; 438/166, 162

[56] References Cited

U.S. PATENT DOCUMENTS

| | | | |
|---|---|---|---|
| 4,448,632 | 5/1984 | Akasaka | 437/83 |
| 4,463,492 | 8/1984 | Maeguchi | 437/21 |

(List continued on next page.)

FOREIGN PATENT DOCUMENTS

| | | |
|---|---|---|
| 0397034 | 11/1990 | European Pat. Off. . |
| 0475 688 A2 | 3/1992 | European Pat. Off. . |
| 35 41 587 A1 | 5/1986 | Germany . |
| 42 09 364 A1 | 10/1992 | Germany . |
| 47-16084 | 8/1972 | Japan . |
| 59-165451 | 3/1983 | Japan . |
| 59-155121 | 9/1984 | Japan . |
| 59-165451 | 9/1984 | Japan . |
| 62-287614 | 12/1987 | Japan . |
| 63-283013 | 11/1988 | Japan . |
| 0261869 | 10/1989 | Japan . |
| 2052419 | 2/1990 | Japan . |
| 2-84773 | 3/1990 | Japan . |
| 3290923 | 4/1990 | Japan . |
| 2140916 | 5/1990 | Japan . |

(List continued on next page.)

OTHER PUBLICATIONS

"A Super Thin Film Transistor in Advanced Poly Si Films" by Takefumi Ohshima, Takashi Noguchi and Hisao Hayashi, Japanese Journal of Applied Physics, vol. 25., No. 4, Apr., 1986, pp. L291–293.

(List continued on next page.)

*Primary Examiner*—Jey Tsai
*Assistant Examiner*—Richard A. Booth
*Attorney, Agent, or Firm*—Lowe, Price, LeBlanc & Becker

[57] ABSTRACT

In a miniaturized complete CMOS SRAM of a TFT load type, a field effect thin-film transistor (TFT) can achieve stable reading and writing operation of a memory cell and can reduce power consumption thereof. The field effect thin-film transistor formed on an insulator includes an active layer and a gate electrode. The gate electrode is formed on a channel region of the active layer with a gate insulating film therebetween. The active layer is formed of a channel region and source/drain regions. The channel region is formed of a monocrystal silicon layer and does not includes a grain boundary. The source/drain regions is formed of a polysilicon layer. The channel region has a density of crystal defects of less than $10^9$ pieces/cm². The thin film transistor shows an ON current of 0.25 µA/µm per channel width of 1 µm and an OFF current of 15 fA/µm. The thin-film transistor can be applied to a p-channel MOS transistor serving as a load transistor in a memory cell of a CMOS type SRAM.

4 Claims, 66 Drawing Sheets

U.S. PATENT DOCUMENTS

| | | | |
|---|---|---|---|
| 4,659,392 | 4/1987 | Vasudev | 437/24 |
| 4,693,759 | 9/1987 | Noguchi et al. | 437/24 |
| 4,753,895 | 6/1988 | Mayer et al. | 437/21 |
| 4,775,641 | 10/1988 | Duffy et al. | 437/21 |
| 4,799,097 | 1/1989 | Szluk et al. | |
| 4,808,546 | 2/1989 | Moniwa et al. | |
| 4,933,298 | 6/1990 | Hasegawa | |
| 5,001,539 | 3/1991 | Inoue et al. | |
| 5,110,748 | 5/1992 | Sarma | |
| 5,156,987 | 10/1992 | Sandbu et al. | |
| 5,210,429 | 5/1993 | Adan | |
| 5,213,991 | 5/1993 | Inokawa et al. | |
| 5,262,455 | 11/1993 | Asida | |
| 5,281,828 | 1/1994 | Muragishi | |
| 5,290,712 | 3/1994 | Sato et al. | 117/8 |
| 5,298,434 | 3/1994 | Strater et al. | 437/21 |
| 5,317,178 | 5/1994 | Wu | |
| 5,318,661 | 6/1994 | Kumomi | 117/8 |
| 5,323,046 | 6/1994 | Ema et al. | |
| 5,327,003 | 7/1994 | Itabashi et al. | |
| 5,341,028 | 8/1994 | Yamaguchi et al. | |
| 5,365,080 | 11/1994 | Yamazaki et al. | |
| 5,373,803 | 12/1994 | Noguchi et al. | 117/9 |
| 5,531,182 | 7/1996 | Yonehara | 117/7 |

FOREIGN PATENT DOCUMENTS

| | | | |
|---|---|---|---|
| 2258690 | 10/1990 | Japan . | |
| 4-184918 | 11/1990 | Japan . | |
| 3060043 | 3/1991 | Japan . | |
| 3104210 | 5/1991 | Japan . | |
| 4-23317 | 1/1992 | Japan | 117/8 |
| 4042918 | 2/1992 | Japan . | |
| 4188613 | 7/1992 | Japan . | |
| 5-226246 | 9/1993 | Japan | 117/8 |
| 6-13311 | 1/1994 | Japan | 117/8 |

OTHER PUBLICATIONS

"Perforation seed structure in electron beam recrystallized silicon–on–insulator films" by Susumu Horita and Hiroshi Ishiwara, Appl. Phys. Lett. 50(12), 23 Mar. 1987, ©1987 American Institute of Physics.

"Parasitic Resistance Effects on Static MOS RAM", Shiohara et al., Digest of Technical Papers, Symposium on VLSI Technology, pp. 106–107, 1982.

"Recrystallization of Amorphized Polycrystalline Silicon Films On $SIO_2$: Temperature Dependence of the Crystallization Parameters", R.B. Iverson et al., J. Applied Physics 62(5), Sep. 1, 1987.

"Design of Drain Junction in Polysilicon MOSFETS", Hisao Hayashi, The Transactions of the IEICE C–II vol. J73–C–11 No. 4, Apr. 1990, pp. 277–283.

"Poly–Si By Solid Phase Crystallization In Hydrogen Atmosphere", Tominaga et al., The Japan Society of Applied Physics and Related Societies, pp. 608.

"Surface Oxidation Effect In The Lateral Solid Phase Epitaxy Of A–Si Under Ultra High Pressure", Wakabayashi et al., The Japan Society of Applied Physics and Related Societies, p. 617.

"Defect–Free Silicon Film on $SiO_2$ Formed by Zone Melting Recrystallization with High Scanning Speed" IEEE Transactions on Electron Devices, Apr. 1990, vol. No. 4.

FIELD EFFECT THIN-FILM TRANSISTOR AND METHOD OF MANUFACTURING THE SAME AS WELL AS SEMICONDUCTOR DEVICE PROVIDED WITH THE SAME

CROSS-REFERENCE TO RELATED APPLICATION

This application is a division of application Ser. No. 08/142,564 filed Oct. 28, 1995 and issued on May 7, 1996, as U.S. Pat. No. 5,514,880.

BACKGROUND OF THE INVENTION

1. Field of the Invention

The present invention generally relates to a field effect thin-film transistor and a method of manufacturing the same as well as a semiconductor device provided with the above transistors. In particular, to a field effect thin-film transistor (TFT) applicable to a static semiconductor memory device which includes memory cells formed of insulated gate field effect transistors (MOSFETs) and a method of manufacturing the same.

2. Description of the Background Art

A so-called static random access memory (SRAM) has been well known as one type of static semiconductor memory device. Since the present invention can achieve the most preferable effect when applied to the SRAM, description will be made on the SRAM.

In connection with the SRAM, effort has been made for increasing degree of integration and reducing a standby current. Memory cells of a high resistance load type have been used for increasing the degree of integration. In order to reduce power consumption of SRAM including the high resistance load memory cells, however, it is necessary to increase the resistance value of the high resistance load used in the memory cell. Also in the SRAM, increase of the degree of integration of the memory cells correspondingly requires increase of the resistance value of the high resistance load. Meanwhile, increase of resistance value of the high resistance load deteriorates stability of operation of the memory cells. In connection with the SRAM having a degree of integration of 4 Mbit or more, therefore, change from the high resistance load type to a CMOS type has been studied in order to avoid instability in operation of the memory cells.

The CMOS memory cell is formed of four n-channel MOS transistors and two p-channel transistors. If these six transistors were formed on a substrate of silicon monocrystal, an area occupied by the memory cell would be one and half times as large as that of the memory cell of the high resistance load type, so that reduction of the area occupied by the memory cell would become difficult. In order to increase the degree of integration to a higher extent, a so-called TFT load complete type CMOS memory cell of a three-dimensional structure has been developed; in which two p-channel MOS transistors are formed of thin-film transistors using polysilicon and disposed above four n-channel MOS transistors formed of a monocrystal silicon substrate.

FIG. 83 is an equivalent circuit diagram showing one memory cell M in an SRAM of the complete or fully CMOS type in the prior art. As shown in FIG. 83, inverter circuits, which are formed of two n-channel driver MOS transistors Q2 and Q4 as well as two p-channel load MOS transistors Q1 and Q3, respectively, are cross-coupled to form a flip-flop circuit. The flip-flop circuit includes two storage nodes (N1 and N2) connected to n-channel access transistors Q5 and Q6, respectively. A power supply voltage Vcc and a ground potential Vss are supplied to the flip-flop circuit. Drains of the access transistors Q5 and Q6 are connected to bit lines 33 and 34. Gate electrodes of the access transistors Q5 and Q6 are connected to a word line 35. As is well known, the SRAM thus constructed operates as follows. In a standby state, the word line 35 as well as bit lines 33 and 34 are held at 0V, the access transistors Q5 and Q6 are in an OFF-state, and thus the flip-flop circuit is isolated. Thereby, the storage node N1 (or N2) holds "High" (3V) as data, and the storage node N2 (or N1) holds "LOW" (0V) as data. Hold of data is carried out by holding electric charges accumulated in floating capacities in the storage nodes N1 and N2.

When a desired memory cell is selected, i.e., when the word line 35 is at the "High" level, the access transistors Q5 and Q6 are turned on. Thereby, the storage nodes N1 and N2 become conductive to the bit lines 33 and 34. In this operation, voltages corresponding the states of the storage nodes N1 and N2 appear on the bit lines 33 and 34 through the access transistors Q5 and Q6, respectively. In this manner, information held in the memory cell is read. For writing data into the memory cell, the access transistors Q5 and Q6 are maintained in the ON-state, and voltages corresponding to the desired states to be written are applied to the bit lines 33 and 34, respectively. In the reading/writing operations, as described above, the word line 35 is raised, and information of "High" or "Low" is stored from the bit lines 33 and 34 through the access transistors Q5 and Q6 into the storage nodes N1 and N2, or conversely, information is read from the storage nodes N1 and N2, whereby the memory cell functions as a static memory device. In the standby state of the memory cell of the SRAM having the CMOS circuit described above, only a leak current of the MOS transistor flows. Therefore, the SRAM of the complete CMOS type has a feature that the power consumption is extremely small.

FIG. 84 is an equivalent circuit diagram showing a three-dimensional arrangement of a memory cell of a complete CMOS SRAM of a TFT load type in the prior art. FIGS. 85A and 85B as well as FIG. 86 are schematic plans and a cross section showing a memory cell of the SRAM of the TFT load type in the prior art. Referring to FIGS. 84–86, the memory cell of the SRAM of the TFT load type in the prior art will be described below.

Referring to FIG. 84, an upper active element layer (will be referred to as an upper layer) is provided with the p-channel MOS transistors Q1 and Q3, each of which is integrally connected at its one electrode to the power supply Vcc. In the upper layer, a gate electrode of the p-channel MOS transistor Q1 and the other electrode of p-channel MOS transistor Q3 are integrally connected together at a node N21. A gate electrode of the p-channel MOS transistor Q3 and the other electrode of p-channel MOS transistor Q1 are integrally connected together at a node N11. The upper layer is also provided with the bit lines 33 and 34.

A lower active element layer (will be referred to as a lower layer) is provided with the n-channel MOS transistors Q2, Q4, Q5 and Q6. One electrode of each of the n-channel MOS transistors Q2 and Q4 is integrally connected to the ground electrode Vss. In the lower layer, a gate electrode of n-channel MOS transistor Q2 and the other electrode of n-channel MOS transistor Q4 are integrally connected together at a node N22, and a gate electrode of n-channel MOS transistor Q4 and the other electrode of n-channel MOS transistor Q2 are integrally connected together at a node N12. The lower layer is further provided with the word line 35.

The upper and lower layers are isolated from each other by an insulating layer. The insulating layer is provided with a through hole 51 for electrically connecting the node N11 in the upper layer to the node N12 in the lower layer, and is also provided with a through hole 52 for electrically connecting the node N21 in the upper layer and the node N22 in the lower layer. The CMOS flip-flop circuit is formed by connecting the MOS transistors Q1, Q2, Q3 and Q4 through the holes 51 and 52 in this manner.

Further in the lower layer, one electrode of the access n-channel MOS transistor Q5 is connected to the node N12, and a gate electrode thereof is connected to the word line 35. Similarly, one electrode of the n-channel MOS transistor Q6 is connected to the node n22, and a gate electrode thereof is connected to the word line 35. The other electrode of n-channel MOS transistor Q5 is electrically connected to the bit line 33 provided in the upper layer through a through hole 53 provided in the insulating layer. Similarly, the other electrode of n-channel MOS transistor Q6 is connected to the bit line 34 in the upper layer through a through hole 54.

FIGS. 85A and 85B are plans showing planar layouts of active elements in the upper and lower layers of the memory cell in SRAM shown in FIG. 84, respectively. Referring to FIG. 85A, the upper layer is provided with an active layer 55 which is made of polysilicon and is located on gate electrodes 60 with a gate insulating film therebetween. Regions of the active layer 55 not overlapping the gate electrodes 60 contain a large amount of boron (B) introduced thereinto to form $p^+$ regions. Thereby, the p-channel MOS transistors (TFTs) Q1 and Q3 are formed. Active elements in the upper layer have bottom gate structures in which the gate electrodes 60 are located under the active layers 55.

Referring to FIG. 85B, the lower layer is provided with active layers 56 located in a $p^-$ region of the semiconductor substrate. Gate electrodes 71 are formed on the active layers 56 with a gate insulating film therebetween. Regions of the active layers 56 not overlapping the gate electrodes 71 contain a large amount of arsenic (As) introduced thereinto to form $n^+$ regions. Thereby, n-channel MOS transistors Q2, Q4, Q5 and Q6 are formed.

The through holes 51, 52, 53 and 54 are provided for electrically connecting the upper and lower layers to each other as described above. The nodes N11 and N12 as well as the through holes for connecting them are two in number, respectively, which is determined in view of arrangement of them. In FIGS. 85A and 85B, there are shown neither an aluminum interconnections forming the ground line (Vss line) and bit lines 33 and 34 nor aluminum interconnections for reinforcing the word lines (gate electrodes) 71 at portions spaced by every several tens of bits. In the structure shown in FIGS. 85A and 85B, two aluminum interconnections forming the bit lines 33 and 34 are provided parallel to line L—L and contain the through holes 53 and 54. Aluminum interconnections for reinforcing the word lines 71, which are disposed above and parallel to the word line 71, serve to prevent drop of potential which may be caused by the electrical resistance of the word lines 71.

FIG. 86 is a schematic cross section showing a sectional structure taken along line L—L in FIGS. 85A and 85B. Referring to FIG. 86, brief description will be made on the sectional structure of the memory cell of SRAM in the prior art and a method of manufacturing the same.

A monocrystal silicon substrate 1 forms a $p^-$ region which is located at a main surface side in the memory cell region and contains impurity at a concentration of about $10^{18}/cm^3$. The silicon substrate 1 is provided at its main surface with an isolating oxide film 21 of 4000 Å in thickness formed by an LOCOS method. A gate oxide film 41 of 100 Å in thickness is formed on the main surface of silicon substrate 1. Each region isolated by the isolating oxide film 21 forms an active layer 56. The gate electrode 71 is formed on the region of active layer 56 in accordance with a predetermined pattern. The gate electrode 71 is formed of a polysilicon layer of 1500 Å in thickness, which contains phosphorus at a concentration of $10^{20}/cm^3$, and a tungsten silicide ($WSi_2$) layer of 2000 Å in thickness. Arsenic is implanted at a dosage of $2 \times 10^{15}/cm^2$ from above the patterned gate electrodes 71 to form source/drain regions ($n^+$ regions) 56b of the n-channel MOS transistors Q2, Q4, Q5 and Q6, i.e., regions of the active layers 56 over which the gate electrodes 71 are not located. Regions of the active layers 56 overlapping the gate electrodes 71 form channel regions 56a. An insulating film, i.e., oxide film is deposited by the CVD method on the gate electrode 71, and the interlayer insulating film 42 is formed therefrom after flattening the surface thereof. The interlayer insulating film 42 has a thickness of about 3000 Å.

The through holes 51 and 52 as well as through holes 53 and 54 (through holes 51 and 53 are not shown in FIG. 86) for the nodes N12 and N22 are opened in the interlayer insulating film 42. In the through holes 51, 52, 53 and 54, there are formed electrically conductive films 81 each of which is formed of a polysilicon layer of 2000 Å in thickness and containing arsenic at a concentration of $2 \times 10^{20}/cm^3$ and a tungsten silicide layer of 2000 Å in thickness. Over the through holes 51 and 52, there is deposited a polysilicon layer of 2000 Å in thickness, which contains arsenic at a concentration of $2 \times 10^{20}/cm^3$ and is patterned to form the gate electrodes 60 in the upper layer. On the gate electrodes 60, there is formed the oxide film, i.e., gate insulating film 43 of 200 Å in thickness by the CVD method. On the gate insulating film 43, there is deposited a polysilicon layer of 300 Å in thickness by the CVD method, which is patterned to form the active layers 55 in the upper layer. This deposition of the polysilicon layer is carried out at a temperature of 620° C. Portions of the gate insulating film 43 located above the through holes 51 and 52 are removed for the electrical connection to the lower layer. In the active layer 55, boron (B) is introduced into portions above the through holes 51 and 52 and portions not overlapping the gate insulating film 43 at a concentration of $2 \times 10^{20}/cm^3$ for forming the source/drain regions 55b (see FIG. 85A) of the p-channel MOS transistors Q1 and Q3. Similarly to the lower layer, a flattened interlayer insulating film 44 is formed at a thickness of about 3000 Å. The through holes 53 and 54 are opened again, and an aluminum interconnection layer 91 of 7000 Å in thickness is deposited and patterned to form the bit line 34 (FIG. 84) and the bit line 33 which cannot be seen in FIG. 86. Further, there is formed an interlayer insulating film 45, i.e., oxide film of 7000 Å in thickness by a plasma CVD method. On the interlayer insulating film 45, there is formed an aluminum interconnection layer 92 by depositing a layer of 8000 Å in thickness and patterning the same, for reinforcing the word line 35 (gate electrodes 71 in FIGS. 85B and 86). In this manner, the memory cell of the complete CMOS SRAM of the TFT load type is completed in the prior art. In FIG. 86, the ground line (Vss line) is not shown.

The conventional TFT (p-channel MOS transistor) has an electric characteristic such as shown in FIG. 87, which shows a relationship between a drain current ($I_D$) and a gate voltage ($V_G$) when a drain voltage $V_D$ of −3V is applied in a TFT having a channel length of 0.8 μm and a channel width of 0.4 μm. At the gate voltage $V_G$ of −3V (ON state), the drain current $I_D$ is 1nA ($10^{-9}$A), and at the gate voltage $V_G$ of 0V (OFF state), the drain current $I_D$ is 100 fA ($10^{-13}$A).

High integration of SRAM naturally requires miniaturization of elements forming the memory cell. For example, in the SRAM of 16 Mbit, a design size of an element is in a range from 0.35 to 0.4 μm. Miniaturization of elements to such a size causes a problem that the memory cell of SRAM does not operate due to the reasons which will be described below.

If the size of an element is miniaturized to 0.4 μm or less, a power supply voltage used for the same is reduced to 3.3V or 3V for ensuring reliability of a transistor. Further, in connection with β (will be expressed as $β_D$) of the driver transistor Q2 or Q4 and β (will be expressed as $β_A$) of the access transistor Q5 or Q6 in the lower layer, a ratio of $β_D/β_A$ (will be referred to as β ratio) takes a value of about 2, and cannot be sufficiently large. β is an amount expressing conductance of the transistor, and can be given by an expression of $β = με_{ox}ε_o W/(t_{ox}L)$ where μ is a degree of displacement, $ε_{ox}$ is a relative dielectric constant of the gate insulating film, $ε_o$ is a dielectric constant of the vacuum, $t_{ox}$ is a thickness of the gate oxide film, W is a gate width and L is a gate length.

In an equivalent circuit in FIG. 83, information stored in the memory cell is read by applying the voltage vcc to both the bit lines 33 and 34 and applying a positive voltage to the word line 35 for rendering conductive the access transistors Q5 and Q6. Thereby, the bit line is discharged at the driver transistor Q2 or Q4 at the "Low" level side in the memory cell (the driver transistors in the "Low" level side being in the ON state), whereby the potential of the bit line connected to the "Low" level side in the memory cell becomes lower than the potential of the bit line connected to the "High" level side and thus information held in the memory cell is transmitted to the bit line. In this reading operation, it is assumed that the node N2 maintains the potential of "Low" level (0V) and the node N1 maintains the potential of "High" level (3V). In this case, a current flows from the bit line 34 through the transistors Q6 and Q4 to the ground potential Vss (0V) because the transistors Q4 and Q6 are in the ON state. The potential at the crossing between the bit line 34 receiving the voltage Vcc (3V) and the transistor Q6 decreases from 3V to 1.5V due to the resistance of the bit line 34 itself. If the β ratio were sufficiently large, the potential of the node N2 would be maintained at a value near 0V. In the case of the β ratio of 2, however, the resistance (inverse number of conductance) of the transistor Q6 in ON state is twice as large as that of the transistor Q4, so that the potential of node N2 increases to 0.5V due to resistance division of them.

The node N2 is connected to the gate electrode of the n-channel MOS transistor Q2. Since the threshold voltage ($V_{th}$) of n-channel MOS transistors Q2 and Q4 is 0.7V, a subthreshold current of about 1nA will flow through the n-channel MOS transistor Q2. In this case, the p-channel MOS transistor Q1, which forms the inverter together with the n-channel MOS transistor Q2 connected thereto, is in the ON state because the gate voltage (potential of node N2) is 0.6V. More specifically, a voltage Vcc (3V) is applied to the source of p-channel MOS transistor, and the gate voltage viewed from the source is −2.5V (=0.5V −3V). Owing to this fact, the p-channel MOS transistor Q1 is in the ON state, as shown in FIG. 87. The drain current of the p-channel MOS transistor Q1 in the ON state is about 0.5 nA according to FIG. 87, and may be about 1 nA at the maximum.

In this manner, a current which is the subthreshold current flowing through the n-channel MOS transistor Q2 is of a value similar to that of the current flowing through the p-channel MOS transistor Q1. This means that the resistance of p-channel MOS transistor Q1 at the node side (N1 in this case) in the "High" level is equal to the resistance of n-channel transistor Q2 in the reading operation. Therefore, the potential of node N1 is reduced due to the resistance division to a half of the power supply voltage Vcc, i.e., 1.5V, so that the operation of memory cell becomes unstable and data may be inverted in the worst case. In other words, the charge at the "High" level accumulated in the stray capacitance of node N1 leaks toward the ground potential Vss (0V) due to the n-channel MOS transistor Q2 through which the subthreshold current flows in the standby state, since the leak current of the n-channel MOS transistor Q2 is very small and is 1 fA or less, reduction of charge caused by the leak current is supplemented by the p-channel MOS transistor Q1 in the ON state. In the reading operation, however, since the current leaking from the n-channel MOS transistor Q2 is larger than the current supplied from the p-channel MOS transistor Q1, data is destroyed.

Situation of destruction of data will be specified below. The node N1 is connected to the gate electrodes of transistors Q3 and Q4. When the potential of node N1 decreases from 3V to 1.5V, a voltage of 1.5V is applied to the gate electrode of the p-channel MOS transistor Q3. In this operation, the gate voltage viewed from the source side of the transistor Q3 is −1.5V (=1.5V−3V). Therefore, the transistor Q3 which was in the OFF state before the reading operation is turned on in the reading operation (see FIG. 87). Simultaneously with this, the gate voltage of n-channel MOS transistor Q4 lowers from 3V to 1.5V. Thereby, the current flowing through the transistor Q4 decreases, and the current flows through the transistor Q3, so that the potential of node N2 rises. When the potential of node N2 increases above the threshold voltage of transistor Q2, i.e., 0.7V, the transistor Q2 is turned on, and the current larger than the sub-threshold current flows. As a result, the potential of node N1 further lowers. When the potential of node N1 lowers to 0.7V or less, the gate voltage applied to the transistor Q4 becomes smaller than the threshold, so that the transistor Q4 is turned off. Thereby, the potential of node N2 rises to 3V, and the potential of node N1 lowers to 0V. In this manner, the data is inverted in the worst case. Thus, information held in the memory cell is destroyed.

instability of a memory cell due to reduction of a β ratio described above is specified in H. Shinohara et al., *Digest of Technical Papers*, Symposium on VLSI Technology (1982), pp 106–107.

A problem in the data writing operation will be discussed below. In the writing operation, a positive voltage is applied to the word line 35 to render the access transistors Q5 and Q6 conductive. The potential of one of the bit lines 33 and 34, which is selected for writing the "Low" level, is set at 0V for writing data. The operation immediately after the data of "Low" level is written into the node N2 will be discussed below. Although the potential of node N1 is at the "High" level, the access transistor Q5 is in the ON-state, so that the level lowers from Vcc (3V) to Vcc-Vth (=2V: Vth is a threshold voltage (1V) of the access transistor Q5), resulting in an unstable operation of the memory cell. Therefore, the potential of node N1 must be charged by the p-channel MOS transistor Q1 from (Vcc-Vth) to Vcc. The capacity of node N1 is about 1 fF, and the ON-current of p-channel MOS transistor Q1 is 1 nA, so that the time t required for the charging is calculated as t=1fF×1V/1nA=1μsec. Thus, a long time period of about 1 μsec is required until the memory cell attains a stable state. For this time period, information cannot be read from the memory cell. The access time for writing and reading data of SRAM generally must be about 50 nsec. Therefore, TFTs (p-channel MOS transistors) of which ON current is about 1 nA cannot be used for providing memory cells of industrially usable SRAMs.

Then, a problem relating to a standby current of SRAM of 16 Mbit will be discussed below. A memory cell of complete CMOS SRAM of the TFT load type employs the structure of CMOS inverter. Therefore, it does not include a current path for a direct current, and only a leak current of the transistor contributes to the power consumption of SRAM. In the memory cell in FIG. 83, one of the nodes N1 and N2 holds the potential at "High" level, and the other holds the potential at "Low" level. In the node holding the potential at "High" level, the n-channel MOS transistor Q2 or Q4 is in the OFF state. In the node holding the potential of "Low" level, the p-channel MOS transistor Q1 or Q3 is in the OFF state. The leak currents of n-channel MOS transistors Q2 and Q4 are not more than 1 fA, and the leak currents of p-channel MOS transistors (TFT) Q1 and Q3 are 100 fA (FIG. 87). Therefore, the standby current of the memory cell per one cell is nearly equal to the leak current of one p-channel MOS transistor (TFT). Therefore, the standby current of SRAM of 16 Mbit is 1.7 µA (=10fA×$2^{24}$ cells) exceeding 1 µA, and the SRAM cannot said to achieve low power consumption. In order to achieve the low power consumption, the standby current must be 1 µA or less (preferably, 0.1 µA or less). For this purpose, the leak current of TFT forming the memory cell of SRAM must be 60 fA or less (preferably, 6 fA or less).

From the above description, it is apparent that if the ON current of TFT is small, the memory cell operates unstably during reading and writing of data. In order to avoid this problem, it has been attempted to increase the β ratio of the driver transistor and access transistor. For this purpose, it is necessary to reduce the gate widths W of access transistors Q5 and Q6 and to increase the gate widths W of driver transistors Q2 and Q4. The minimum value of gate width W, however, is determined by the minimum workable size, so that it is impossible to reduce the gate widths of access transistors Q5 and Q6 below this size. Therefore, it is necessary to increase the gate widths W of driver transistors Q2 and Q4 in order to increase the β ratio. However, this increases the chip area of SRAM, and thus makes the miniaturization impossible. In order to increase the β ratio, the threshold voltage Vth of access transistors Q5 and Q6 may be set larger than that of driver transistors Q2 and Q4. Miniaturization of elements, however, requires reduction of the power supply voltage vcc, so that it becomes more difficult to increase the threshold voltage Vth of access transistors Q5 and Q6 as the degree of integration of SRAM increases.

If the OFF current of TFT is large, the power consumption of SRAM increases. Since the power consumption of SRAM is proportional to the number of TFTs (strictly, it is calculated by (number of TFTs)×(gate width), and if the degree of integration increases four times, the power consumption increases about three times), the increase of degree of integration of SRAM naturally and unpreferably causes increase of the power consumption if the performance of TFTs is unchanged.

From the above description, it can be understood that the problem that the miniaturized SRAM does not operate correctly is due to the performance of TFTs. Compared with a transistor formed on a substrate of monocrystal silicon, the ON current of TFT is small and the OFF current thereof is large due to crystal grain boundaries of polysilicon existing in a channel portion of TFT.

FIGS. 88A and 88B are a plan and a perspective view of a TFT, respectively, which show the channel region of TFT used in the miniaturized SRAM and a portion there around. The active layer 55 is formed on the gate electrode 60 with the gate insulating film therebetween. The active layer 55 is formed of drain, channel and source regions. The channel region overlaps the gate electrode 60. As shown in the perspective view of FIG. 88B, an average diameter of crystal grains included in a polysilicon film of 300 Å in thickness is determined to be 200 Å by a transmission type electron microscope (TEM). The gate width is 0.4 µm and the gate length is 0.8 µm. Therefore, about 800 crystal grains exist in the channel region of 0.4 µm by 0.8 µm, and about 40 crystal grains exist in a direction parallel to the channel length. As is well known, the grain boundary operates as a trap of carriers (positive holes) in the channel region. The carriers fixed by the trap excludes the carriers near the grain boundaries, and form a potential barrier. Due to the existence of the potential barrier, the electric characteristic of TFT shows phenomena such as lowering of the drain current and lowering of the degree of displacement, as compared with transistors formed on a monocrystal silicon substrate. Therefore, the ON current of TFT decreases. A large number of dangling bonds of silicon atoms exist in the grain boundary. The dangling bonds form a large number of mid-gap levels in the energy band structure of silicon. Electrons are excited from a valence band to a conduction band by thermal excitation through these mid-gap levels, and thus flow from the drain to the source, so that the OFF current of TFT increases. Therefore, it is necessary to increase the grain diameter of polysilicon crystal and to reduce the number of crystal boundaries in order to increase the ON current of TFT and to reduce the OFF current thereof.

In order to increase the grain diameter of polysilicon crystal, there has been known a method in which amorphous silicon is deposited and the solid-phase growth-thereof is carried out by annealing the same at a temperature of about 600° C. for several hours for obtaining a polysilicon film of a large grain diameter. There are various method for forming the amorphous silicon. For example, the amorphous silicon is formed by the CVD method at a low temperature of not more than 450° C. using disilane ($Si_2H_6$) gas as material. In this method, although the grain diameter of polysilicon can be increased to 1 µm or more, the position at which the grain boundary generates cannot be controlled.

For example, Japanese Patent Laying-Open No. 62-287614 (1987) discloses a method in which an amorphous silicon film is formed at a thickness of 1000 Å or more for increasing the crystal drain diameter of the solid-phase-grown polysilicon film. Further, Japanese Patent Laying-Open No. 2-84773 (1990) discloses a thin-film transistor of which channel region is formed of a crystal region except for a portion including a grain boundary. This reference, however, discloses only a method in which the polysilicon film including grains of a large diameter is obtained from the amorphous silicon film, and does not disclose in any way a method for controlling the position itself in which the grain boundary generates.

For the reasons described above, it is unavoidable that the miniaturized TFT contains grain boundaries existing at a certain rate in the channel region. Further, according to the conventional solid-phase growth method, it is impossible to obtain the TFT provided with a channel region formed of a crystal structure which is controlled to show a large ON current and a small OFF current.

SUMMARY OF THE INVENTION

An object of the invention is to stabilize reading and writing operations of a highly integrated SRAM of a complete CMOS type.

Another object of the invention is to reduce power consumption of a highly integrated SRAM of a complete CMOS type.

Still another object of the invention is to provide a thin-film transistor which can stabilize reading and writing operations of a highly integrated SRAM of a complete CMOS type and can reduce power consumption.

Yet another object of the invention is to provide a thin-film transistor showing a large ON current and a small OFF current.

A further object of the invention is to provide a method of manufacturing a thin-film transistor which controls the channel region to be formed of monocrystal.

A further object of the invention is to provide a method-of manufacturing a thin-film transistor which reduces a density of crystal defects contained in a channel region.

A field effect thin-film transistor according to an aspect of the invention includes a semiconductor thin film, source and drain regions, a gate insulating film and a gate electrode, which are formed on an insulator. The semiconductor thin film includes a portion which forms a channel region having a predetermined channel width. The source and drain regions are formed in portions of the semiconductor thin film which are isolated from each other in a direction crossing the channel width by the channel region. The gate insulating film is formed on the channel region. The gate electrode is formed on the gate insulating film. The channel region of the semiconductor thin film is formed of a crystal structure controlled to flow a current between the source and drain regions, which attains a value of $-0.25$ μA or more per channel width of 1 μm if a voltage of $-3V$ is applied across the source and drain regions and a voltage of $-3V$ is applied across the gate electrode and the source region, and attains a value of $-15$ fA or less per channel width of 1 μm if a voltage of $-3V$ is applied across the source and drain regions and a voltage of $0V$ is applied across the gate electrode and the source region.

A field effect thin-film transistor according to another aspect of the invention includes a semiconductor thin film, source and drain regions, a gate insulating film and a gate electrode. The semiconductor thin film includes a portion forming a channel region. The source and drain regions are formed in portions of the semiconductor thin film which are isolated from each other by the channel region. The gate insulating film is formed on the channel region. The gate electrode is formed on the gate insulating film. The channel region in the semiconductor thin film is formed of monocrystal, and has crystal defects at a density of not more than $10^9/cm^2$.

According to a method of manufacturing a field effect thin-film transistor of the invention, a polycrystal semiconductor film is first formed. Ions are selectively implanted at a predetermined dosage into the polycrystal semiconductor film to form an amorphous semiconductor film, a portion of which is controlled such that the number of generated crystal nucleuses is one or less. By heat treatment of the amorphous semiconductor film, a crystalline semiconductor thin film including a region made of monocrystal is formed. A gate insulating film is formed on this region. A gate electrode is formed on the gate insulating film. Impurity is introduced into two regions located at opposite sides of the said region in the crystalline semiconductor thin film, to form source and drain regions.

According to a method of manufacturing a field effect thin-film transistor of another aspect of the invention, an amorphous semiconductor film having a main surface and including a predetermined region, in which a number of generated crystal nucleuses is controlled to be one or less, is formed. The amorphous semiconductor film is selectively removed to form a side surface of the amorphous semiconductor film forming an acute angle with respect to the main surface. By heat treatment of the amorphous semiconductor film, a crystalline semiconductor thin film including a region made of monocrystal is formed. A gate insulating film is formed on this region, and a gate electrode is formed on the gate insulating film. Impurity is introduced into two regions located at opposite sides of the said region in the crystalline semiconductor thin film, to form source and drain regions.

According to a method of manufacturing a field effect thin-film transistor of still another aspect of the invention, an amorphous semiconductor film including a predetermined region, in which a number of generated crystal nucleuses is controlled to be one or less, is first formed. Hydrogen ions or fluorine ions are implanted into a region in the amorphous semiconductor film to generate minute crystal nucleuses. By heat treatment of the amorphous semiconductor film, a crystalline semiconductor thin film including the region described above and the remaining region made of monocrystal is formed. A gate insulating film is formed on remaining region, and a gate electrode is formed on the gate insulating film. Impurity is introduced into two regions located at opposite sides of said remaining region of the crystalline semiconductor thin film to form source and drain regions.

According to a method of manufacturing a field effect thin-film transistor of yet another aspect of the invention, an amorphous semiconductor film, in which a number of generated crystal nucleuses is controlled to be one or less per predetermined area, is first formed. Electron rays are irradiated to a region in the amorphous semiconductor film. By heat treatment of the amorphous semiconductor film, a crystalline semiconductor thin film in which a region is made of monocrystal is formed. A gate insulating film is formed on this region, and a gate electrode is formed on the gate insulating film. Impurity is introduced into two regions located at opposite sides of the said region in the crystalline semiconductor thin film to form source and drain regions.

According to a method of manufacturing a field effect thin-film transistor of still another aspect of the invention, an amorphous semiconductor film in which a number of generated crystal nucleuses is controlled to be one or less per a predetermined area, is first formed. A compression stress is left in a region in a region of the amorphous semiconductor film. By heat treatment of the amorphous semiconductor film, a crystalline semiconductor thin film in which a region is made of monocrystal is formed. A gate insulating film is formed on this region, and a gate electrode is formed on the gate insulating film. Impurity is introduced into two regions located at opposite sides of the said region in the crystalline semiconductor thin film to form source and drain regions.

According to a method of manufacturing a field effect thin-film transistor of a further aspect of the invention, a polycrystal semiconductor film is first formed. Semiconductor ions are selectively implanted into the polycrystal semiconductor film at a predetermined dosage to form a semiconductor film including an amorphous region, in which a number of generated crystal nucleuses is controlled to be one or less, and a crystalline region having a portion which is in point-contact with the partial region of the amorphous region. By heat treatment of the semiconductor film, a crystalline semiconductor thin film in which a region is made of monocrystal is formed. A gate insulating film is formed on this region. A gate electrode is formed on the gate insulating film. Impurity is introduced into two regions located at opposite sides of the said region in the crystalline semiconductor thin film to form source and drain regions.

According to a method of manufacturing a field effect thin-film transistor of a still further aspect of the invention, an amorphous semiconductor film in which one crystal nucleus is left only in a region is formed. By heat treatment of the amorphous semiconductor film, a crystalline semiconductor thin film in which a region is made of monocrystal is formed. A gate insulating film is formed on this region. A gate electrode is formed on the gate insulating film. Impurity is introduced into two regions located at opposite sides of the said region in the crystalline semiconductor thin film to form source and drain regions.

According to a method of manufacturing a field effect thin-film transistor of yet further aspect of the invention, an amorphous semiconductor film which includes a region having a first film thickness and a region having a second film thickness larger than the first film thickness is formed. In the amorphous semiconductor film, the number of generated crystal nucleuses per a prescribed area is controlled to be one or less. By heat treatment of the amorphous semiconductor film, a crystalline semiconductor thin film in which the region having the second film thickness is made of monocrystal is formed. A gate insulating film is formed on the region having the second film thickness, and the gate electrode is formed on the gate insulating film. Impurity is introduced into two regions located at opposite sides of the region having the second film thickness in the crystalline semiconductor thin film to form source and drain regions.

In the field effect thin-film transistor of the invention, an ON current per gate width of 1 μm is 0.25 μA or more. Therefore, the thin-film transistor of the invention can be used as a load transistor in an SRAM which is highly integrated and miniaturized into 16 Mbits or more for stabilizing reading and writing operations of the SRAM. In the thin-film transistor of the invention, an OFF current per gate width of 1 μm is 15 fA or less. Therefore, the thin-film transistor of the invention may be used as a load transistor in an SRAM which is highly integrated and miniaturized into 16 Mbits or more for reducing power consumption of the SRAM.

Also in the field effect thin-film transistor of the invention, the channel region of the semiconductor thin film is formed of monocrystal, and has a density of crystal defects of less than $10^9$ pieces/cm$^2$. Therefore, the thin-film transistor shows a large ON current and a small OFF current. Accordingly, the thin-film transistor contributes to stabilize reading and writing operations of highly integrated and miniaturized SRAM and reduce power consumption of the SRAM.

The method of manufacturing the field effect thin-film transistor according to the invention, is controlled such that channel region is formed of monocrystal. A density of crystal defects contained in the channel region is reduced. As a result, the thin-film transistor manufactured by the invention shows a large ON current and a small OFF current as compared with the prior art.

The foregoing and other objects, features, aspects and advantages, of the present invention will become more apparent from the following detailed description of the present invention when taken in conjunction with the accompanying drawings.

BRIEF DESCRIPTION OF THE DRAWINGS

FIGS. 56A–64A are plans showing different steps in embodiment 1 of a method of manufacturing an SRAM to which the thin-film transistor of the invention is applied, and FIGS. 56B–64B are cross sections showing the same steps;

FIGS. 66A–70A are plans showing different steps in embodiment 2 of a method of manufacturing an SRAM to which the thin-film transistor of the invention is applied, and FIGS. 66B–70B are cross sections showing the same steps;

FIGS. 75A–77A are plans showing different steps in embodiment 7 of a method of manufacturing an SRAM to which the thin-film transistor of the invention is applied, and FIGS. 75B–77B are cross sections showing the same;

FIGS. 78A–82A are plans showing different steps in embodiment 8 of a method of manufacturing an SRAM to which the thin-film transistor of the invention is applied, and FIGS. 78B–82B are cross sections showing the same;

DESCRIPTION OF PREFERRED EMBODIMENTS

Figure 1A:
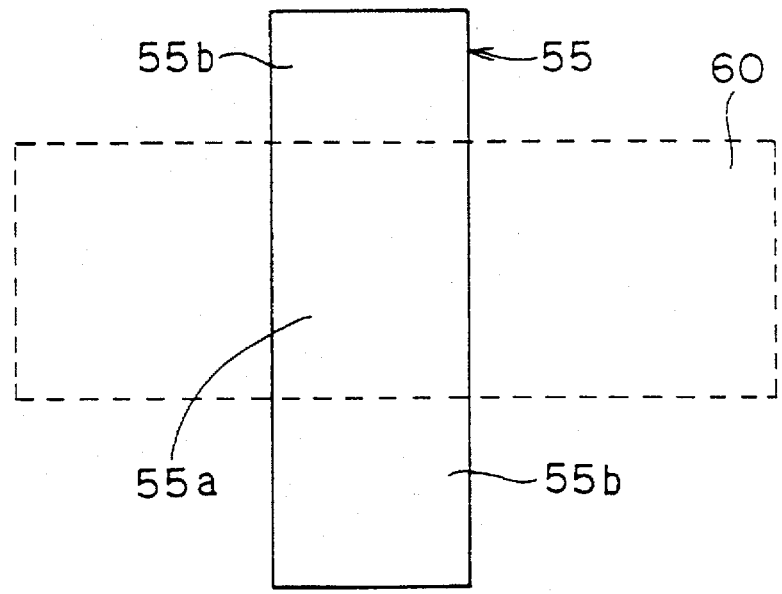
FIGS. 1A is a plan schematically showing a thin-film transistor of an embodiment of the invention.
Figure 1B:
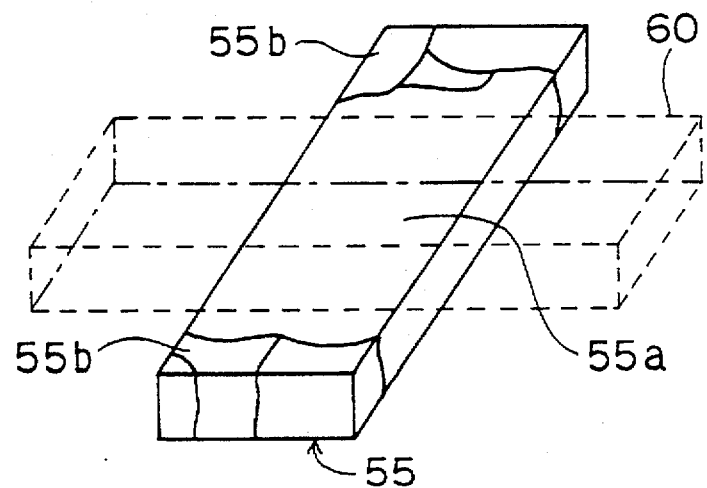
FIG. 1B is a perspective view thereof.

FIGS. 1A and 1B schematically show a structure of a TFT according to the invention which is applicable to a miniaturized SRAM. The TFT serving as a p-channel MOS transistor includes a gate electrode 60 and an active layer 55. The gate electrode 60 is disposed on the active layer 55 with a gate insulating film therebetween. The active layer 55 is formed of a channel region 55a and source/drain regions 55b. The channel region 55a does not include a grain boundary, and is formed of a monocrystal silicon layer. The source/drain regions 55b are formed of a polysilicon layer. The channel region 55a has a crystal defect density controlled at a low value.

Table 1 shows characteristics of TFTs which are provided with active layers manufactured by various methods, respectively. Table 1 shows relationships between values of ON and OFF currents of TFTs, numbers of grain boundaries crossing the channel regions in the respective TFTs, and crystallinity (defect density) of the channel regions. In Table 1, Nos. 1–3 indicate characteristics of TFTs using active layers formed by the methods A–H of the invention. Nos. 4 and 5 indicate characteristics of TFTs using active layers formed by conventional solid-phase growth method. Nos. 6–8 show examples for comparison, and specifically show characteristics of TFTs using active layers manufactured by other methods. The current values are represented by values per channel width of 1 μm. Circular ("O") marks represent TFTs which satisfy both the conditions that the ON current is not less than 0.25 μA/μm and the OFF current is not more than 15 fA/μm, and cross ("x") marks represent TFTs which does not satisfy both conditions.

| No. | Method Of Manufacturing TFT Active Layer | Channel Region No. Of Grain Boundary (pieces) | Channel Region Density of Crystal Defects (pieces/cm²) | Current Value per 1 μm Channel Width ON (μA) | Current Value per 1 μm Channel Width OFF (1A) | Determination |
|---|---|---|---|---|---|---|
| 1 | B | 0 | $1 \times 10^8$ | 2 | 6 | ○ |
| 2 | A, E | 0 | $5 \times 10^8$ | 0.25 | 15 | ○ |
| 3 | C, D, E, F, G, H | 0 | $2 \times 10^8$ | 1 | 10 | ○ |
| 4 | Conventional Solid Phase Growth | 0 | $1 \times 10^9$ | 0.2 | 30 | X |
| 5 | Conventional Solid Phase Growth | 1 | $1 \times 10^9$ | 0.1 | 40 | X |
| 6 | Laser Annealing (Large Output) | 1 | $1 \times 10^5$ | 4 | 10 | ○ |
| 7 | Laser Annealing (Small Output) | ⁻10 | $1 \times 10^9$ | 2 pA | 40 | X |
| 8 | LPCV Method ((Polycrystalline Layer of Minute Grain Size) | ⁻100 | $1 \times 10^{12}$ | 50 pA | 40 | X |

Referring to Table 1, Nos. 4 and 5 show the characteristics of TFTs using active layers which are formed only by the solid-phase growth method without controlling positions of grain boundaries. In particular, No. 4 does not satisfy the conditions for the predetermined current values described above in spite of the fact that the grain boundary does not exist in the channel region, because the crustal defect density is large. As can be understood from this, TFTs having the channel region in which the defect density is about $1 \times 10^9$ pieces/cm² cannot satisfy the required values of ON and OFF currents, even if the grain boundary does not exist in the channel region.

Meanwhile, the TFTs (Nos. 1, 2 and 3) using the active layers manufactured by the method of the invention satisfy the required values of ON and OFF currents. The channel regions formed by the method of the invention do not include the grain boundary and has the crystal defect density of not more than $1 \times 10^9$/cm².

As another example, reference will be made to characteristics of TFTs using active layers formed by a laser anneal method. No. 6 shows an example where the output of laser is large enough to melt polysilicon. No. 7 shows an example where the output of laser is insufficient to melt polysilicon. In the example of No. 6, the silicon crystal grains forming the active layer is generally about 0.5 μm in diameter, and there is no significant variation in diameters. One grain boundary exists in the channel region. However, the crystal defect density is maintained at a very low value. Therefore, the TFT satisfies the required values of ON and OFF currents. In the example of No. 7, the grain diameter of the obtained active layer is small, and the crystal defect density is high. Therefore, demands for the predetermined current values cannot be satisfied.

No. 8 shows characteristics of a TFT using an active layer which is a polysilicon layer formed by an LPCVD method. In this example, the active layer is made of crystal having a minute grain diameter of about 150 Å. This TFT cannot satisfy the demands for the predetermined current values.

Figure 2:
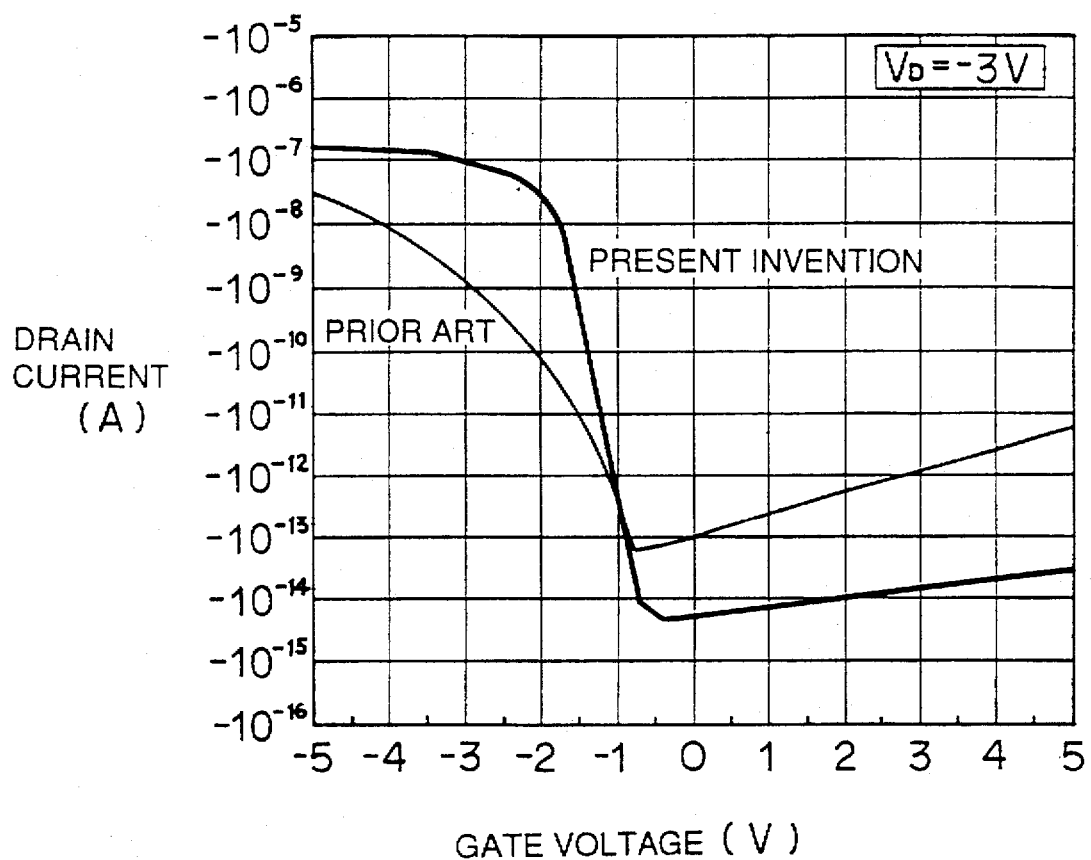
FIG. 2 is a graph showing an electric characteristic of a thin-film transistor of an embodiment of the invention.

FIG. 2 shows an electric characteristic of a TFT according to an embodiment of the invention plotted together with a conventional example. Specifically, FIG. 2 shows relationships between the drain current $I_D$ and gate voltage $V_G$ when the drain voltage $V_D$ of $-3V$ is applied in TFTs having a channel length of 0.8 μm and a channel width of 0.4 μm.

According to the TFT of the invention, the drain current $I_D$ is $-0.1$ μA ($10^{-7}$A) when the gate voltage $V_G$ is $-3V$, i.e., in the ON state, and the drain current $I_D$ is $-6$ fA ($6 \times 10^{-15}$A) when the gate voltage $V_G$ is 0V, i.e., in the OFF state. These values correspond to $-0.25$ μA/μm and $-15$ fA/μm, respectively, when converted into values per gate width of 1 μm. It can be understood that the TFT of the invention shows a high ON current and a low OFF current, as compared with the conventional TFT.

Figure 3A:
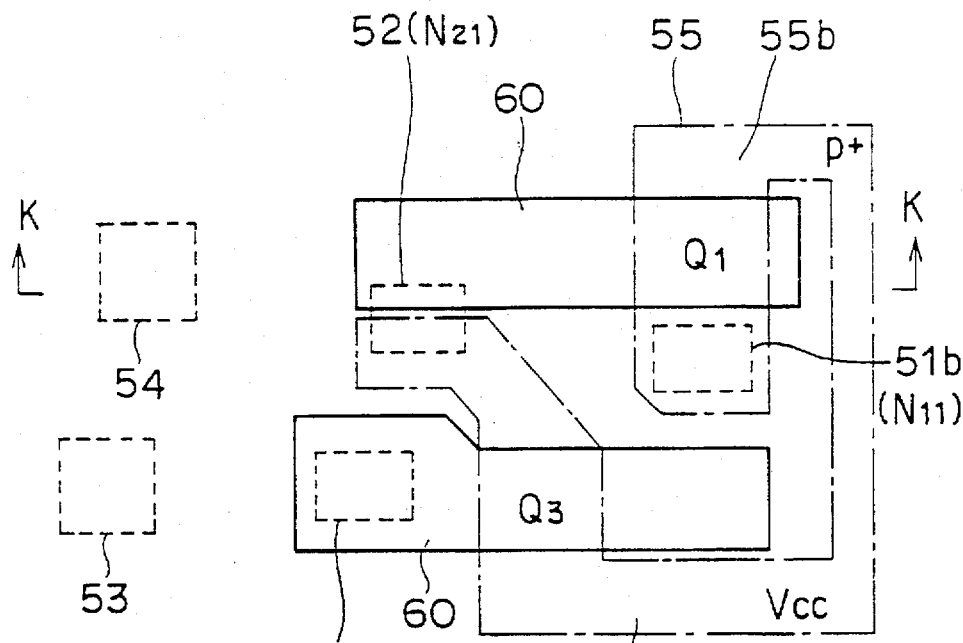
FIGS. 3A and 3B are plans of a memory cell of a miniaturized SRAM to which the thin-film transistors of the invention are applied.
Figure 3B:
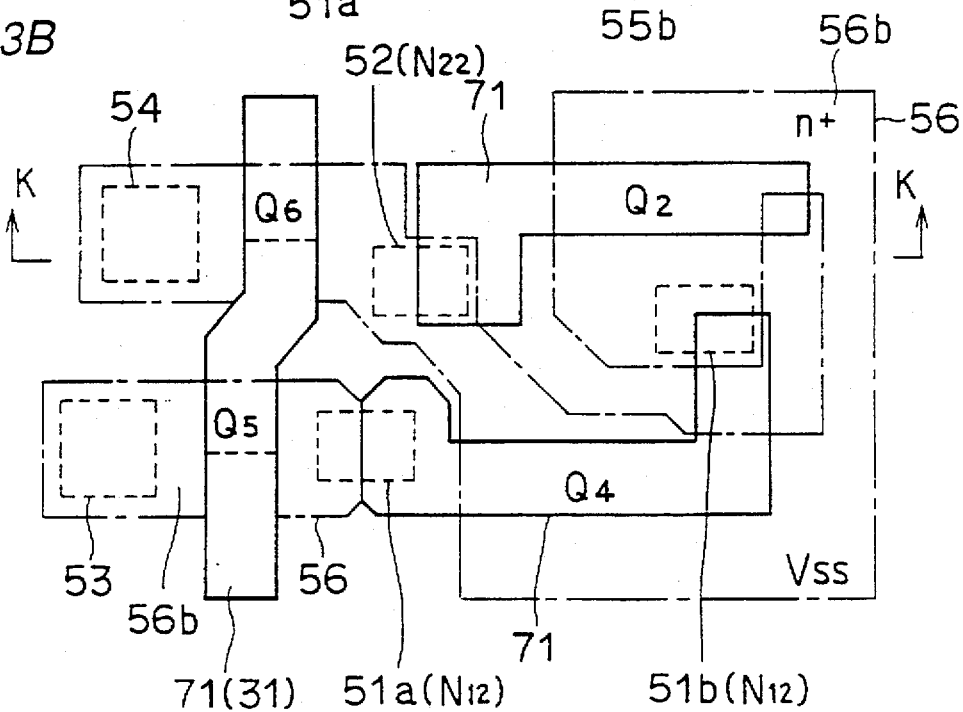
Figure 83:
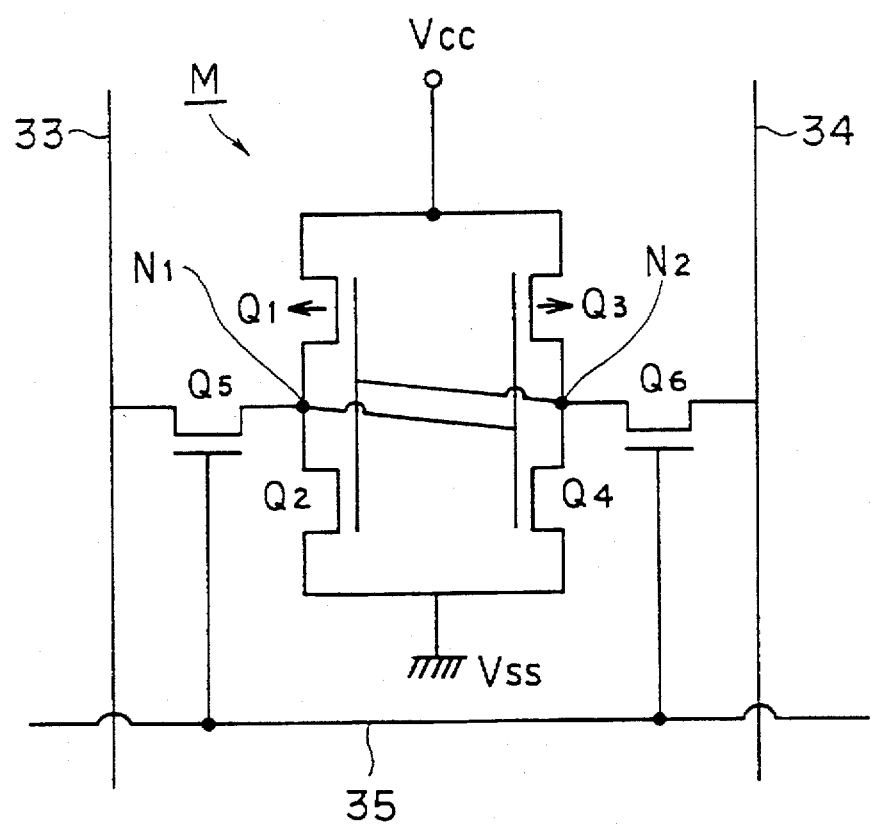
FIG. 83 is an equivalent circuit diagram showing a memory cell of a miniaturized SRAM of the invention and the prior art.
Figure 84:
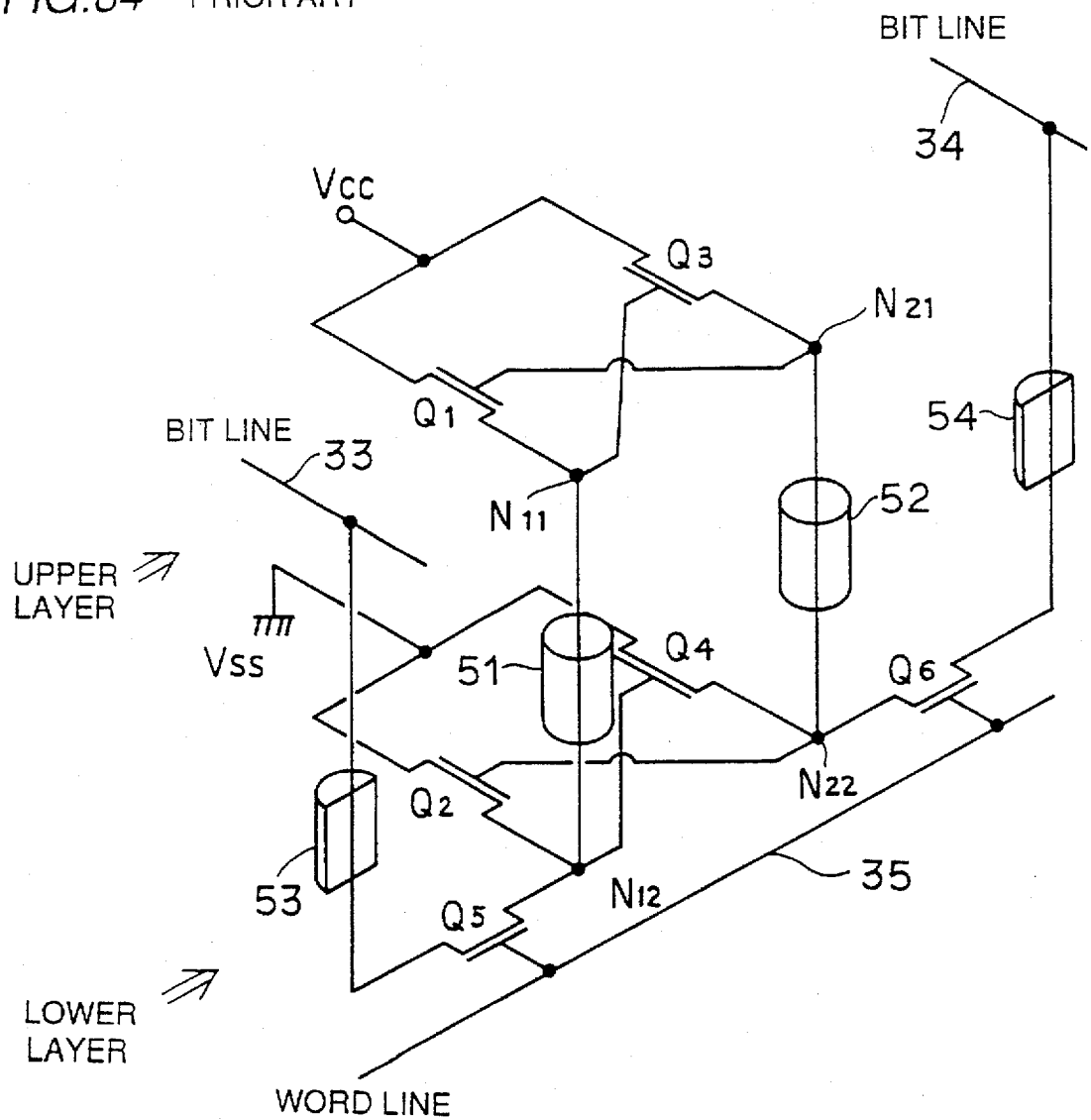
FIG. 84 is an equivalent circuit diagram showing an actual three-dimensional layout of the equivalent circuit of the memory cell of miniaturized SRAM of the invention and the prior art.
Figure 85A:
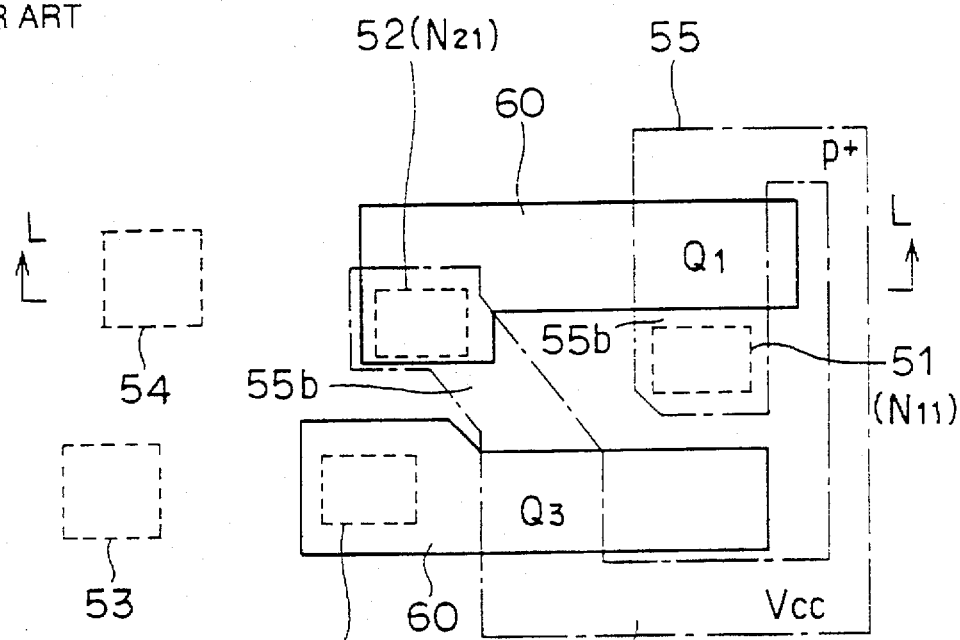
FIGS. 85A and 85B are plans showing the memory cell of a miniaturized SRAM in the prior art.
Figure 85B:
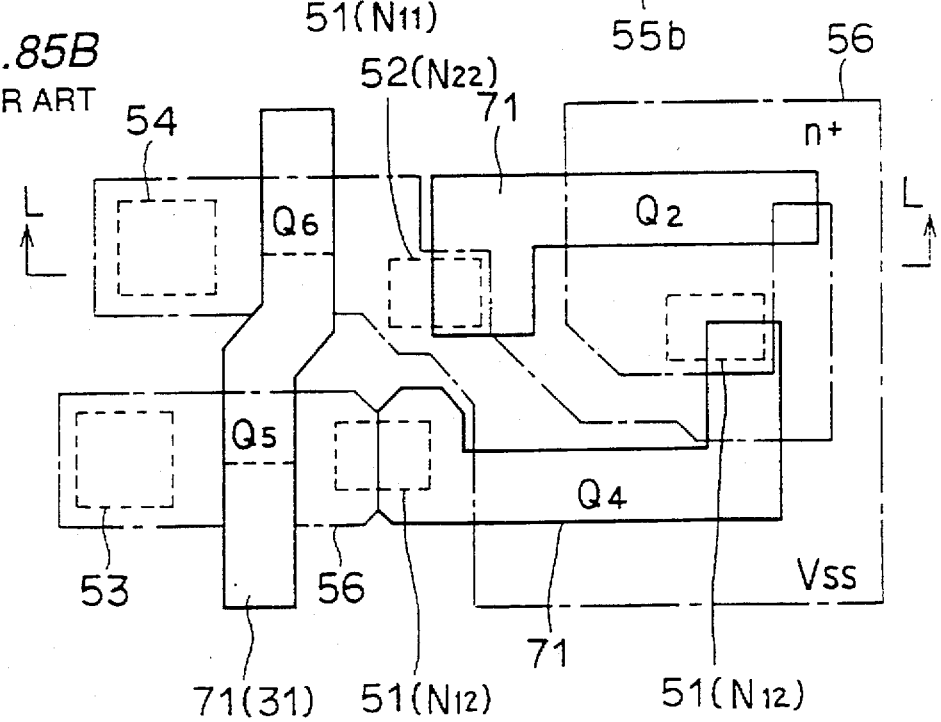

FIGS. 3A and 3B are plans showing planar layouts of active elements in upper and lower layers of a memory cell of a complete CMOS SRAM of a TFT load type according to an embodiment of the invention, respectively. The equivalent circuit of the memory cell of SRAM of the invention is the same as that in FIGS. 83 and 84 showing the prior art.

In the upper layer shown in FIG. 3A, the gate electrodes 60 are formed on the active layer 55 with the gate insulating film therebetween. The active layer has a portion not overlapping the gate electrode 60, into which boron (B) is implanted to form p-type source/drain regions 55b. The source/drain regions 55b are formed of polysilicon layers. In this manner, p-channel MOS transistors (TFTs) Q1 and Q3 are formed. The active elements in the upper layer employ a top gate structure in which the gate electrodes 60 are located above the active layer 55.

Meanwhile, in the lower layer shown in FIG. 3B, active layers 56 are formed in a p⁻ region of the semiconductor substrate. Gate electrodes 71 are formed on the active layers 56 with a gate insulating film therebetween. The active layers have portions not overlapping the gate electrode 71, into which arsenic (As) is introduced to form n⁺ source/drain regions 56b. In this manner, n-channel MOS transistors Q2, Q4, Q5 and Q6 are formed. There are also provided through holes 51a, 51b, 52, 53 and 54 for electrically connecting the upper and lower layers to each other. In a region including the through hole 52, the gate electrode 60 is located without overlapping the active layer 55.

Figure 4:
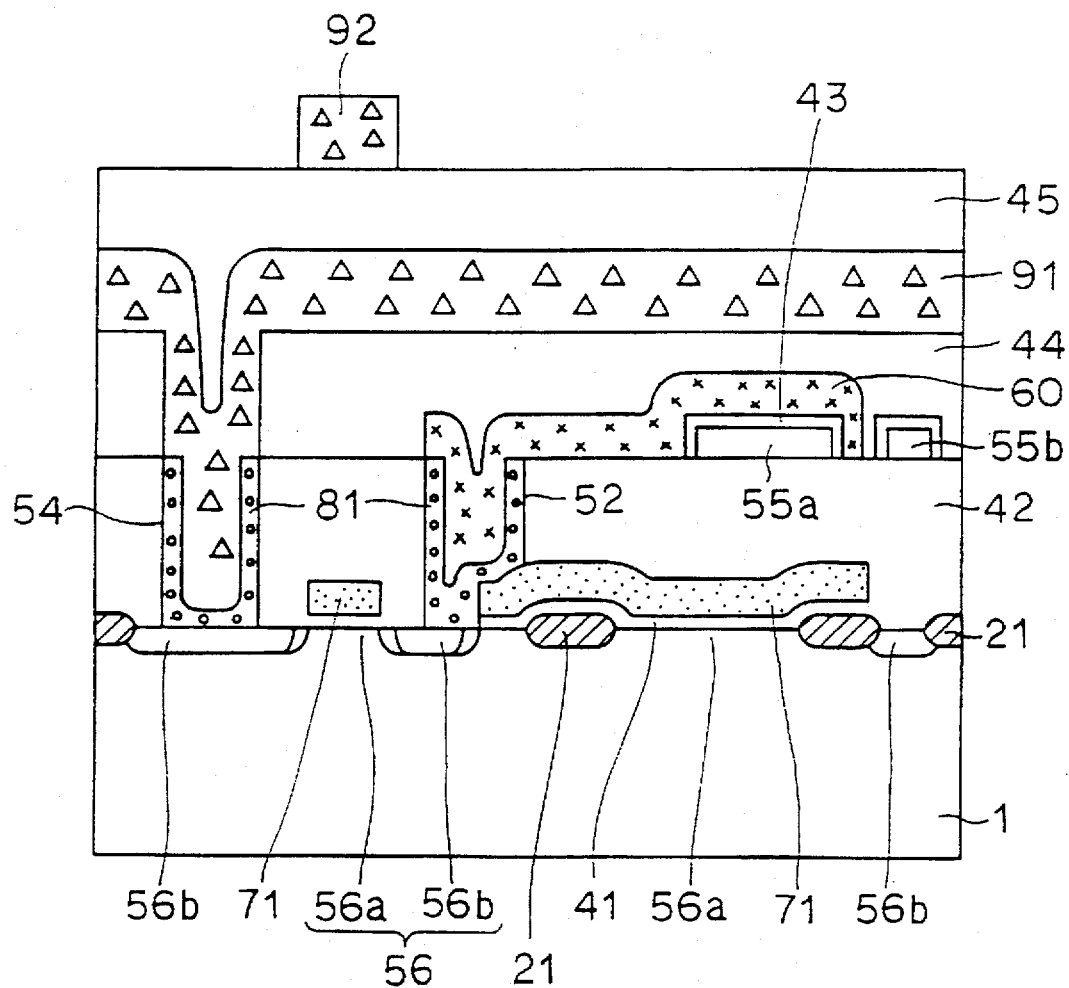
FIG. 4 is a cross section taken along line K—K in FIGS. 3A and 3B.
Figure 86:
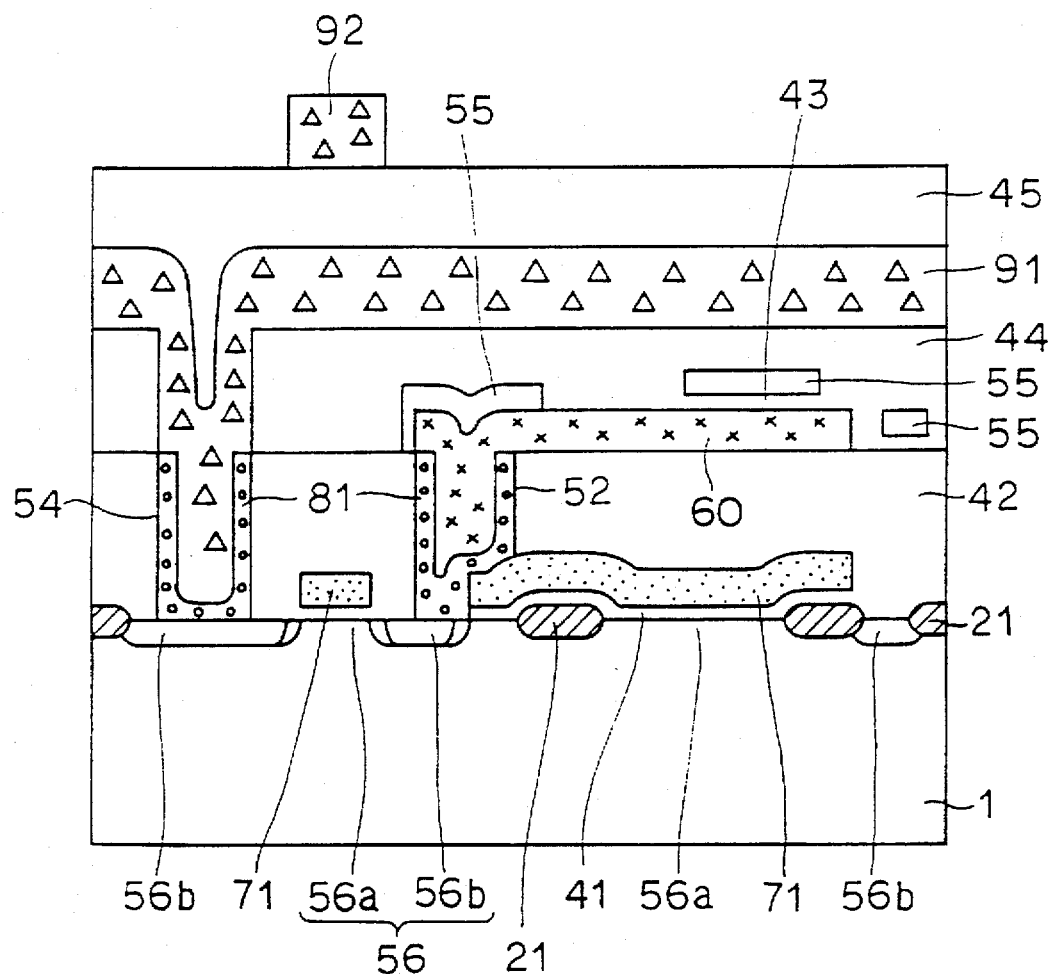
FIG. 86 is a cross section showing a sectional structure taken along line L—L in FIGS. 85A and 85B.
Figure 87:
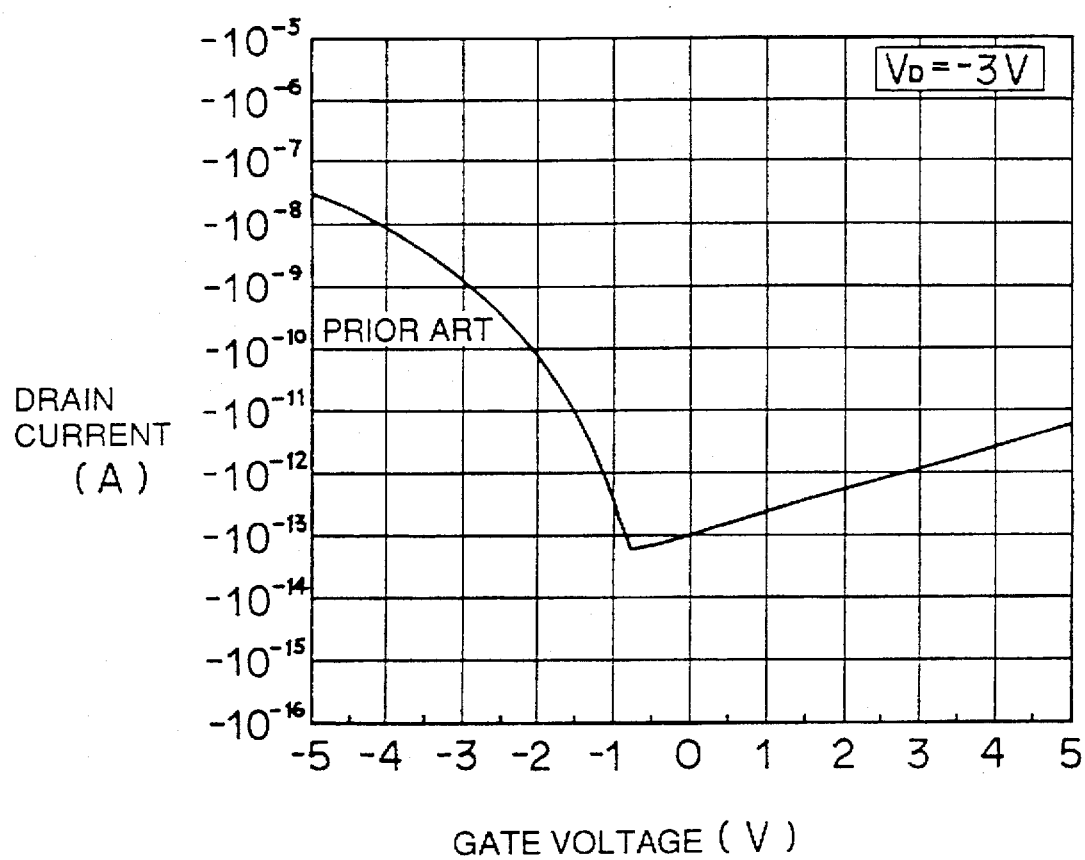
FIG. 87 is a graph showing an electric characteristic of a thin-film transistor in the prior art.
Figure 88A:
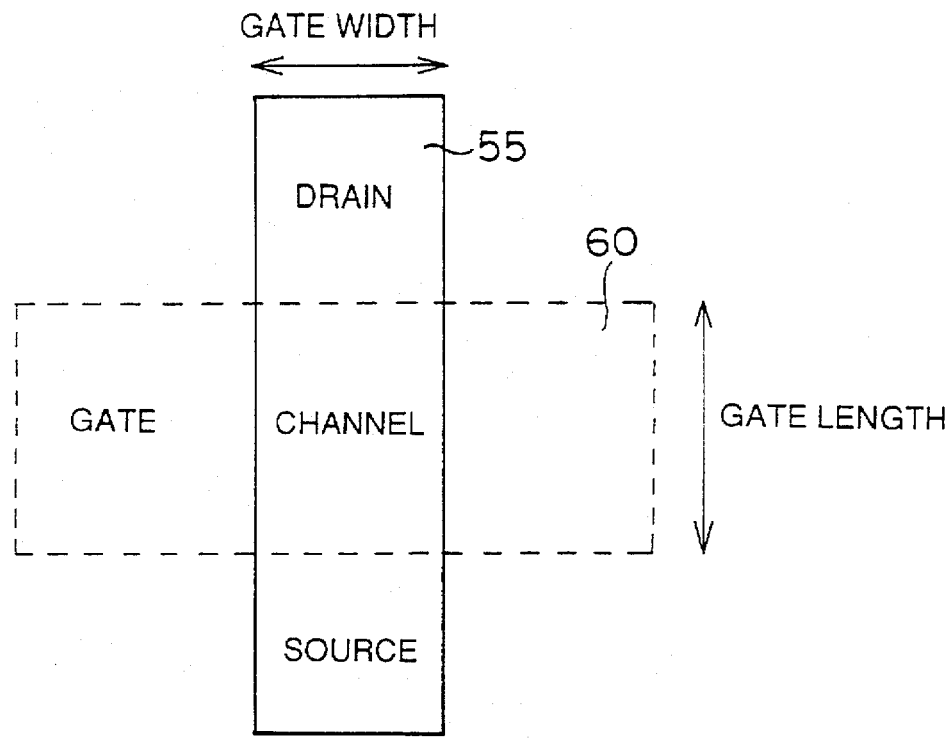
FIG. 88A is a plan schematically showing a structure of the thin-film transistor in the prior art.
Figure 88B:
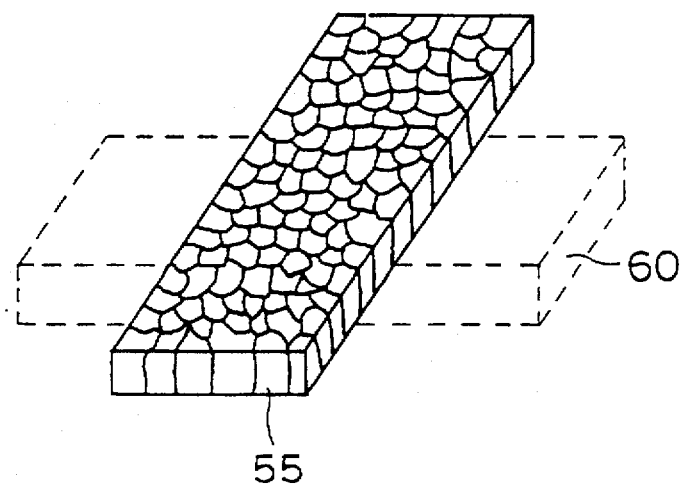
FIG. 88B is a perspective view of the same.

Referring to FIG. 4, description will be made on a sectional structure of an embodiment of the memory cell of SRAM to which the TFTs of the invention is applied. The structure of the lower layer is similar to the conventional structure shown in FIG. 86, and thus will be described briefly. The silicon monocrystal substrate 1 is provided with isolating oxide films 21 isolating the active layers 56 from each other. A gate insulating film 41 is formed on channel regions 56a. The gate electrodes 71 are formed on the gate insulating film 41. The n type source/drain regions 56b are formed in regions of the active layer spaced by the gate electrodes 71. An interlayer insulating film 42 is formed on the gate electrodes 71. The through holes 51a, 51b, 52, 53 and 54 are formed in the interlayer insulating film 42. An electrically conductive film 81 is formed in each through hole. The conductive film 81 is made of a polysilicon layer and a tungsten silicide layer. A part of the region of the through hole 52 and a region in the through hole 51b are filled with the active layer 55 formed on the interlayer insulating film 42 (see FIGS. 3A and 3B). The active layer 55 is made of a polysilicon layer of 1000 Å in thickness and does not include a grain boundary located in the channel region. Arsenic is ion-implanted into the active layer 55 at a dosage of $3\times10^{18}/cm^2$ to form the n-type channel region 55a. On the active layer 55, there is formed by the CVD method a gate insulating film 43 made of an oxide film of 200 Å in thickness. The gate electrodes 60 formed on the interlayer insulating film 42 to fill a part of the region in the through hole 52 and a region in the through hole 51a, respectively. The p-type source/drain regions 55b are formed in the active layer 55. For providing the LDD structures of source/drain regions 55b, boron (B) is first ion-implanted into the source/drain regions 55b near the gate electrodes 60 at a dosage of $1\times10^{13}/cm^2$ with an implanting energy of 10 keV, whereby p⁻ regions are formed. Thereafter, insulating film spacers are formed on side walls of the gate electrodes 60, and then boron (B) is implanted into the source/drain regions 55b at a dosage of $1\times10^{15}/cm^2$ with an implanting energy of 10 keV, whereby p⁺ regions are formed. In this manner, the p-channel MOS transistors (TFTs) Q1 and Q3 in the upper layer are constructed.

The reason for disposing the gate electrode 60 and active layer 56 at the region of through hole 52 not overlapping each other as shown in FIG. 3A is to achieve electrical connection between the active layer 55 and lower layer. The ions for forming the source/drain regions 55b in the active layer 55 are implanted from above the gate electrode 60. Therefore, if the gate electrode 60 were provided in the whole region in the through hole 52, boron implanted toward the through hole 52 would not reach the active layer 55 located under the gate electrode 60. As a result, the electrical connection would not be formed between the active layer 55 and lower layer.

The TFT in the upper layer is covered with an interlayer insulating film 44. An aluminum interconnection layer 91 is connected to the source/drain regions 56 through the through holes 53 and 54. An interlayer insulating film 45 made of an oxide film is formed on the aluminum interconnection layer 91. An aluminum interconnection layer 92 is formed on the interlayer insulating film 45 for reinforcing the word line. The memory cell of the complete CMOS SRAM of the TFT lord type is structured as described above.

The ON current of TFTs (p-channel MOS transistors) Q1 and Q3 of the invention is 0.1 μA (FIG. 2). In the data reading operation, therefore, even if a subthreshold current of 1 nA flows through the driver transistor Q2 (or Q4) at the node in the "High" level side, the p-channel MOS transistor (TFT) Q1 (or Q3) at the side of the node in the "High" level can supply the ON current (0.1 μA) which is two orders of magnitude larger than the subthreshold current. Therefore, in the manufacturing process of semiconductors, reading operations of memory cells having a sufficient margin are guaranteed even if element characteristics (β ratios) change due to variation of sizes of elements.

In the data writing operation, the time ti which is required for charging the potential of node at the "High" level from (Vcc-Vth) to Vcc is $t_1=1fF\times1V/0.1$ μA=10 nsec ($10^{-8}$sec). As a result, writing of data in the memory cell of SRAM of the invention can be carried out in a time period which well satisfies a writing time required for the semiconductor memory.

The OFF current of the p-channel MOS transistors (TFTs) Q1 and Q3 according to the invention is 6 fA (FIG. 2). Therefore, a standby current of an SRAM of 16 Mbit to which TFTs of the invention are applied is 0.1 μA (=6fA×$2^{24}$ cells). Since the standby current of SRAM can be less than 1 μA, SRAM of low power consumption can be obtained.

In the embodiment described above, the structure of the top gate type in which the gate electrodes 60 are located on the active layer 55 is employed in the complete CMOS SRAM. of the TFT load type. However, if the TFT of the invention satisfies the conditions that the ON current is 0.25 μA/μm or more and the OFF current is 15 fA/μm or less, the TFT of the invention may have a bottom gate structure in which the gate electrodes 60 are located under the active layer 55 and may be applied to the SRAM, in which case a similar effect can be obtained.

Now, description will be made on manufacturing methods A–H of the semiconductor thin film used as the active layer of the TFT of the invention.

A. Method in which solid-phase growth of monocrystal is carried out after implanting silicon ions into a polysilicon layer for reducing density of generated crystal nucleuses in some regions.

Embodiment A1

Figure 5:
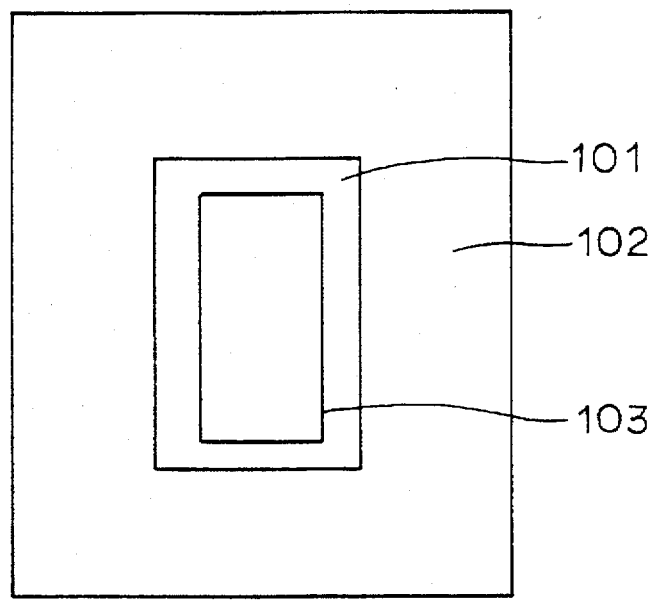
FIGS. 5–7 are plans showing a planar layout at different steps in embodiment A1 of a method of manufacturing a semiconductor thin film used in the thin-film transistor of the invention.

Referring to FIG. 5, silicon is ion-implanted into a polysilicon region at a dosage of $2\times10^{15}/cm^2$ with an implanting energy of 100 kev to form an amorphous region 102 having a high density of generated crystal nucleuses. The ion implantation of silicon at the implanting rate of $2\times10^{15}/cm^2$ with the implanting energy of 100 keV also forms an amorphous region 101 having a low density of generated crystal nucleuses. In this manner, the number of crystal nucleus generated in channel region 103 becomes not more than one.

Figure 6:
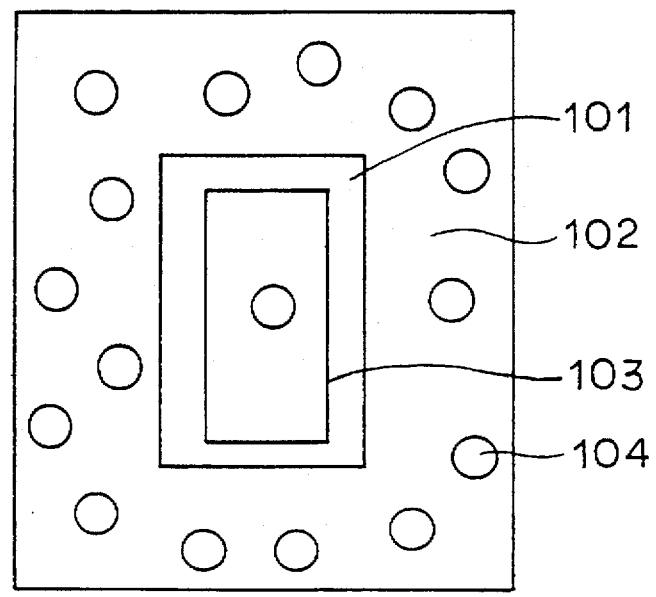

Thereafter, the amorphous silicon film is thermally processed in a nitrogen atmosphere at a temperature of 600° C. for about five hours. In this heat treatment, a large number of nucleuses 104 of silicon monocrystal are generated in the region 102 having high density of generated crystal nucleuses during solid-phase growth, as shown in FIG. 6. Meanwhile, one nucleus 104 is generated in the channel region 103 within the region 101 having low density of generated crystal nucleuses.

Figure 7:
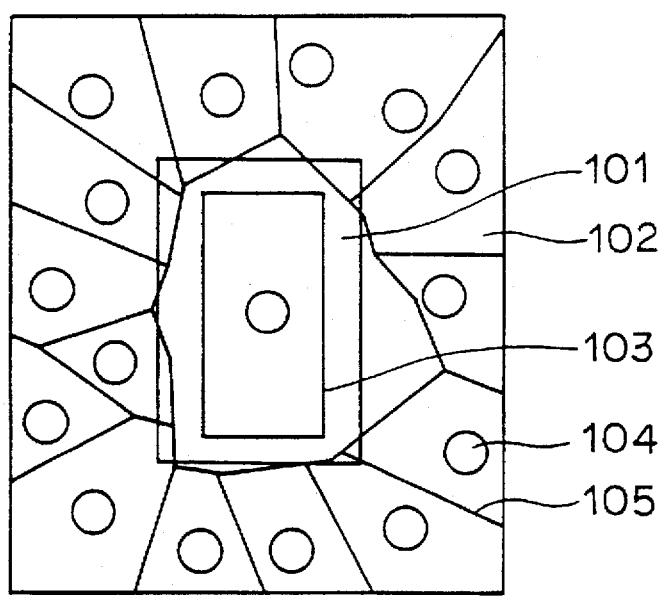

At the end of the solid-phase growth, the amorphous silicon has entirely crystallized, and a large number of crystal grains are formed, separated by grain boundaries 105 therebetween, as shown in FIG. 7. In the channel region 103, since the crystal growth develops from the one nucleus 104, monocrystal silicon is formed which entirely occupies the channel region 103.

Embodiment A2

Figure 8:
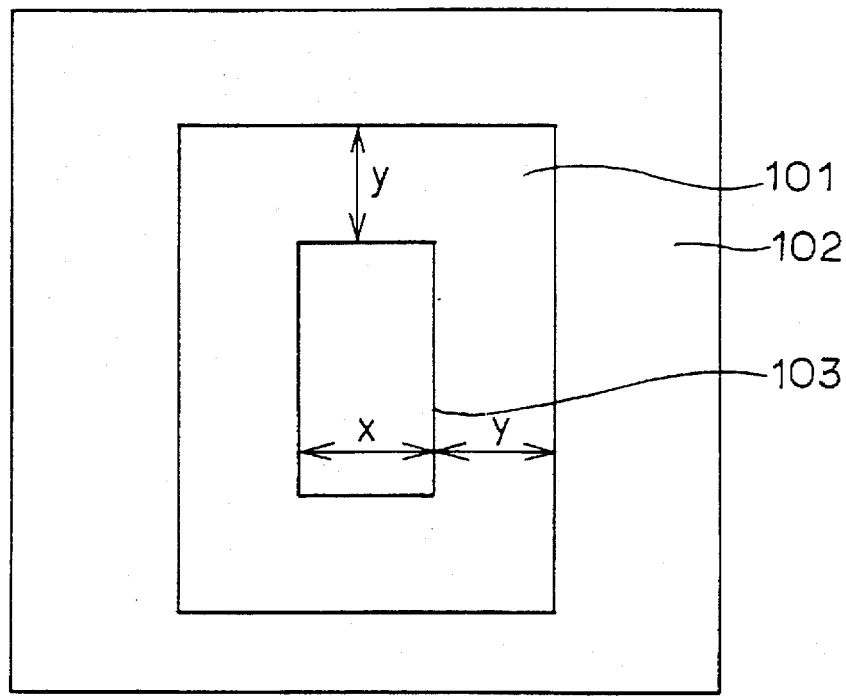
FIGS. 8 and 9 are plans showing a planar layout at different steps in embodiment A2 of a method of manufacturing a semiconductor thin film used in the thin-film transistor of the invention.

Referring to FIG. 8, the region 101 having low density of generated crystal nucleuses and the region 102 having high density of generated crystal nucleuses are formed in the amorphous silicon thin film as in embodiment A1. The region 101 having low density of generated crystal nucleuses contains the channel region 103. Of the region 101 having low density of generated crystal nucleuses, a region located outside the channel region 103 has a dimension y which is set to be y≧x where x is a dimension of a short side of the channel region 103.

Figure 9:
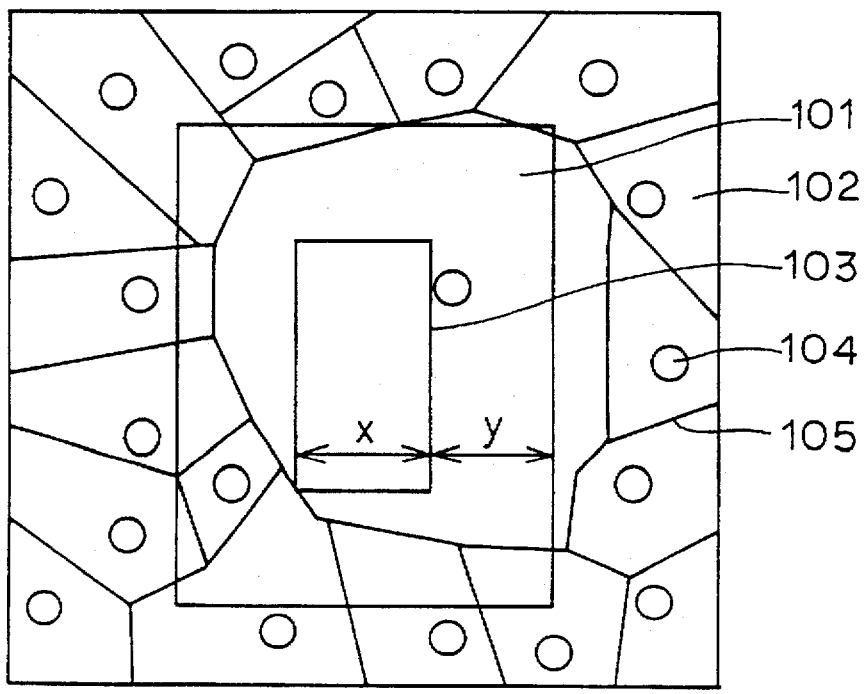

Thereafter, the amorphous silicon thin film thermally processed similarly to the embodiment A1, causing solid-phase growth. In this process, even if the nucleuses 104 generated in the region 101 having low density of generated crystal nucleuses is located outside the channel region 103 as shown in FIG. 9, the grain boundaries 105 can be suppressed from extending from the region 102 having high density of generated crystal nucleuses into the channel region 103. The reason of this is that a distance from the region 102 having high density of generated crystal nucleuses is determined sufficiently large with respect to the short side of the channel region 103. The crystal thus grown spreads fully in the channel region 103, and the monocrystal silicon thin film is formed entirely in the channel region 103.

B. Method of executing solid-phase growth of monocrystal silicon from an amorphous silicon thin film having inclined side walls Embodiment B1

Figure 10A:
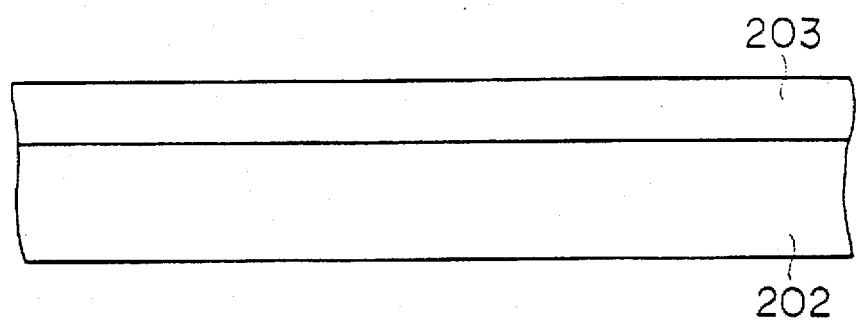
FIGS. 10A to 10D are cross sections showing embodiment B1 of a method of manufacturing a semiconductor thin film used in the thin-film transistor of the invention in accordance with the progress of steps.

Referring to FIG. 10A, an amorphous silicon thin film 203 is formed on an insulating substrate 202. The amorphous silicon thin film 203 is formed at a temperature of 450° C. using gas mixture of $Si_2H_6/N_2$. It is possible by adjusting a gas mixing ratio to form the amorphous silicon thin film from having the thickness in a range of from 100 to 8000 Å. In this embodiment, the amorphous silicon thin film 203 has a thickness of 2000 Å.

Figure 10B:
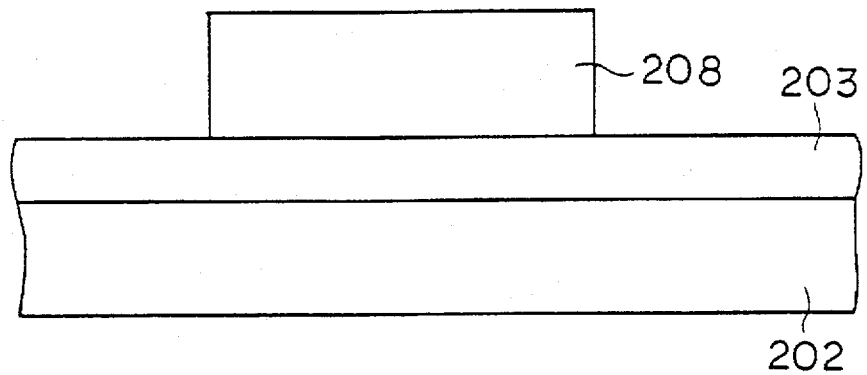

Referring to FIG. 10B, a patterned resist film 208 is formed located in a region corresponding to the channel region of TFT on the amorphous silicon thin film 203. The resist film 208 has an area larger than that of the intended channel region of TFT. For example, the length and width of resist film 208 are larger than those of the intended channel region by about 0.3 μm, respectively. The resist film 208, having the size of e.g., 1.1 μm×0.7 μm is prepared for forming the TFT having the channel length of 0.8 μm and the channel width of 0.4 μm.

Figure 10C:
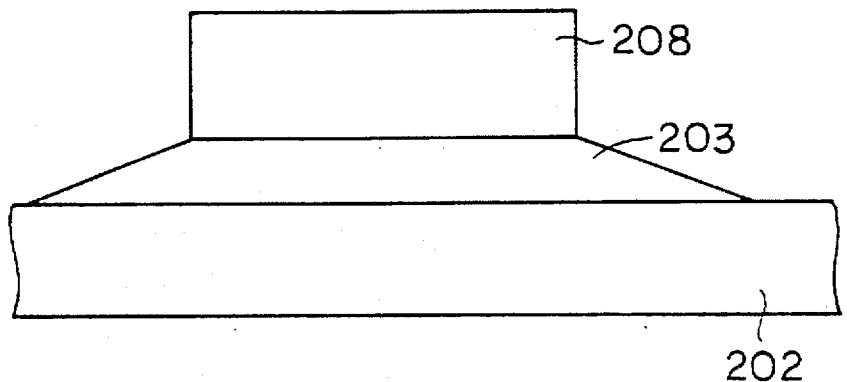

As shown in FIG. 10C, the resist film 208 is used as a mask, and the amorphous silicon thin film 203 is patterned to have inclined side walls in the atmosphere of plasma gas containing HCl by a resist recessing method. A smaller angle of inclination of the side walls is preferable. For example, the amorphous silicon thin film 203 is-patterned to have the side walls inclined at 45 degrees.

Figure 10D:
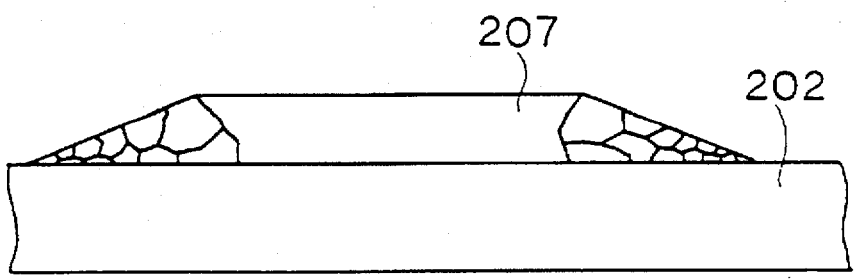

As shown in FIG. 10D, the amorphous silicon thin film 203 patterned to have the inclined side walls is thermally processed in the nitrogen atmosphere at a temperature of 600° C. for 12 hours. During the heat treatment and crystallization of amorphous silicon, there is correlation between a thickness of thermally processed amorphous silicon and a speed of crystallization of polysilicon formed therefrom. For example, in the heat treatment of amorphous silicon having a thickness of 2000 Å at 800° C., 100% crystallization is achieved by the treatment for three hours, and the crystal grain has a diameter from 1.2 to 1.5 μm. If the heat treatment of amorphous silicon having a film thickness of 500 Å is carried out at 600° C. for 12 hours, 100% crystallization of the amorphous silicon is achieved. As can be seen from the above, the speed of crystal growth is high at a central portion of the amorphous silicon thin film and is low at inclined side walls in the heat treatment of the amorphous silicon thin film having the inclined side walls. Therefore, a polycrystal silicon thin film 207 not including a grain boundary can be formed in the central portion, as shown in FIG. 10D.

The embodiment B1 described above uses the resist pattern of which lengthwise and widthwise dimensions are larger than those of the channel region of the TFT by 0.3 μm, respectively. These dimensions are determined in view of dimensional shift in registration of a mask which will be formed again on the patterned polysilicon thin film. The resist pattern of larger sizes described above is not required when the polysilicon thin film 207 of TFT to be formed has the side walls containing the grain boundaries, as shown in FIG. 10D. Although the inclination angle of the side walls is determined at 45 degrees, the angle is not limited to this value, provided that the amorphous silicon can be crystallized without forming a grain boundary in the channel region of TFT. In the above embodiments, the heat treatment is carried out on the amorphous silicon thin film of 2000 Å in thickness having the inclined side walls at the temperature of 600° C. for 12 hours. However, the heat treatment only for three hours is required if the region of 2000 Å in thickness only is to be crystallized.

The amorphous state means a state in which there is no regular crystal structure such as found in ordinary solid crystal. In practice, however, the amorphous silicon deposited by the low-temperature CVD method contains a regular crystal structure, which may be referred to as "minute crystal nucleus" if viewed only in an extremely minute region, and thus cannot be deemed to be in a perfect amorphous state. In the process of changing such amorphous silicon into monocrystal silicon by the solid-phase growth, the silicon crystal grows owing to generation of nucleuses mainly from these minute crystal nucleus(es). If only one nucleus is generated in a certain region during heat treatment for solid-phase growth, this region can be formed of one silicon monocrystal.

As a method for reducing the number of minute crystal nucleuses, there has been known a method in which bondings between minute crystal nucleuses are cut by ion implantation of silicon for destroying regular structures. It is reported that a state of bonding in the amorphous silicon can be changed by ion implantation of silicon in R. B. Iverson and R. Reif, *J. Applied Physics* 62 (5), 1 Sep. 1987, pp. 1675–1681. This is utilized in the following embodiment B2 of a method of manufacturing a semiconductor thin film of the invention for controlling a position of generation of crystal grain boundaries.

Embodiment B2

Figure 11:
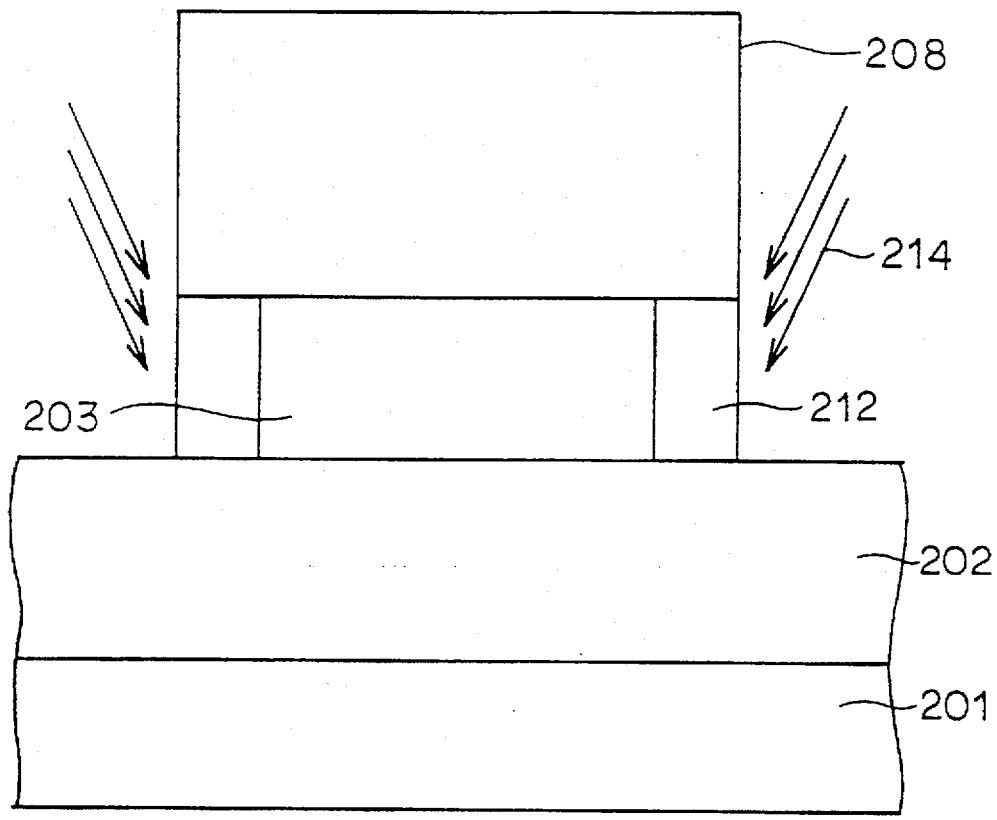
FIGS. 11 to 14 are cross sections showing sectional structures at different steps in embodiment B2 of a method of manufacturing a semiconductor thin film used in the thin-film transistor of the invention.
Figure 21:
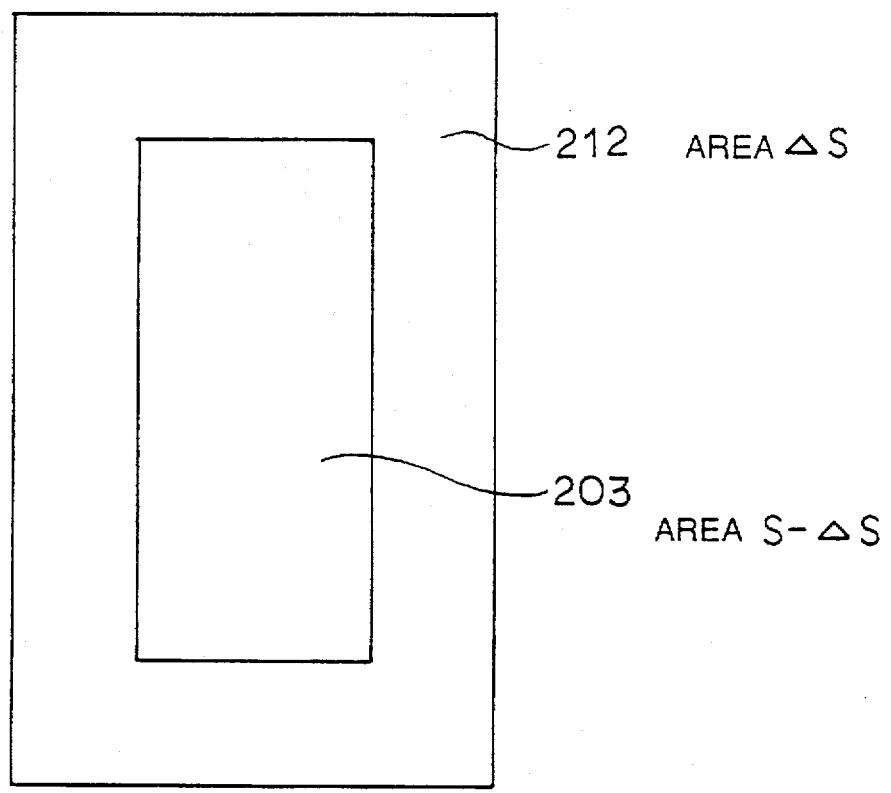
FIG. 21 is a plan showing a planar layout of a portion of an amorphous silicon layer shown in FIG. 11.

Referring to FIG. 11, an insulating film 202 is formed on a semiconductor substrate 201. An amorphous silicon thin film 203 is formed similarly to the embodiment B1 at a thickness of 2000 Å on the insulating film 202. FIG. 11 shows a state in which the amorphous silicon thin film 203 is etched using the resist film 208 as a mask. Prior to removal of the resist film 208, silicon ions are implanted at a dosage of $3\times10^{15}/cm^2$ an implanting energy of 100 keV only into a peripheral portion of the pattern of amorphous silicon thin film 203 by a rotary oblique implantation (arrow 214) 30 degrees with respect to the normal. This can exclude a minute crystal nucleus in the peripheral portion 212 of the amorphous silicon thin film 203. Further, a central portion 203 into which silicon is not ion-implanted, a state that only one nucleus is generated during the solid-phase growth can be realized. FIG. 21 is a plan showing the region of amorphous silicon thin film viewed from above. Assuming that a whole area of the amorphous silicon thin film is S cm² as shown in FIG. 21, a density of generated nucleuses in the amorphous silicon itself is ρ/cm²/min, an area of the region subjected to the ion implantation of silicon is ΔS cm² a density of generated nucleuses in the region subjected to the ion implantation of silicon is 0/cm²/min, and a time period for the heat treatment for solid-phase growth is T minutes, the state described above can be achieved by determining ΔS as follows:

$$\rho T (S-\Delta S)<1$$

ΔS can be controlled by the angle of rotary oblique implantation and the implanting energy.

For example, a relationship of ΔS>0.11 μm is required for the solid-phase growth by processing amorphous silicon of the area S of 0.32 μm² (length of 0.8 μm, width of 0.4 μm) and the density of generated nucleuses ρ of $3\times10^6$/cm² min for the time period T of 180 minutes. If the implanting energy is 100 keV, the range of silicon ion is about 0.20 μm. By the rotary oblique implantation at the implanting angle of 30 degrees with this implanting energy, a region of about 0.1 μm in width containing implanted silicon is formed at the peripheral portion of amorphous silicone. In this case, ΔS is equal to 0.2 μm², and thus the above expression is satisfied.

Figure 12:
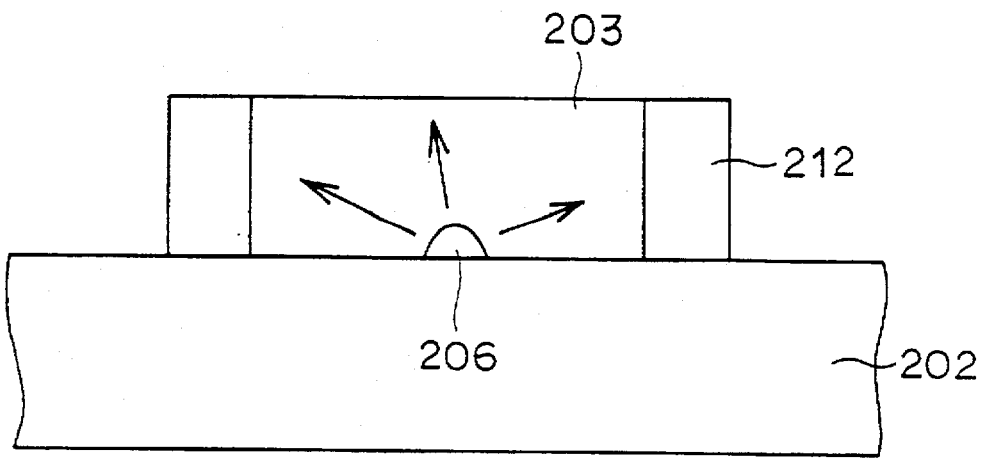
Figure 13:
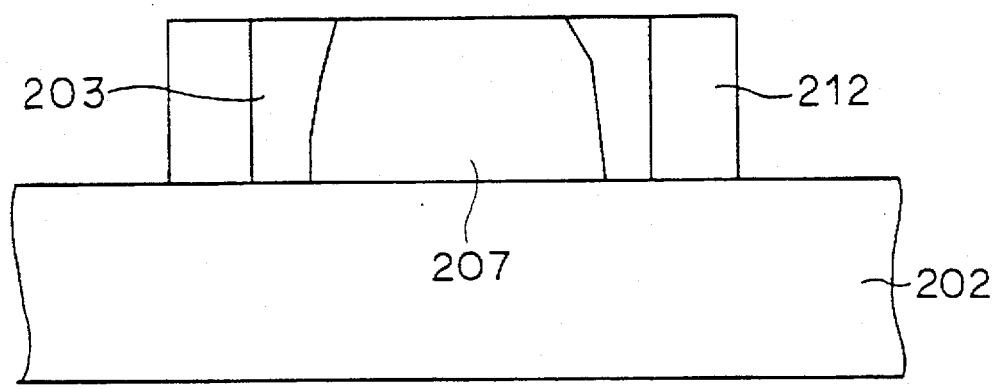
Figure 14:
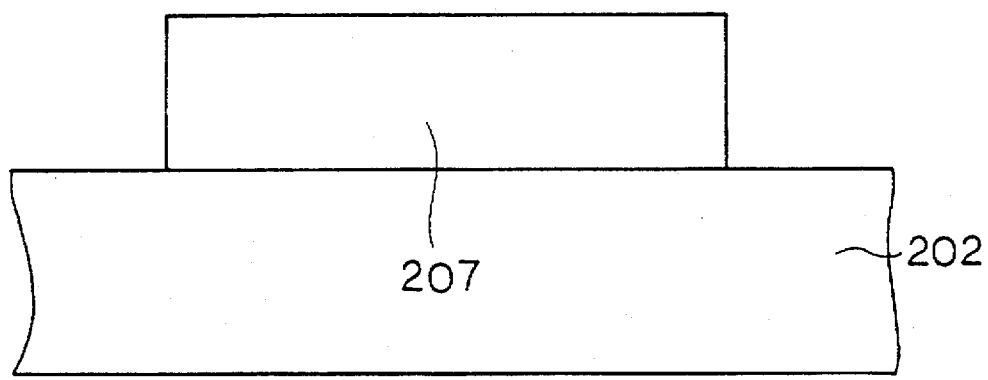

FIG. 12 shows a state in which the resist film 208 has been removed, and the heat treatment for solid-phase growth starts. The minute crystal nucleus 206 starting to grow is also shown therein. In this case, the temperature for heat treatment is set at about 600° C. Then, as shown in FIG. 13, crystal grows, and more specifically, the minute crystal nucleus 206 grows into a large crystal 207. Finally, the region of amorphous silicon is filled with the monocrystal silicon 207, as shown in FIG. 14.

If the area S and the density of generated nucleuses ρ are large, it is difficult to satisfy the expression described before. This difficulty, however, can be overcome by pre-implantation of silicon ion, e.g., at an implanting rate of about $1\times10^{15}$/cm² into the whole region of amorphous silicon and thereby reducing the value of ρ.

Embodiment B3

Figure 15:
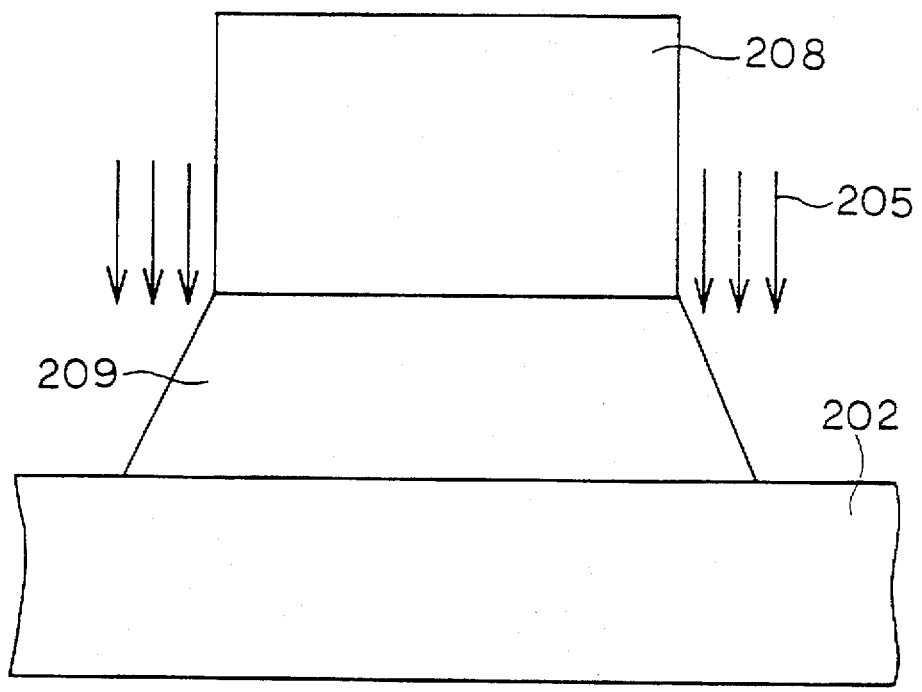
FIGS. 15–17 are cross sections showing sectional structures at different steps in embodiment B3 of a method of manufacturing a semiconductor thin film used in the thin-film transistor of the invention.

This embodiment corresponds to the embodiment B2 when applied to the embodiment B1. Referring to FIG. 15, an amorphous silicon thin film 209 is formed on the insulating film 202. Using the resist film 208 as a mask, the region of amorphous silicon thin film 209 is etched to have a configuration diverging toward the insulating film 202. Thus, the amorphous silicon thin film 209 have inclined side walls. Before removal of the resist film 208, silicon ion is implanted into the peripheral portion of amorphous silicon thin film 209 as indicated by arrow 205. This excludes a minute crystal nucleus from the peripheral portion of amorphous silicon thin film 209.

Figure 16:
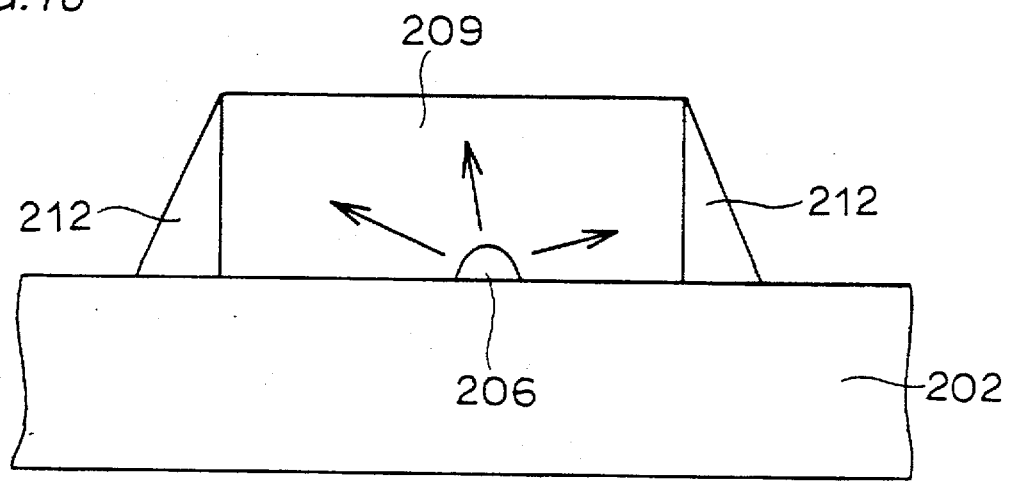
Figure 17:
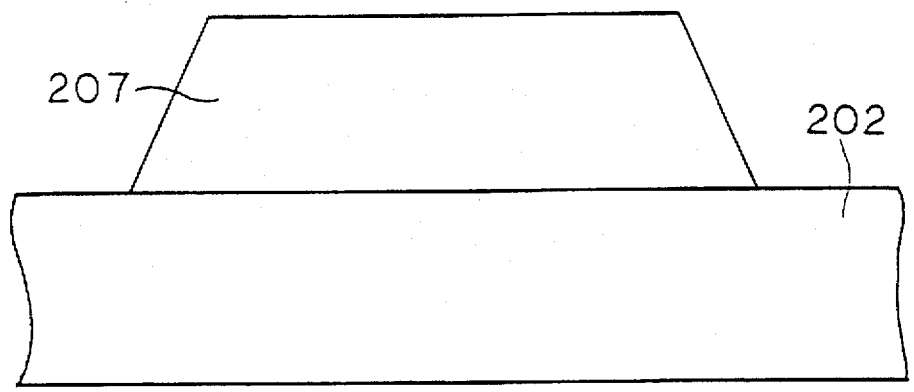

Referring to FIG. 16, the resist 208 is removed, and the heat treatment for solid-phase growth starts. The size of resist 208 and the degree of taper etching are appropriately set to satisfy the expression in the embodiment B2, whereby the amorphous silicon thin film 209 has the region in which only one nucleus is generated. By the solid-phase growth in this manner, the minute crystal nucleus 206 grows into the monocrystal silicon 207, as shown in FIG. 17.

in the embodiment B3 described above, even if the nucleus is generated at the peripheral portion of the amorphous silicon thin film, a boundary of the crystal grain grown from this nucleus will not reach the central portion because the speed of crystal growth is slow in the peripheral portion. Not only the density of generated nucleuses but also the speed of crystal growth is an important factor in the formation of monocrystal by the solid-phase growth of amorphous silicon. Through intensive study it has been found that the speed of crystal growth increases as the thickness of amorphous silicon increases. If a small crystal grain formed in the peripheral portion is not negligible, this can be removed, e.g., by wet etching or surface oxidation.

Embodiment 4

Figure 18:
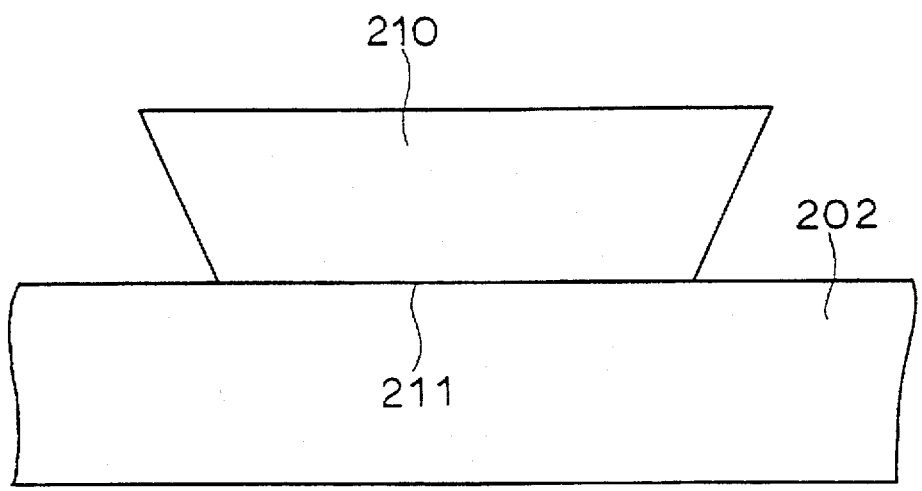
FIGS. 18–20 are cross sections showing sectional structures at different steps in embodiment B4 of a method of manufacturing a semiconductor thin film used in the thin-film transistor of the invention.

Referring to FIG. 18, an amorphous silicon thin film 210 is formed on the insulating film 202. The region of the amorphous silicon thin film 210 is processed by an inverse taper etching to have a configuration converging toward the insulating film 202. Thus, the amorphous silicon thin film 210 is provided at its peripheral portion with inclined side walls.

Figure 19:
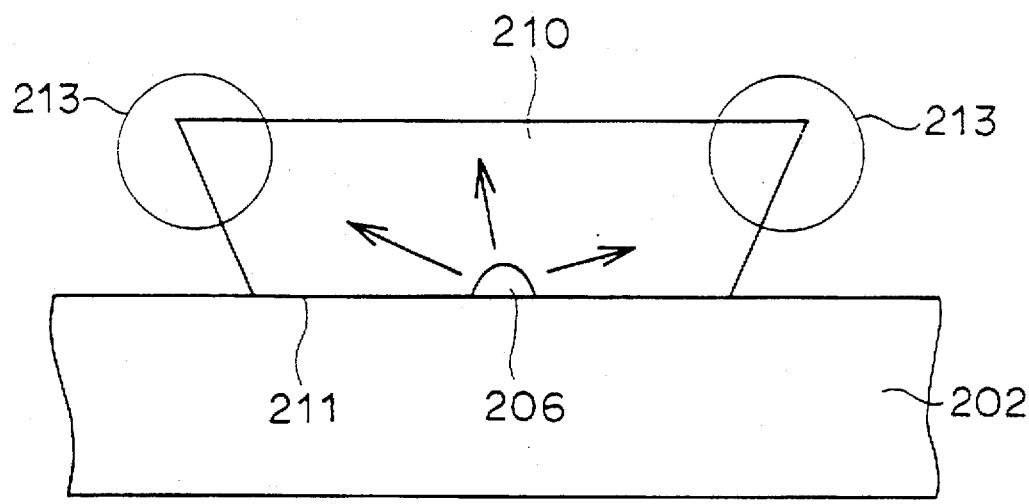
Figure 20:
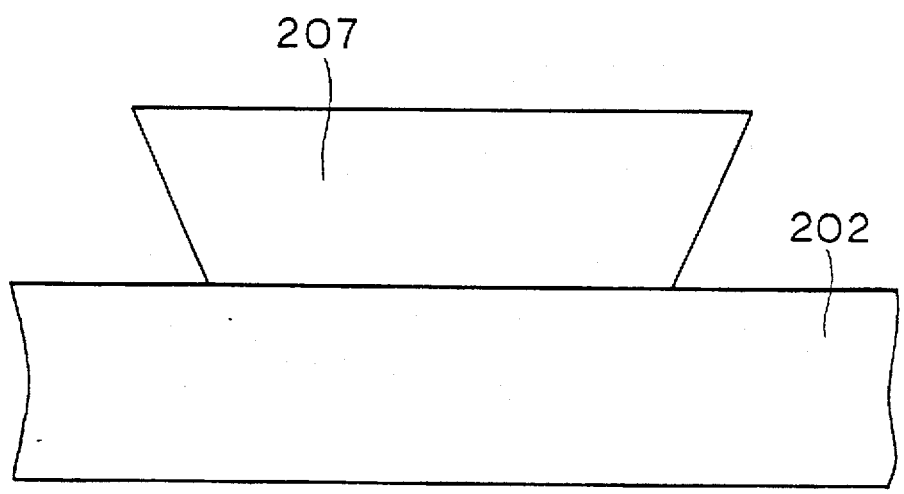

Referring to FIG. 19, the amorphous silicon thin film is thermally processed, and thereby the solid-phase growth starts. It has been found that, among the minute crystal nucleuses in the amorphous silicon, a particularly large number of nucleuses exist in the interface between the oxide film and amorphous silicon. Therefore, a region 211 at which the amorphous silicon thin film 210 is in contact with the insulating film (oxide film) 202 may be reduced in size by the inverse taper etching for the amorphous silicon thin film 210, whereby a nucleus does not generate in a peripheral portion 213 and only the nucleus 206 generated at the central portion will grow. In this manner, the nucleus 206 generated in the central portion can be grown into the monocrystal silicon 207, as shown in FIG. 20. In this embodiment B4, the whole region of amorphous silicon thin film can be changed into monocrystal without ion-implantation of silicon for reducing the density of generated nucleuses at the peripheral portion of amorphous silicon thin film. The inversely tapered shape of the etched amorphous silicon thin film can be formed, e.g., in such a manner that amorphous silicon is deposited in a trench formed in the oxide film by the taper etching for filling the same, the etch back is carried out up to the interface between the oxide film and amorphous silicon, and the oxide film is removed by the wet etching.

C. method in which hydrogen or fluorine is ion-implanted into some regions of amorphous silicon to generate minute nucleuses, and solid-phase growth is carried out in regions other than the above region, i.e., regions containing nucleuses generated at a small density.

Figure 22A:
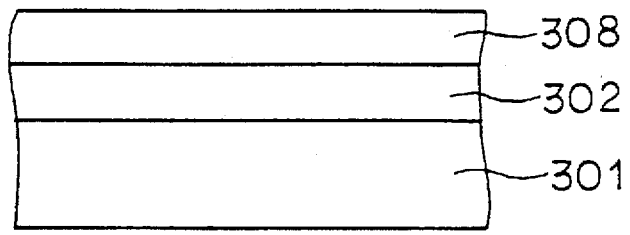
FIGS. 22A–22C are cross sections showing sectional structures at different steps in embodiment C of a manufacturing method of a semiconductor thin film used in the thin-film transistor of the invention in accordance with progress of steps.
Figure 22B:
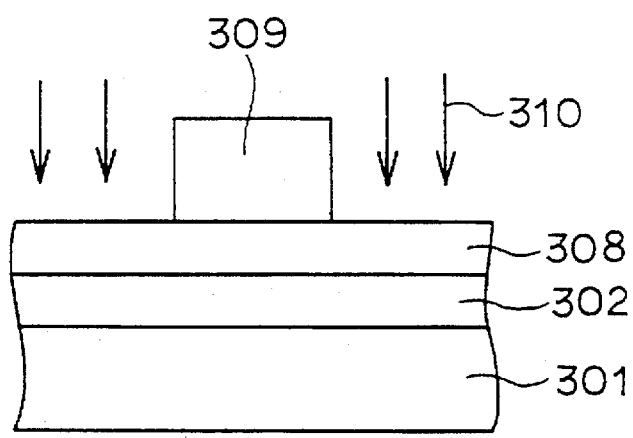
Figure 22C:
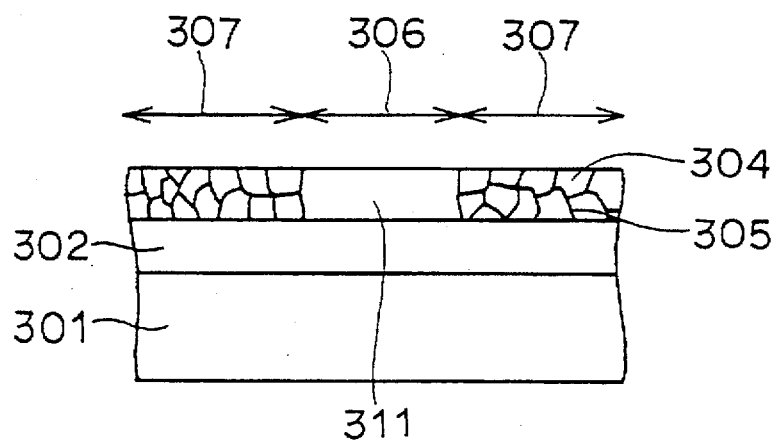

Referring to FIG. 22A, an oxide film 302 is formed on a semiconductor substrate 301. An amorphous silicon film 308 is formed on the oxide film 302, e.g., by an LPCVD method at a temperature of 450° C. using disilane ($Si_2\ H_6$). Thereafter, a resist film 309 is formed on a portion of the amorphous silicon film 308 corresponding to the channel region. Using this resist film 309 as a mask, hydrogen ions or fluorine ions are selectively implanted into the amorphous silicon film 308 at a dosage of about $1.0\times10^{15}$/cm² with an implanting energy of about several keV as indicated by arrow 310. After removal of the resist film 309, heat treatment is carried out, for example, in the nitrogen atmosphere at a temperature of about 600° C., whereby a large number of small crystal nucleuses 304 are formed in a region 307 containing the generated nucleuses at a high density and a large crystal grain 311 is formed in a portion 306 corresponding to the channel region. Thus, a grain boundary 305 does not exist in the channel region 306 and the one crystal grain 311 can occupy the region 306, as shown in FIG. 22C.

Figure 23:
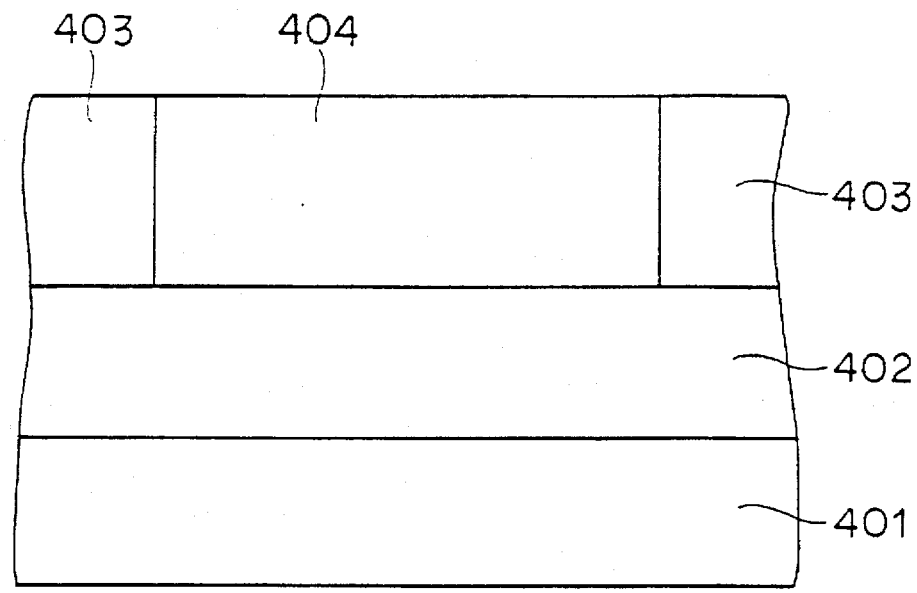
FIGS. 23–27 are cross sections showing sectional structures at different steps in embodiment D of a manufacturing method of a semiconductor thin film used in the thin-film transistor of the invention.

D. Method of carrying out solid-phase growth for monocrystallization by irradiating electron rays to amorphous silicon and thereby controlling a position of generation of minute crystal grains Referring to FIG. 23, an insulating film 402 is formed in the semiconductor substrate 401. An amorphous silicon film 403 is formed at a thickness of about 2000 Å on the insulating film 402. Using a resist film as a mask, silicon ion is implanted into a region 404 at an implanting rate of about $1\times10^{16}/cm^2$ with an implanting energy of 140 keV for destroying minute crystal nucleuses existing in the amorphous silicon film. Thereby, the number of generated nucleus in the region 404 can be one or less.

Figure 24:
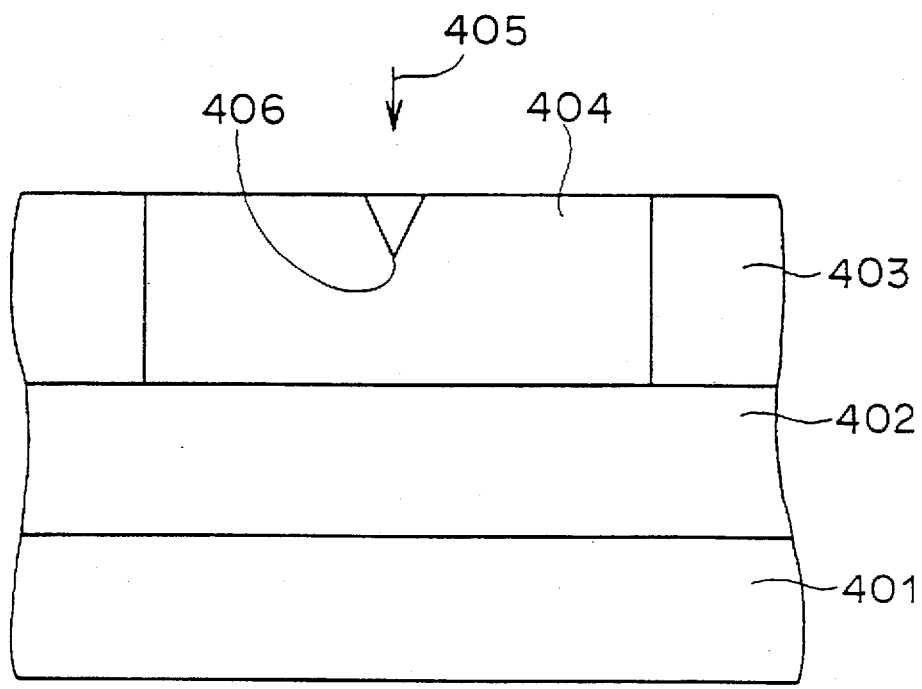

Thereafter, as shown in FIG. 24, electron ray 405 is directed to a central portion of a surface of the region 404 of amorphous silicon film with the position of irradiation controlled. Thereby, amorphous silicon is melted, and a minute crystal nucleus 406 of silicon for solid-phase growth is formed. The irradiated electron ray is controlled to have a diameter of 0.05 µm, and the irradiation is carried out with the implanting energy of 10 keV at the current of 50 µA (output 0.5 W) for the irradiating time period of 1n sec/point.

Figure 25:
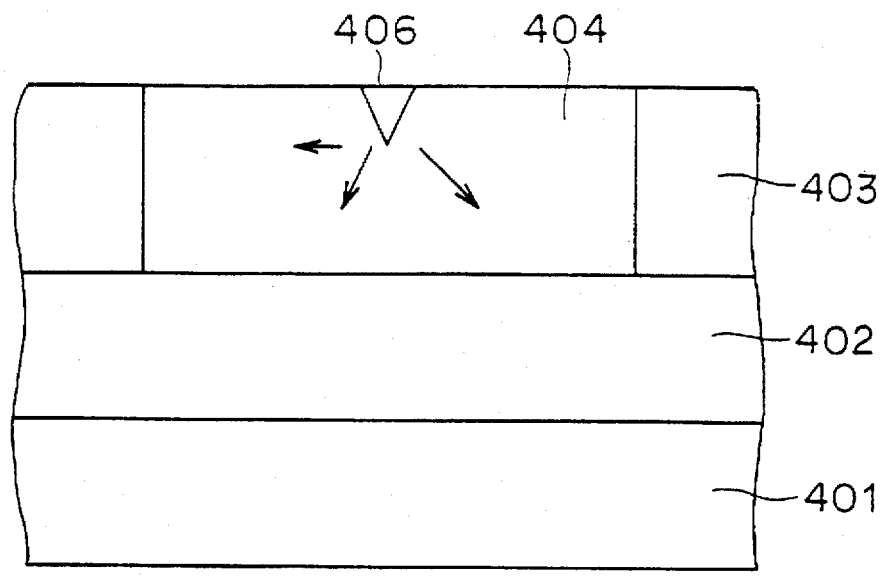
Figure 26:
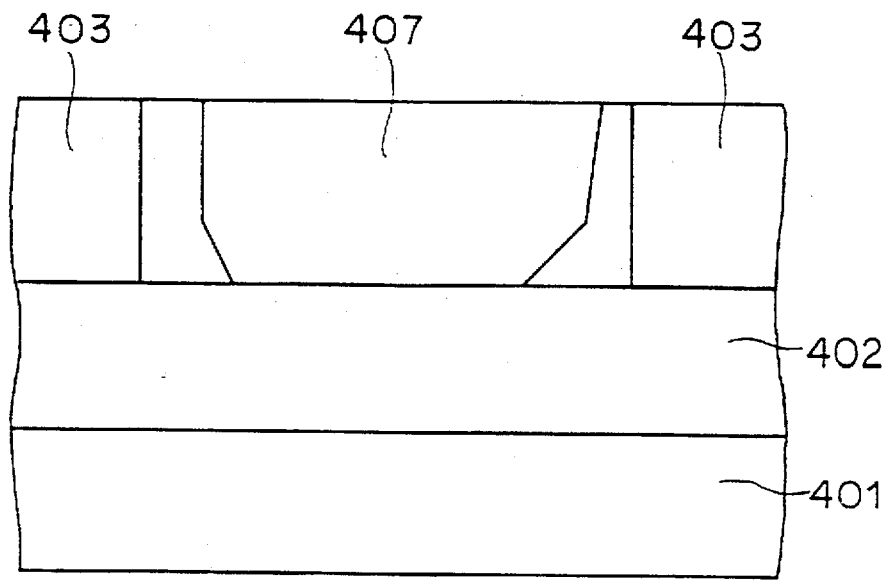
Figure 27:
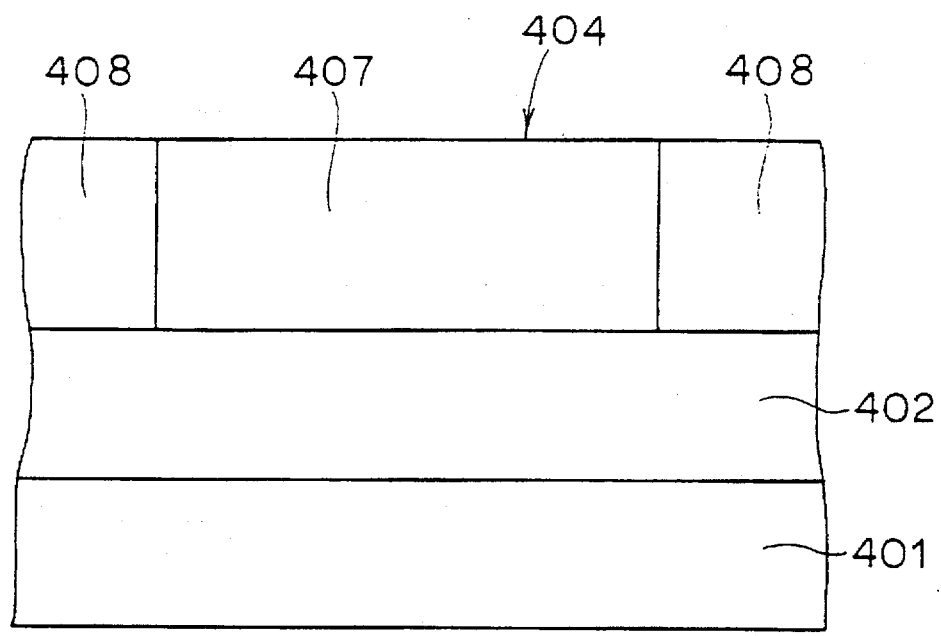

FIG. 25 shows a state in which the heat treatment for solid-phase growth starts. Monocrystal silicon starts to grow from only one minute crystal nucleus 406 in the region 404 formed by the irradiation of electron ray 405. The temperature for heat treatment is set at about 600° C. Thereafter, the minute crystal nucleus 406 grows into monocrystal silicon 407, as shown in FIG. 26. Finally, the monocrystal silicon 407 occupies the region 404 as shown in FIG. 27. The amorphous silicon other than the region 404 changes into polysilicon 408.

In the above embodiment, electron ray is irradiated for generating nucleuses. However, any charged particles may be employed if they can generate nucleuses.

E. Method for carrying out monocrystallization by applying a compression stress to amorphous silicon and thereby controlling speed of crystal growth Embodiment E1

Figure 28:
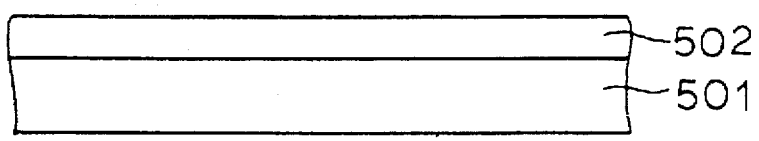
FIGS. 28–33 are cross sections showing sectional structures at different steps in embodiment E1 of a method of manufacturing a semiconductor thin film used in the thin-film transistor of the invention.
Figure 29:
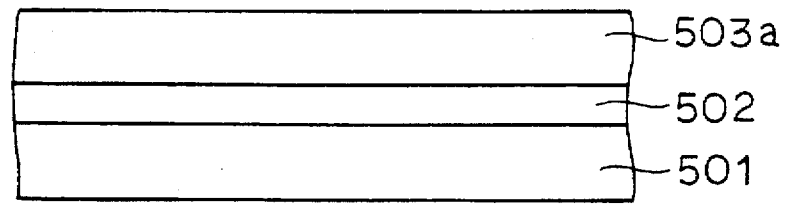

Referring to FIG. 28, an amorphous silicon film 502 is formed on a thick silicon oxide film (thermally oxidized film) serving as an insulating film. This amorphous silicon film 502 is formed, e.g., by the plasma CVD method at a temperature $T_1$ of 400 to 600° C. For example, the amorphous silicon film 502 is formed at the temperature of 450° C. using disilane ($Di_2H_6$) as material gas. Referring to FIG. 29, a silicon oxide film 503a is formed on the amorphous silicon film 502. This silicon oxide film 503a is formed under the conditions that an internal stress is accumulated at a temperature $T_2$ lower than the crystallization temperature $T_3$ of amorphous silicon.

Figure 30:
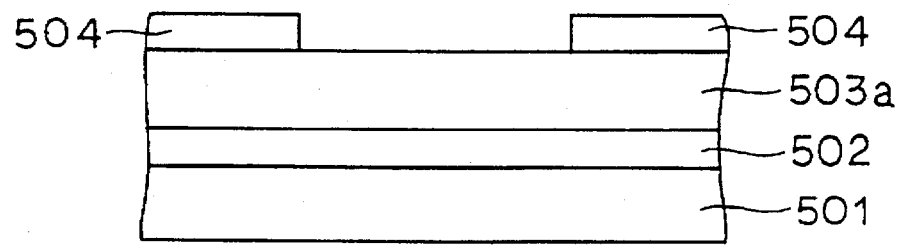
Figure 31:
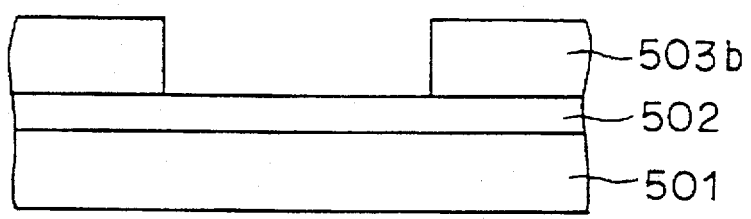

Thereafter, a resist film 504 is formed on a region of silicon oxide film 503a located around the region in which the amorphous silicon film 502 is to be monocrystalized, as shown in FIG. 30. Referring to FIG. 31, the resist film 504 is used as a mask, and the silicon oxide film 503a is patterned to form a silicon oxide film 503b. Thereafter, the resist film 504 is removed.

Figure 32:
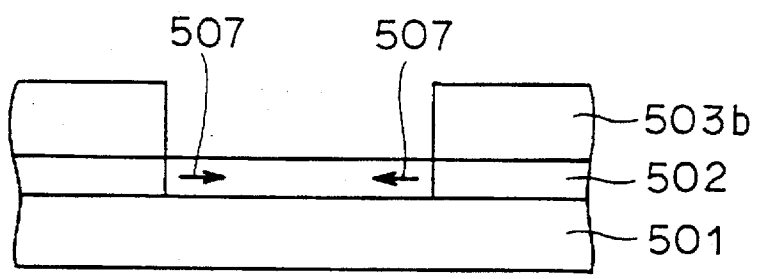
Figure 33:
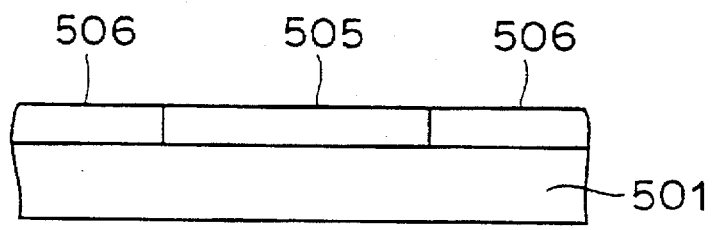

Then, as shown in FIG. 32, the heat treatment is carried out at the temperature $T_3$ on the structure including the silicon oxide film 503b formed on the amorphous silicon film 502. The amorphous silicon film 502 tends to be entirely monocrystallized. However, the heat treatment releases the internal stress accumulated in the silicon oxide film 503b, so that the region of amorphous silicon film 502 not covered with the silicon oxide film 503b is affected by the release of internal stress. Therefore, internal stress (compression stress) indicated by arrow 507 is applied to the amorphous silicon oxide film 502. This promotes monocrystallization of the region of amorphous silicon film 502 not covered with the silicon oxide film 503b. In this manner, a monocrystal silicon film 505 is formed in the region not covered with the silicon oxide film 503b, as shown in FIG. 33, and a polycrystal silicon film 506 is formed in the region not covered with the silicon oxide film 503b.

Figure 40A:
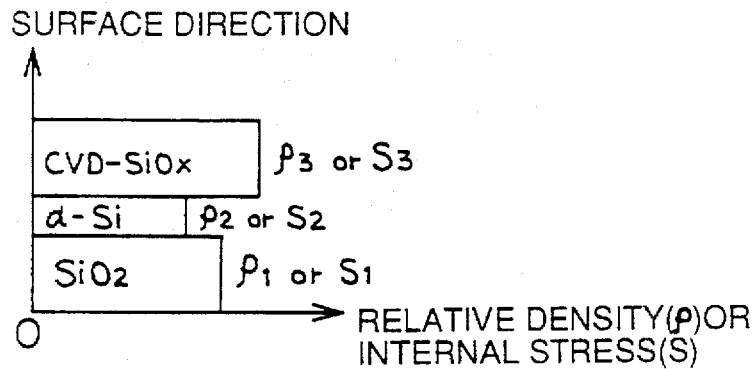
FIGS. 40A–40D show relationships of internal . stresses in the respective films in the embodiments E1 and E2 of the method of manufacturing the semiconductor thin film used in the thin-film transistor of the invention.

Referring to FIG. 29, the internal stress is accumulated in the silicon oxide film 503a, for example, under the following conditions (I) or (II). The relative density ρ or internal stress S shows distribution shown in FIG. 40A or 40C under the patterned silicon oxide film 503b.

(I) When $T_2<T_2<T_2$

The growth of silicon oxide film 503a is affected by the underlayer, i.e., amorphous silicon film 502, and at the same time, the silicon oxide film 503a tends to accumulate the internal stress because the forming temperature thereof is lower than that of amorphous silicon film. As a result, the internal stress $S_1$ in the thermally oxidized film 501 which is the underlayer of the amorphous silicon film, the internal stress $S_2$ in the amorphous silicon film 502 and the internal stress $S_3$ in the CVD silicon oxide film 503a on the amorphous silicon film 502 have a relationship of $S_2<S_1<S_3$ in FIG. 40A or a relationship of $S_1<S_2<S_3$ in FIG. 40C. In either case, the internal stresses have a relationship of $S_2<S_3$.

(II) When the CVD silicon oxide film 503a has the nonstoichiometric composition and the relative density thereof is larger than the relative density of amorphous silicon film 502.

The amorphous silicon film is stoichiometrically formed of a single element. However, the amorphous silicon film has the crystal lattice disordered to a large extent, and it has larger volume to a certain extent proportional to the disorder of lattice, compared with the volume of a monocrystal silicon film including the equal number of atoms. Therefore, the density of amorphous silicon film is smaller than that of monocrystal silicon film. Accordingly, the relative density $\rho_2$ of amorphous silicon film is smaller than 1 ($\rho_2<1$), although the difference is very small. In many cases, the amorphous silicon is formed by chemical reaction in ammonium hydroxide or hydrogen atmosphere, so that the composition thereof contains hydrogen as represented by a chemical formula Si:H, and the relative density thereof is smaller than one. Meanwhile, the silicon oxide film stoichiometrically has a composition rate of 1 to 2 between Si and O as expressed by a chemical formula $SiO_2$. However, the silicon oxide film has nonstoichiometric composition such as $SiO_x$ (X≠2) in the case where it is formed under the conditions other than the balanced reaction such as formation of silicon oxide film by thermal oxidation of monocrystal silicon. If there is a relationship of X<2 which is established, e.g., by the formation of film by the plasma CVD method using $N_2O$ or $SiH_4$ containing substance, the silicon is excessively supplied, so that the relative density of silicon oxide film exceeds one. This corresponds to the case of $\rho_2<\rho_1<\rho_3$ in FIG. 40A or $\rho_1<\rho_2<\rho_3$ in FIG. 40C, and the relationship of $\rho_2<\rho_3$ is established similarly to the case (I).

As described above, if the silicon oxide film 503a is formed under the conditions of at least one of the above (I) or (II), the compression stress described above is generated in the region of amorphous silicon film 502 not covered with the silicon oxide film 503b during the heat treatment for solid-phase growth. Thereby, monocrystalization of that region is promoted, as compared with the case where the compression stress does not exist.

Although the expression as "monocrystallization" is used, the transfer of amorphous silicon phase into polycrystal is also monocrystallization in a broader meaning. Therefore, owing to the fact that the compression stress serves to promote monocrystallization, polycrystallization is carried out in such a manner that each crystal grain forming the polycrystal grows rapidly compared with an ordinary case where the compression stress does not exist, so that each grain has a relatively large diameter and an area of grain boundary per unit volume decreases.

Embodiment E2

Figure 34:
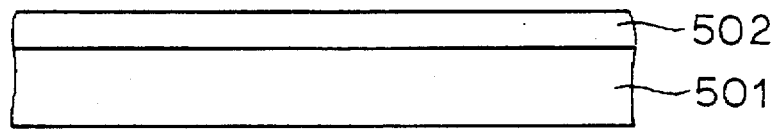
FIGS. 34–39 are cross sections showing sectional structures at different steps in embodiment E2 of a method of manufacturing a semiconductor thin film used in the thin-film transistor of the invention.
Figure 35:
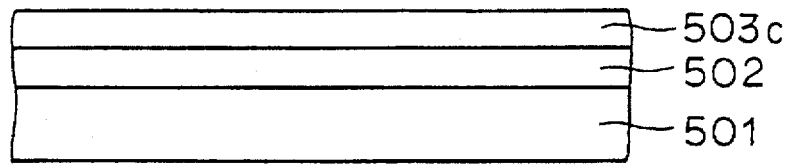

Referring to FIG. 34, the amorphous silicon film 502 is formed on the insulating film 501 made of thermally oxidized film by the plasma CVD method at the temperature $T_1$. As shown in FIG. 35, a CVD silicon oxide film 503c, which will easily shrink in a later heat treatment step, is formed on the amorphous silicon film 502 at the temperature of $T_2$. The temperature conditions for this correspond to the conditions (I) of the embodiment E1, and can be expressed as $T_1 < T_2 < T_3$. These temperature conditions are referred to as conditions (III).

Figure 36:
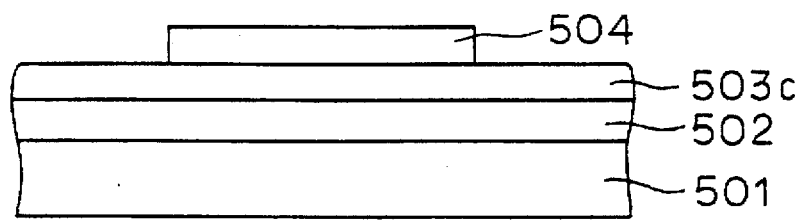
Figure 37:
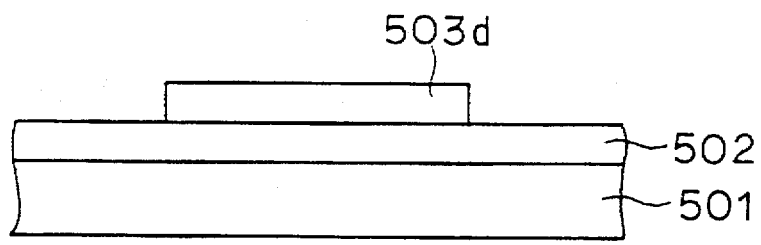
Figure 38:
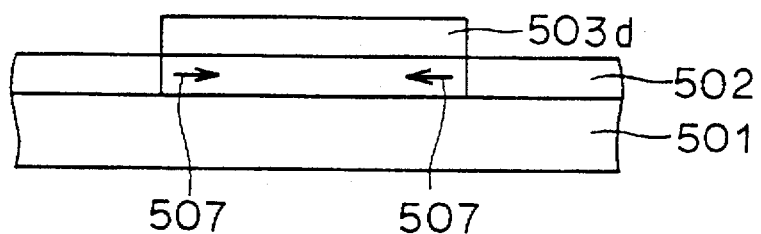

As shown in FIG. 36, the resist 504, which is located only above the region of amorphous silicon film 502 to be monocrystalized, is formed on the CVD silicon oxide film 503c. Thereafter, as shown in FIG. 37, the CVD silicon oxide film 503c is etched using the resist film 504 as a mask, whereby a CVD silicon oxide film 503d is formed. Thereafter, the resist film 504 is removed.

Figure 39:
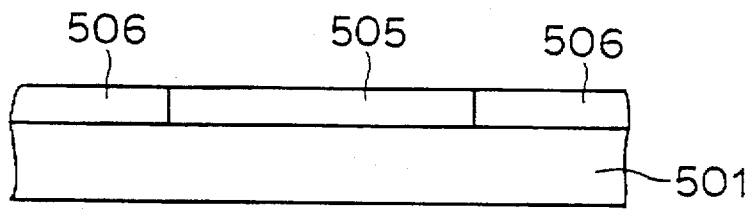

Heat treatment is carried out at the temperature $T_3$ on the structure in which the patterned CVD silicon oxide film 503d is located on the amorphous silicon film 502. Thereby, the patterned silicon oxide film 503d shrinks, which causes a compression stress in the amorphous silicon film 502, i.e., the underlayer. This promotes monocrystallization or increase of a grain diameter of the monocrystal of the portion in which the compression stress is generated. In this manner, the monocrystal silicon film 505 and polycrystal silicon film 506 are formed, as shown in FIG. 39.

Figure 40B:
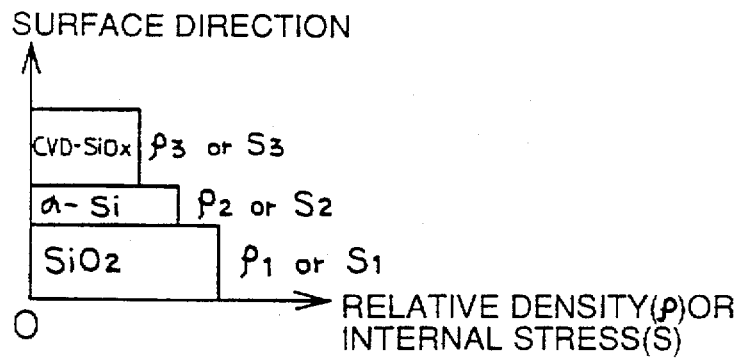
Figure 40C:
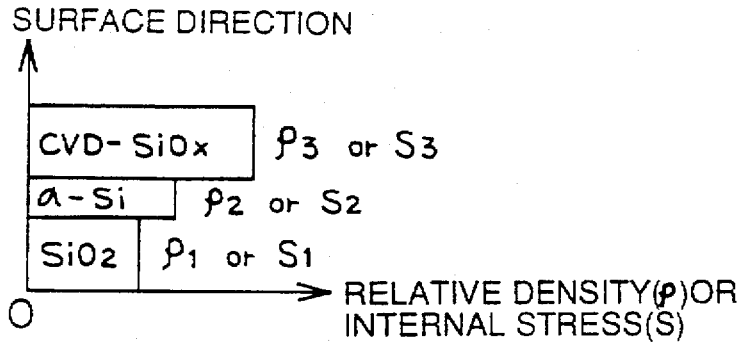
Figure 40D:
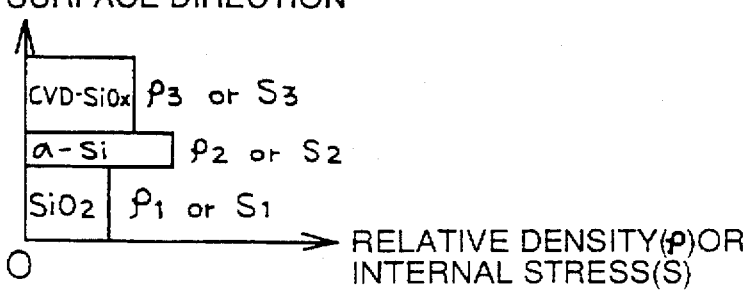

Under the conditions (III) in FIG. 35, the internal stresses in the respective films have the relationship of $S_3 < S_2 < S_1$ in FIG. 40B or $S_1 < S_3 < S_2$ in FIG. 40D. In either case, the internal stresses have the relationship of $S_3 < S_3$.

Conditions (IV) corresponding to the conditions (II) in the embodiment E1 are established when the CVD silicon oxide film 503c is formed by the pressure-reduced CVD method at a relatively high temperature, the oxygen component is produced from the surplus $SiO_x$ (X>2), and the relative density thereof is lower than that of the amorphous silicon film 502. Also in this case, the relative densities of the respective films have the relationship of $\rho_3 < \rho_2 \rho_1$ in FIG. 40B or $\rho_1 <_{\rho3} < \rho_2$ in FIG. 40D. In either case, the relative densities surely have the relationship of $\rho_3 < \rho_2$.

As described above, the embodiment E2 achieves the effect similar to that obtained by the embodiment E1.

The description has been made taking the manufacturing steps of TFT applied to SRAM into account. However, the manufacturing method described above can be applied to the process of manufacturing a semiconductor device of any structure.

Figure 41:
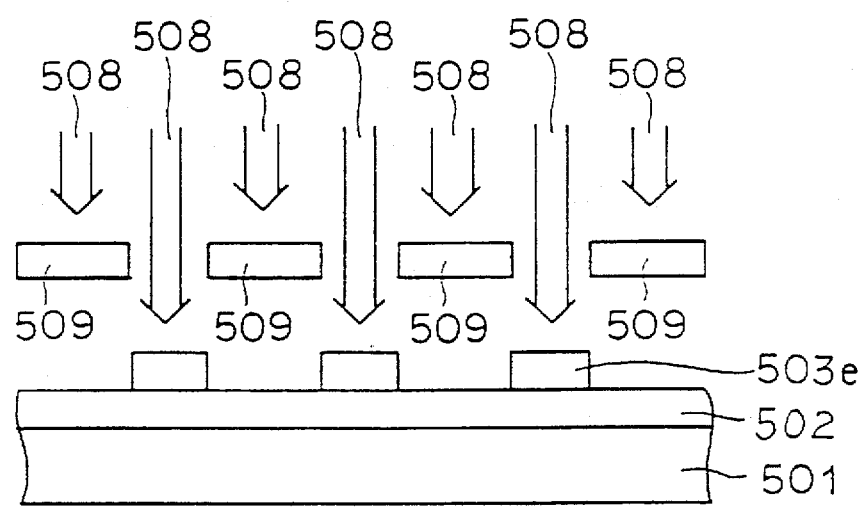
FIG. 41 is a schematic cross section showing a step applicable to the embodiments E1 and E2 of the method of manufacturing the semiconductor thin film used in the thin-film transistor of the invention.

FIG. 41 is a cross section showing another step corresponding to FIG. 31 or 37. As shown in FIG. 41, a metal mask 509 interrupts a flow 508 of material gas, so that a silicon oxide film 503e is selectively formed on the amorphous silicon film 502. As described above, the silicon oxide film 503e can be selectively formed on the amorphous silicon film 502 by partially interrupting the flow of material gas during formation of the silicon oxide film 503e.

In the above embodiments, silicon has been described as material of semiconductor films. In addition to silicon, however, the manufacturing method described above can be applied to single materials, e.g., Ge and C (diamond or graphite), compound semiconductors of any composition such as IV—IV group compound semiconductor materials represented by SiGe, SiC and TiC, III–V group compound semiconductor materials represented by GaAs, GaP and InP, II–VI compound semiconductor materials represented by CdTe, and semiconductor materials consisting of two or more kinds of elements such as AsSe, HgCdTe and InGaAsP. The manufacturing method described above can achieve the similar effect regardless of the states-of semiconductor material such as polycrystal, minute crystal and mixture thereof. Also the manufacturing method described above can achieve the similar effect regardless of the type of semiconductor, i.e., p-type, n-type and intrinsic semiconductor.

Further, the method of manufacturing the amorphous silicon film is not restricted to particular means, and may use any means such as plasma CVD, ECR (Electron Cycrotron Resonance) CVD, optical CVD, sputter deposition, vapor deposition, liquid-phase growth, lamination, electron beam deposition, molecular beam deposition and cluster ion beam deposition provided that monocrystal or substance having a property similar to the monocrystal is obtained by the solid-phase growth.

In the embodiments described above, the insulating film 501 used as the substrate is formed of the silicon oxide film. However, the insulating film is not restricted thereto and may be selected from various insulating films.

In the embodiments described above, the CVD silicon oxide film is used as the film for generating the internal stress. However, various kinds of semiconductor materials, insulating materials, metal materials, semimetals may be used provided that they have such a property that the heat treatment for the solid-phase growth-causes the change in the internal stress, volume and/or shape.

Figure 42A:
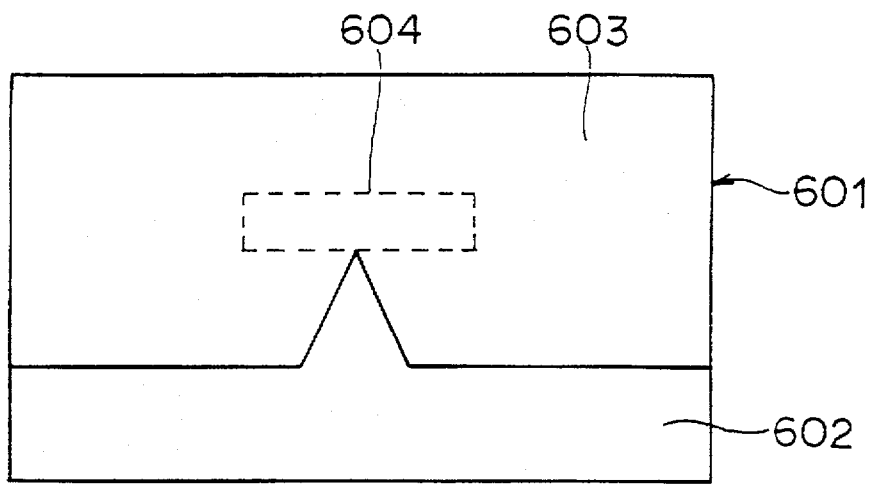
FIGS. 42A–42C are cross sections showing embodiment F of a manufacturing method of a semiconductor thin film used in the thin-film transistor of the invention in accordance with progress of steps.

F. Method of monocrystallization by bringing into contact an amorphous silicon region and a polysilicon region through a minute portion and carrying out solid-phase growth using a crystal grain at the contact portion of the polycrystal silicon region as a nucleus Referring to FIG. 42A, silicon is ion-implanted into a polysilicon region 601, which is masked by a resist or the like, for example with an implanting energy of 100 keV at an implanting rate of $5 \times 10^{15}/cm^2$. Thereby, an amorphous silicon region 603 is formed in the region subjected to the ion implantation. A region not subjected to the ion implantation remains to be polysilicon. A tip end or edge of the polysilicon region 602 is located in contact with a channel region 604 of TFT. The polysilicon has a thickness of 1000 Å.

Figure 42B:
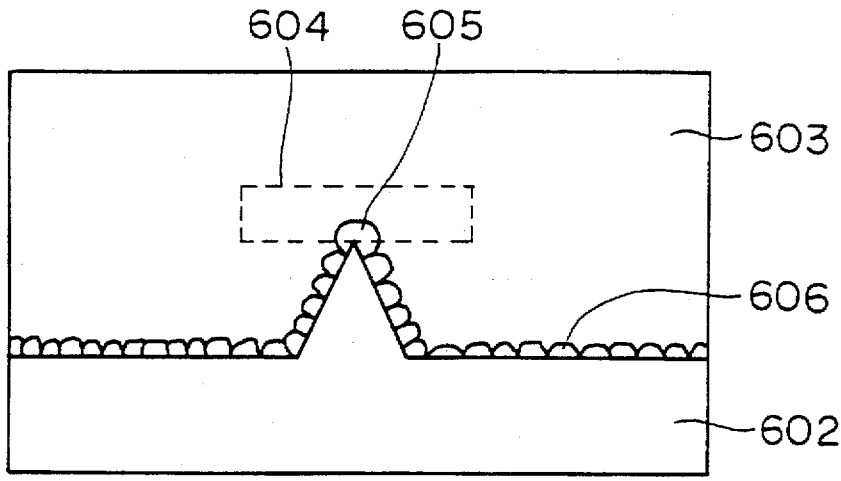

Then, heat treatment is carried out at a temperature of 600° C. for the solid-phase growth of amorphous silicon. In the portions in which a boundary between the amorphous silicon region 603 and polysilicon region 602 extends straight, crystal grains 606 having similar diameters grow uniformly from the boundary, as shown in FIG. 42B. Meanwhile, at the tip end portion of polysilicon region 602, a crystal grain 605 of a larger diameter grows because the tip end portion contains a single nucleus for the crystal growth.

Figure 42C:
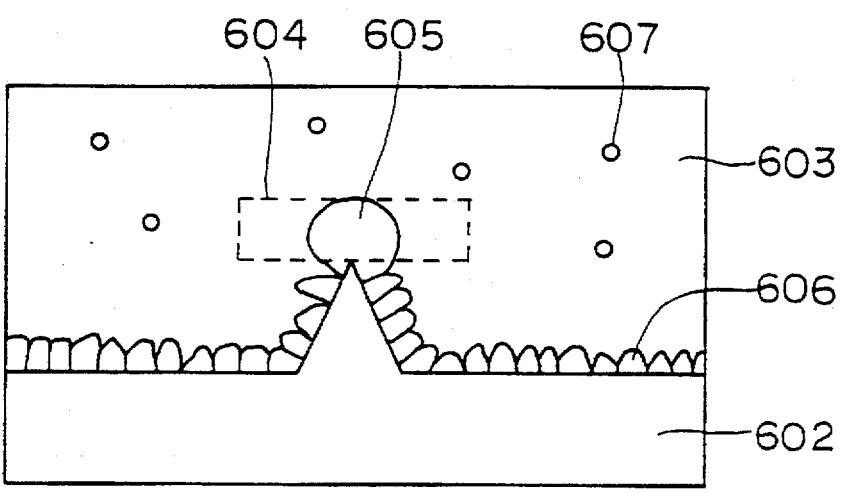

In accordance with the progress of heat treatment, nucleuses are generated at random also in the amorphous silicon region 603, and the crystal grains 607 start to grow, as shown in FIG. 42C. However, the crystal grain 605 generated from the single nucleus at the tip end of polysilicon region 602 further grows to occupy a major portion of the channel region 604. By controlling the crystal grain 605 to occupy the whole channel region 604 during the growth, the OFF current of TFT which will be formed can be reduced and the ON current thereof can be increased.

Figure 43A:
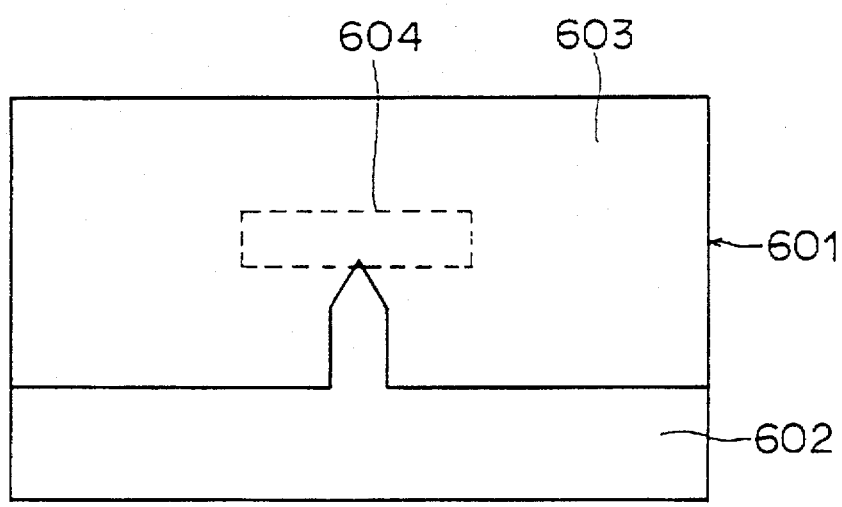
FIGS. 43A and 43B are cross sections showing sectional structures in some steps in another embodiment F of a manufacturing method of a semiconductor thin film used in the thin-film transistor of the invention.
Figure 43B:
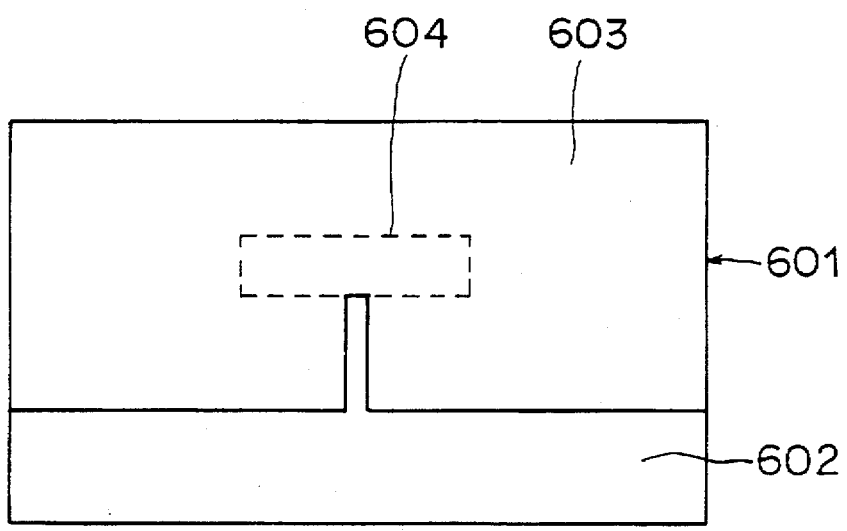

In the above embodiment, the protruded portion of polysilicon region 602 has a triangular section. However, the protruded portion may have a rectangular section provided with a triangular section only its tip end as shown in FIG. 43A, or may have a rectangular section having an extremely small width. In these cases, the crystal growth of single nucleus can be carried out at the boundary portion.

G. Method of monocrystallization by carrying out solid-phase growth while leaving crystal nucleuses partially.

Embodiment G1

Figure 44A:
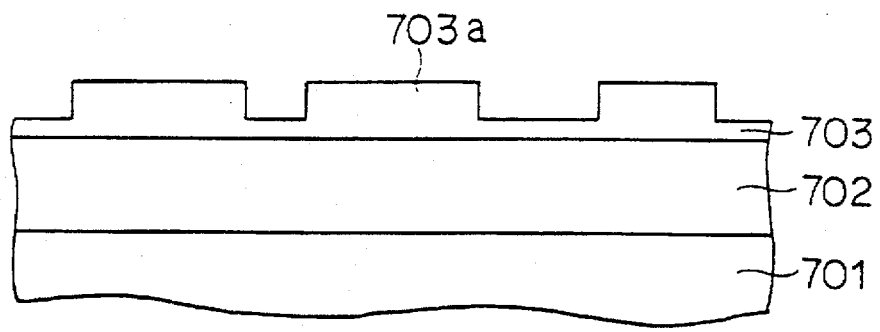
FIGS. 44A–44D are cross sections showing sectional structures in different steps in embodiment G1 of a method of manufacturing a semiconductor thin film used in the thin-film transistor of the invention.

Referring to FIG. 44A, a silicon oxide film 702 is formed on a silicon substrate 701. An amorphous silicon layer including portions of different thicknesses is formed on the silicon oxide film 702. For example, the portions, i.e., amorphous silicon films 703 of 1000 Å in thickness and the portions, i.e., amorphous silicon layers 703a of 2000 Å in thickness are formed on the silicon oxide film 702.

Figure 44B:
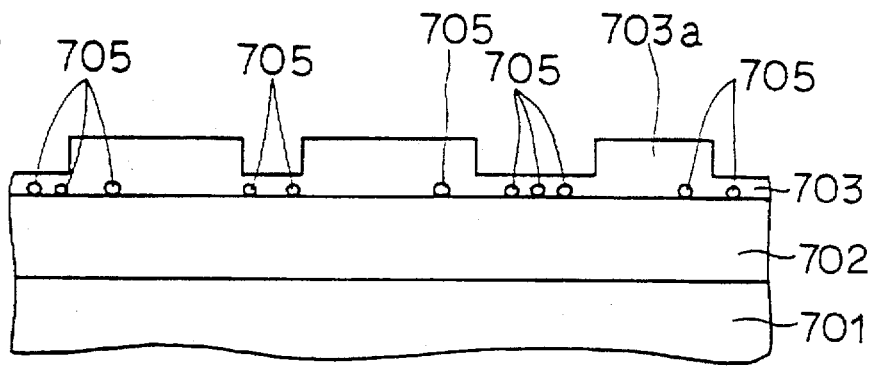

Thereafter, in order to generate crystal nucleuses in the amorphous silicon layer as shown in FIG. 44B, heat treatment is carried out for a time short enough so as not to allow crystallization of the whole amorphous silicon layer. For example, heat treatment is carried out on the amorphous silicon layer at a temperature of 620° C. for about two hours. This heat treatment generates crystal nucleuses 705. During this operation, the temperature and time period for heat treatment are controlled to allow generation of only one crystal nucleus in each thick amorphous silicon layer 703a.

Figure 44C:
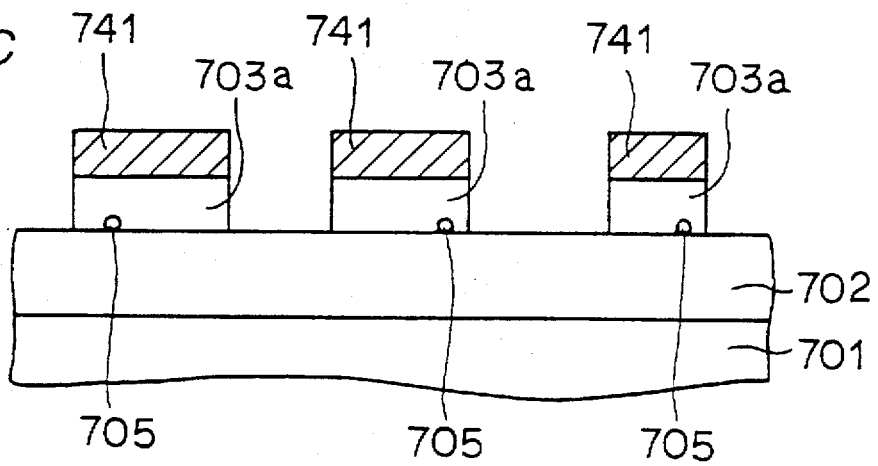
Figure 44D:
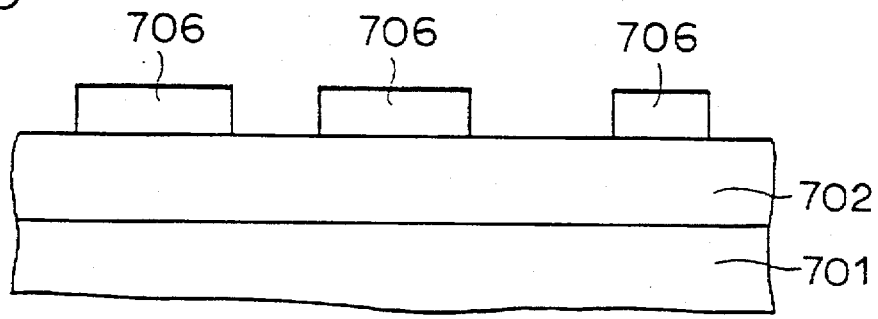

Then, etching is carried out using resist films 741 so that only the thick portions 703a of amorphous silicon layer are left, as shown in FIG. 44C. After removal of the resist films 741, heat treatment is carried out at a temperature of about 600° C. for several hours to grow crystal nucleuses. Thereby, monocrystal semiconductor layers 706 made of only large crystal grains are formed, as shown in FIG. 44D. It is preferable to determine the temperature of the second heat treatment lower than the temperature of the first heat treatment in order to avoid generation of a crystal nucleus by the second heat treatment in addition to the crystal grains generated by the first heat treatment.

Embodiment G2

Figure 45A:
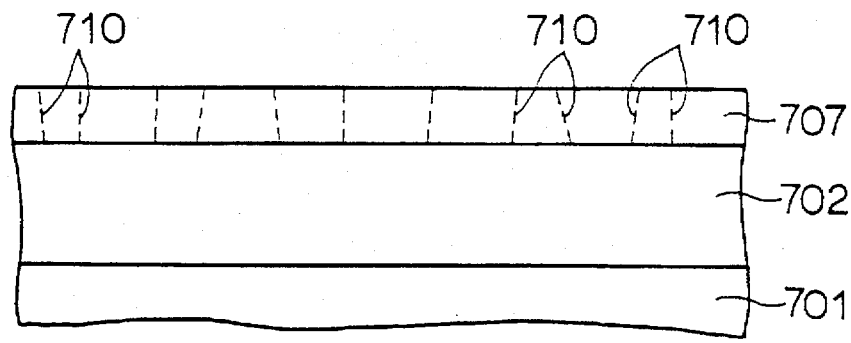
FIGS. 45A–45D are cross sections showing sectional structures in different steps in embodiment G2 of a method of manufacturing a semiconductor thin film used in the thin-film transistor of the invention.

As shown in FIG. 45A, the silicon oxide film 702 is formed on the silicon substrate 701. An amorphous silicon layer is formed on the silicon oxide film 702. A first heat treatment is carried out on the amorphous silicon layer to generate a polysilicon layer 707. There are grain boundaries 710 in the polysilicon layer 707.

Figure 45B:
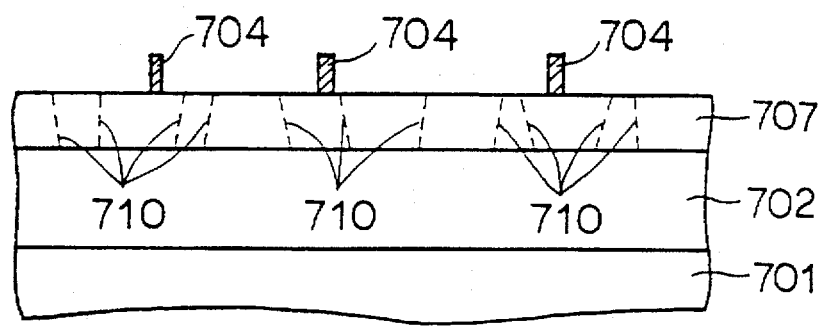
Figure 45C:
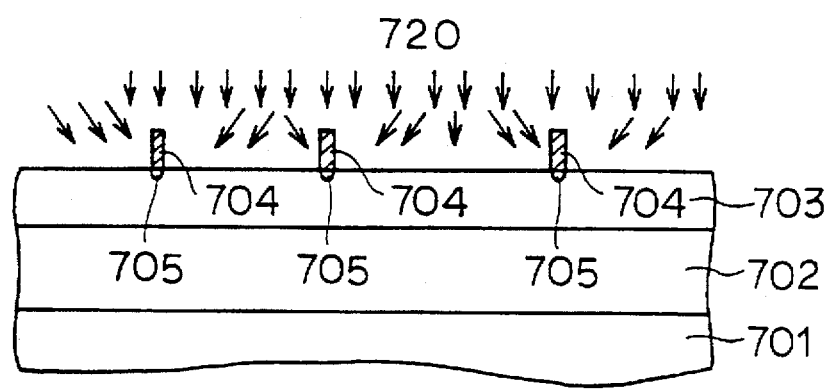

As shown in FIG. 45B, resist films 704 are selectively formed on the polysilicon layer 707. Using the resist films 704 as a mask, semiconductor ions such as silicon ions are implanted into a region other than regions located immediately under the resist films 704 as indicated by arrow 720 in FIG. 45C. Thereby, the crystal nucleuses 705 remain in the regions immediately under the resist films 704. The region not located immediately under the resist films 704 is changed into the amorphous silicon region 703. The ions may be implanted in a direction normal to a wafer or may be implanted by a rotary oblique implanting method in a direction inclined to the wafer.

Figure 45D:
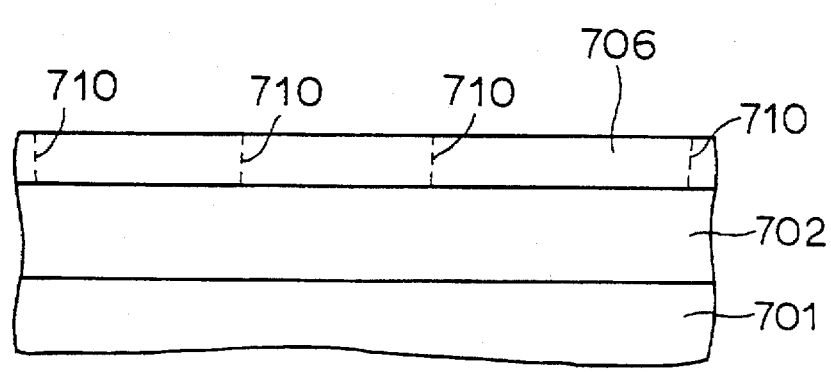

After removal of the resist film 704, the second heat treatment is carried out, so that the remaining crystal nucleuses 705 grow. Thereby, the semiconductor layer 706 made of crystals of a large grain diameter is formed as shown in FIG. 45D. The semiconductor layer 706 has grain boundaries 710. Although it is effective to set the temperature for second heat treatment as low as possible so as to suppress generation of nucleuses, it is set in view of the time period of heat treatment.

Figure 46:
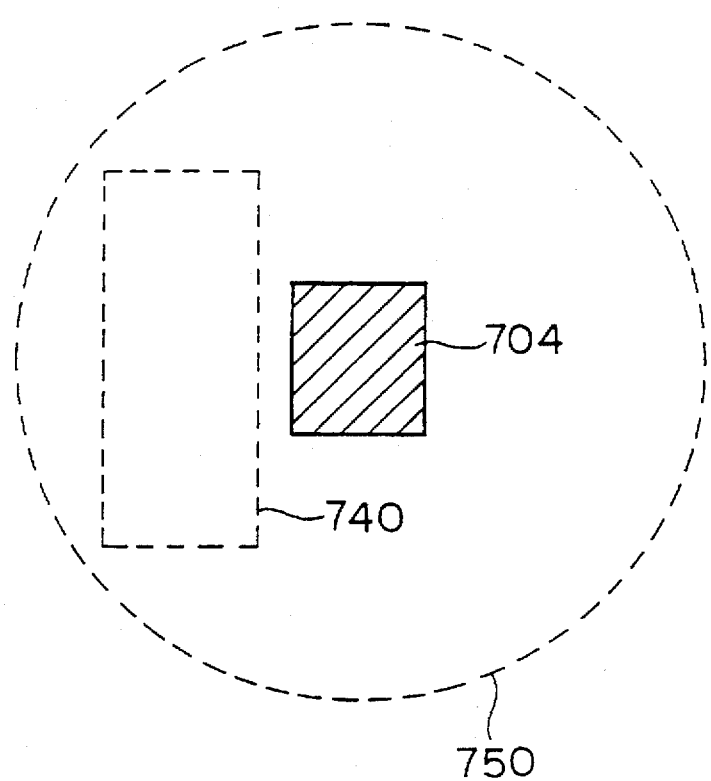
FIG. 46 is a plan showing a planar layout in the embodiment G2 of a method of manufacturing a semiconductor thin film used in the thin-film transistor of the invention.

It is preferable that the size of resist film 704 is approximately equal to the minimum size. The size of formed crystal grain depends on the thickness of amorphous silicon layer. Therefore, it is not always necessary that the positions of resist films 704 coincide with the channel regions to form the channel regions of transistors of monocrystal silicon layers. FIG. 46 is a plan showing a positional relationship between the resist film 704 and channel region 740. When the amorphous silicon layer is, e.g., 0.2 μm in thickness, the crystal grain formed therein will have a diameter of about 2 μm of less. In view of this, the channel region 740 and resist film 704 may be positioned as shown in FIG. 46 with respect to one crystal grain 750, and even in that case the channel region 740 can be formed of monocrystal.

Embodiment 3

Figure 47A:
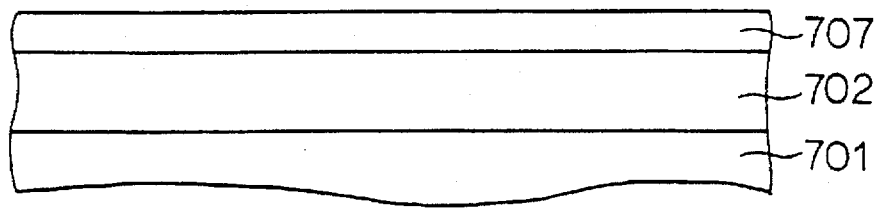
FIGS. 47A–47D are cross sections showing sectional structures in different steps in embodiment G3 of a method of manufacturing a semiconductor thin film used in the thin-film transistor of the invention.
Figure 47B:
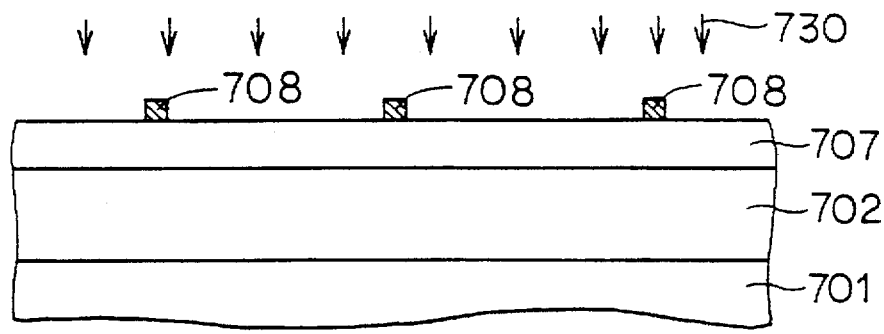
Figure 47C:
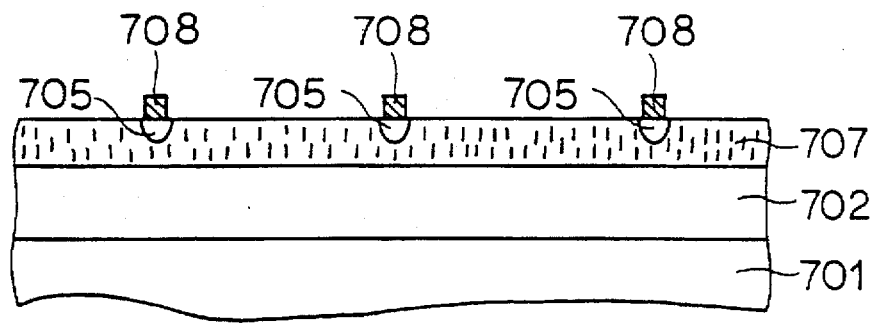

As shown in FIG. 47A, the silicon oxide film 702 is formed on the silicon substrate 701. The polysilicon layer 707 is formed on the silicon oxide film 702. Anti-reflection films 708 are selectively formed on the polysilicon layer 707, as shown in FIG. 47B. The anti-reflection films 708 are formed, e.g., of silicon oxide films or silicon nitride films, and preferably have a thickness allowing use thereof as a mask for ion implantation in a later step. Using the anti-reflection films 708 as a mask, laser beam is directed to the polysilicon layer 707 as indicated by arrow 730. Thereby, regions under and near the anti-reflection films 708 are selectively heated. The output of laser beam can be controlled to increase a diameter of crystal grains immediately under and near the anti-reflection films 708, as shown in FIG. 47C. Thus, the crystal grains 705 having a large diameter are formed immediately under and near the anti-reflection films 708. The polysilicon layer 707 consisting of minute crystal grains are formed in the region other than them.

Figure 47D:
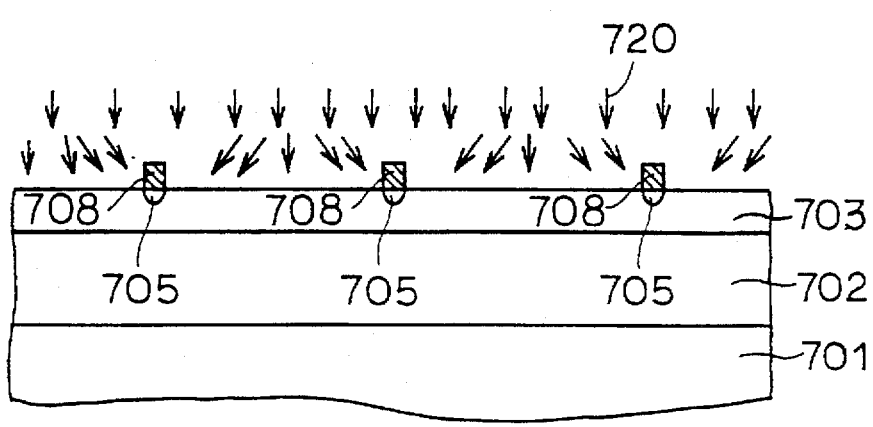

As shown in FIG. 47D, ions of silicon, for example, are implanted into the polysilicon layer 707 as indicated by arrow 720, using the anti-reflection films 708 as a mask. This changes the region other than the regions immediately under the anti-reflection films 708 into amorphous form, i.e., amorphous silicon layer 703. The crystal nucleuses 705 remains immediately under the anti-reflection films 708. In this manner, the positions of crystal nucleuses 705 are controlled. Thereafter, the heat treatment for solid growth is carried out, whereby the semiconductor layers of monocrystal having a large diameter are selectively formed. Thus, the semiconductor layer 706 having the crystal grain boundaries 710 are formed, as shown in FIG. 45D.

Figure 48:
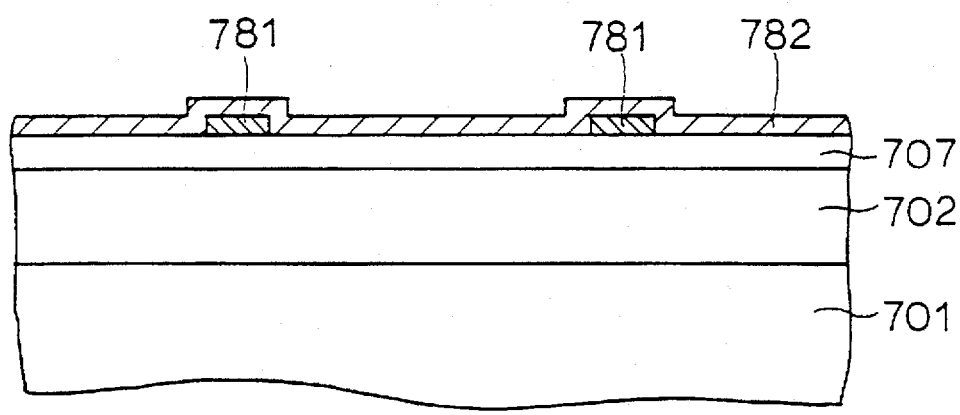
FIG. 48 is a cross section showing a sectional structure in another step applicable to the embodiment G3 of the method of manufacturing the semiconductor thin film used in the thin-film transistor of the invention.

The method using the anti-reflection films has only been described in the above embodiment. If it is necessary to form a cap film in the region in which the nucleus is not to be formed, this can be achieved by setting the film thickness to increase the reflectance of the region in which the nucleus is not to be formed. FIG. 48 is a cross section showing a structure corresponding to the step in FIG. 47B. Silicon oxide films 781 are selectively formed on the polysilicon layer 707. A silicon nitride film 782 covering the silicon oxide film 781 is formed on the polysilicon layer 707. Owing to two kinds of the films formed on the polysilicon layer 707, a mask for ion implantation in a later step can be easily, formed. For example, if argon ion laser (wave length: 488 nm) is to be used, two-layer film including a silicon oxide film 781 (of 100 nm in thickness) and a silicon nitride film 782 (of 100 nm in thickness) may be used, in which case the reflectance of the two-layer portion is about 10% and the reflectance of the portion including only the silicon nitride film 782 (of 110 nm in thickness) is 35%. By the irradiation of laser when these two kinds of films are formed on the polysilicon layer 707, the diameter of crystal grains can be increased only at portions immediately under and near the silicon oxide films 781. After the irradiation of laser, only the silicon nitride film 782 is removed, so that the silicon oxide films 781 remain as a mask. Therefore, the silicon oxide films 781 can be used as a mask for carrying out ion implantation in a self-alignment manner in a later step.

H. Method of monocrystalization by solid-phase growth of an amorphous silicon layer formed of two portions having different thicknesses.

Figure 49:
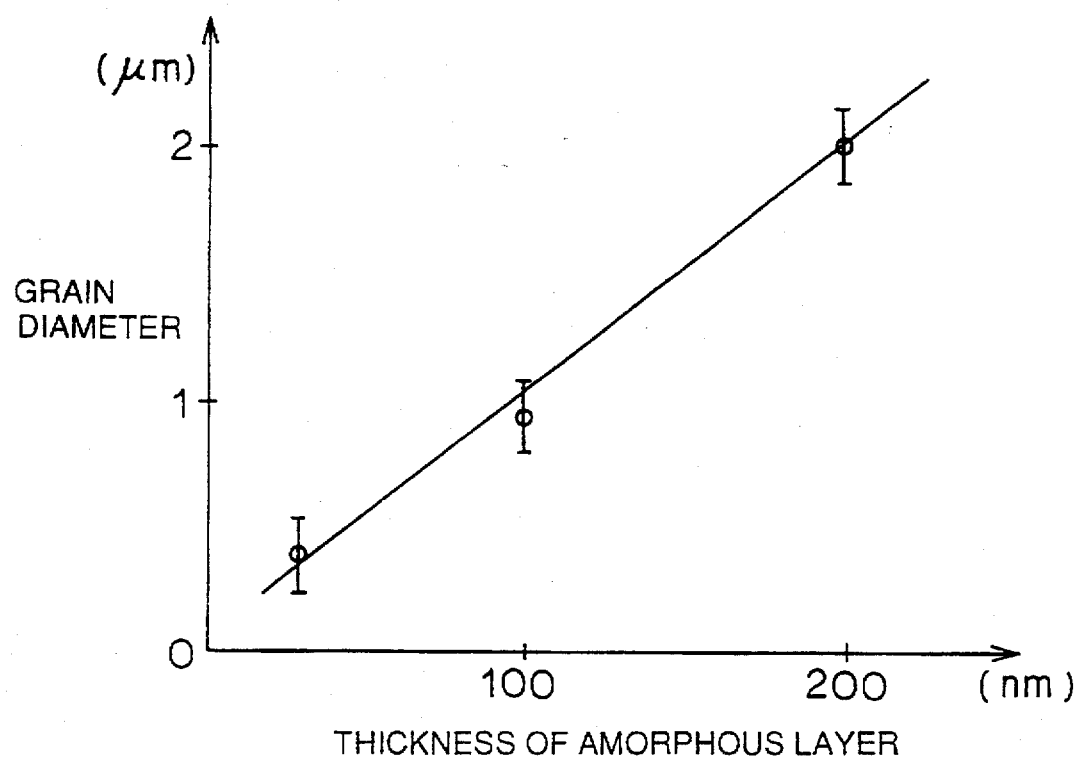
FIG. 49 is a graph showing a relationship between a thickness of an amorphous layer and a diameter of a crystal grain solid-phase-grown from the amorphous layer, which is utilized in a method H of manufacturing a semiconductor thin film used in the thin-film transistor of the invention.

It can be understood from FIG. 49 that as the thickness of an amorphous layer increases, speed of crystal growth and a diameter of crystal grain increase. Therefore, it is possible to selectively increase the sizes of crystal grains in the channel forming regions by preparing a thick amorphous silicon layer corresponding to the channel forming regions of TFTs for the solid-phase growth by heat treatment. Thereby, the channel regions can be formed of monocrystal.

Figure 50:
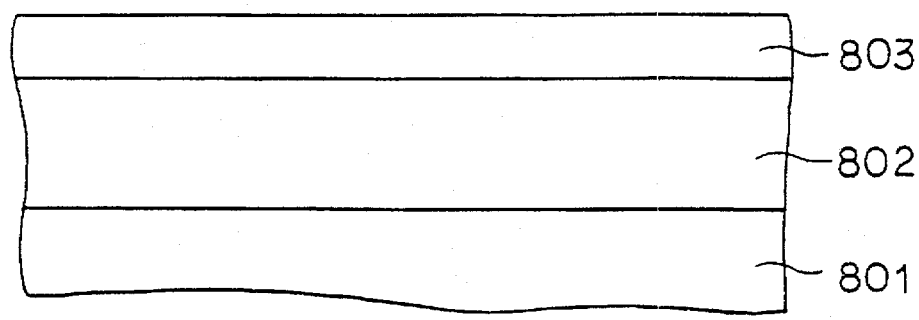
FIGS. 50–53 are cross sections showing sectional structures at different steps in embodiment H of a manufacturing method of a semiconductor thin film used in the thin-film transistor of the invention.
Figure 51:
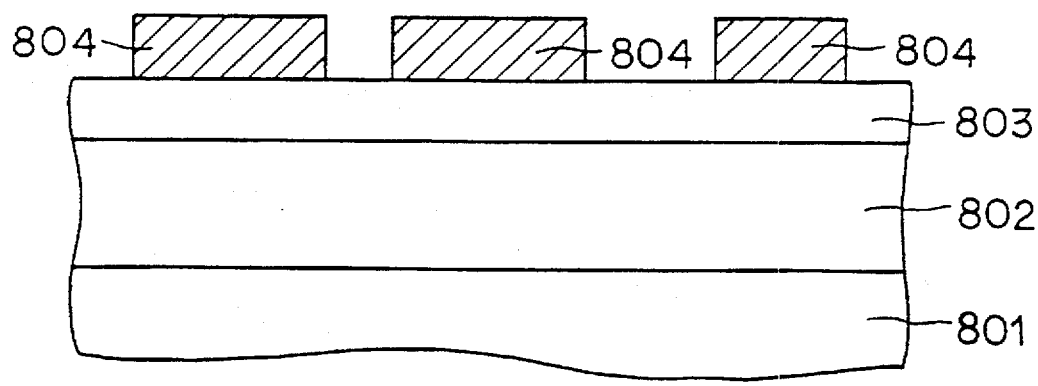
Figure 53:
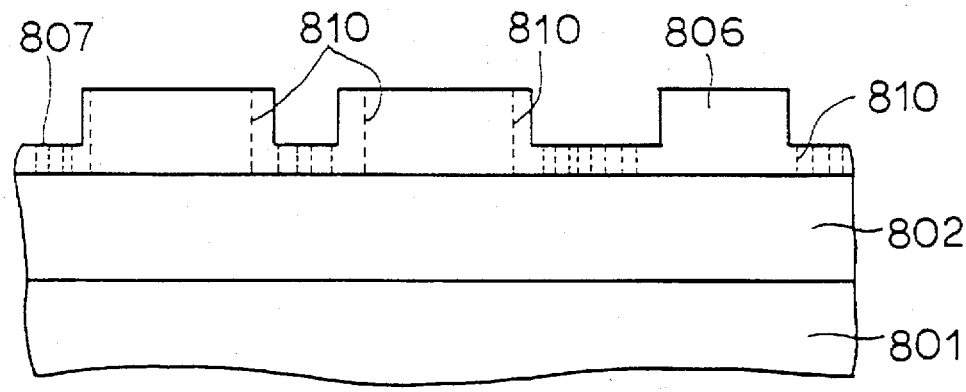

As shown in FIG. 50, a silicon oxide film 802 is formed on a silicon substrate 801. An amorphous silicon layer 803 is formed on the silicon oxide film 802. Then, as shown in FIG. 51, resist films 804 are selectively formed on the amorphous silicon layer 803 with spaces between each other. By carrying out etching on the amorphous silicon layer 803 using the resist films 804 as a mask, portions having different thicknesses are formed in the amorphous silicon layer 803. Then, the resist films 804 are removed, so that thick portions 803a and thin portions 803b are formed in the amorphous silicon layer. Heat treatment of the amorphous silicon layer is carried out at a temperature of about 600° C. for several to several tens of hours, whereby crystal layers 806 including large crystal grains grow in the thick portions, as shown in FIG. 53. Polysilicon layers 807 grow in the thin portions. The polysilicon layers 807 have crystal grain boundaries 810.

If the large film thickness is, for example, about 0.2 μm, crystal grains of about several microns in diameter grow as shown in FIG. 49. If this crystal layer is used in a semiconductor device of a ULSI level, the size of transistor is about several μm², and the size of channel region is not more than about 1 μm². Therefore the whole channel region can be formed of monocrystal by setting sizes of the thick portions nearly equal to these sizes.

Figure 52:
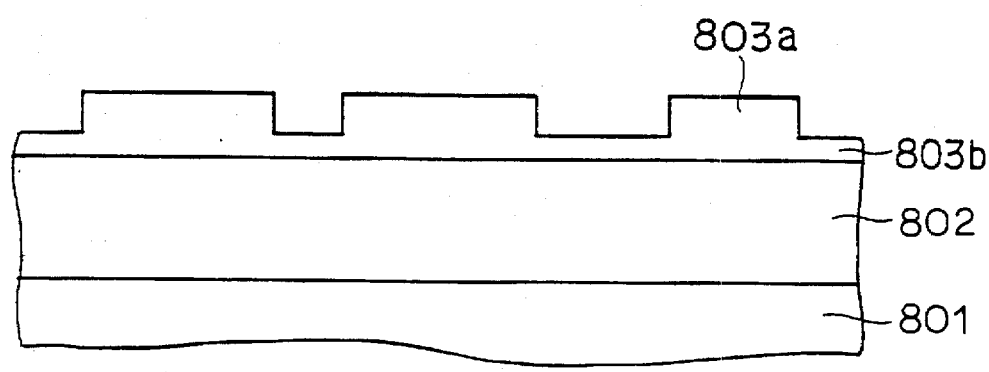
Figure 54:
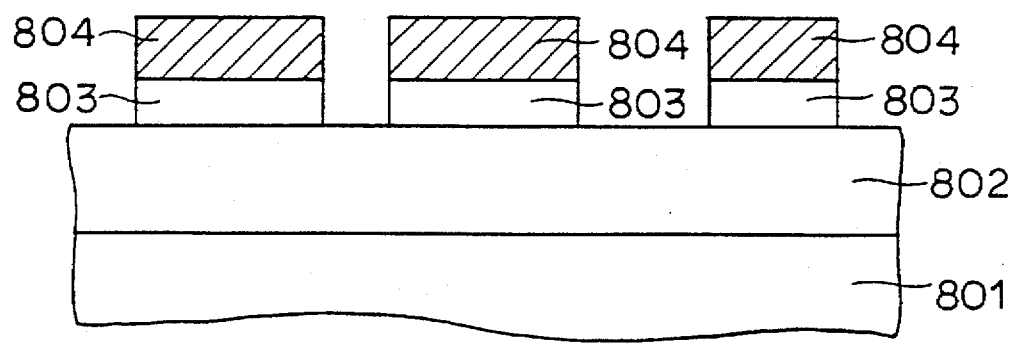
FIGS. 54 and 55 are cross sections showing sectional structures at different steps in another embodiment H of the manufacturing method of the semiconductor thin film used in the thin-film transistor of the invention.
Figure 55:
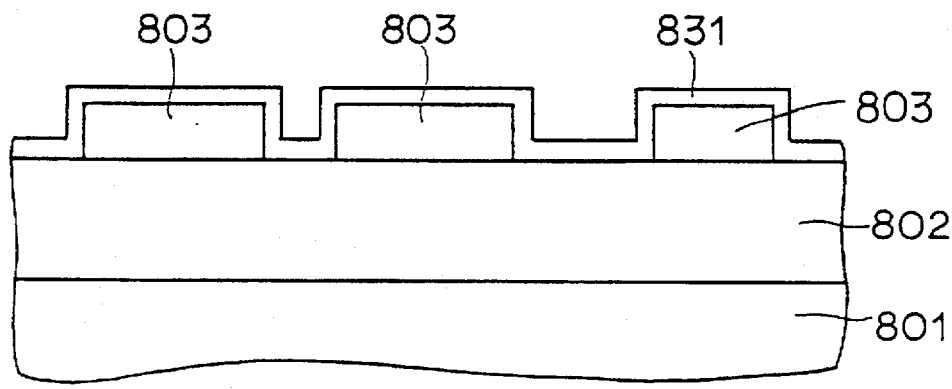

It is also a feature of this embodiment that the heat treatment for solid-phase growth is carried out after forming the amorphous layer of the configuration shown in FIG. 52. Therefore, the amorphous layer of the configuration shown in FIG. 52 may be formed by another method. For example, the amorphous silicon layer 803 which is completely isolated as an island may be formed, as shown in FIG. 54, using the resist films 804 as a mask. After removing the resist films 804, a second amorphous silicon layer 831 is formed to cover the amorphous silicon layers 803, whereby the amorphous silicon layer of such configuration as shown in FIG. 52 are formed as shown in FIG. 55.

Now, description will be made on the cases where the respective methods A–H of manufacturing the semiconductor thin film described above are applied to the manufacturing of the active layers in p-channel MOS transistors (TFTs) of SRAM. In other words, description will be made on the methods of manufacturing the SRAM in the cases where the manufacturing methods A-H described above are applied for forming the active layers 55 (55a and 55b) in TFTs of SRAM of the invention, respectively.

Embodiment 1 of method of manufacturing SRAM

The manufacturing method described below is an embodiment of the method of manufacturing the SRAM which uses the method A of manufacturing the semiconductor thin film. FIGS. 56B–64B are cross sections taken along line B—B in corresponding plans (FIGS. 56A–64A), respectively.

Figure 56A:
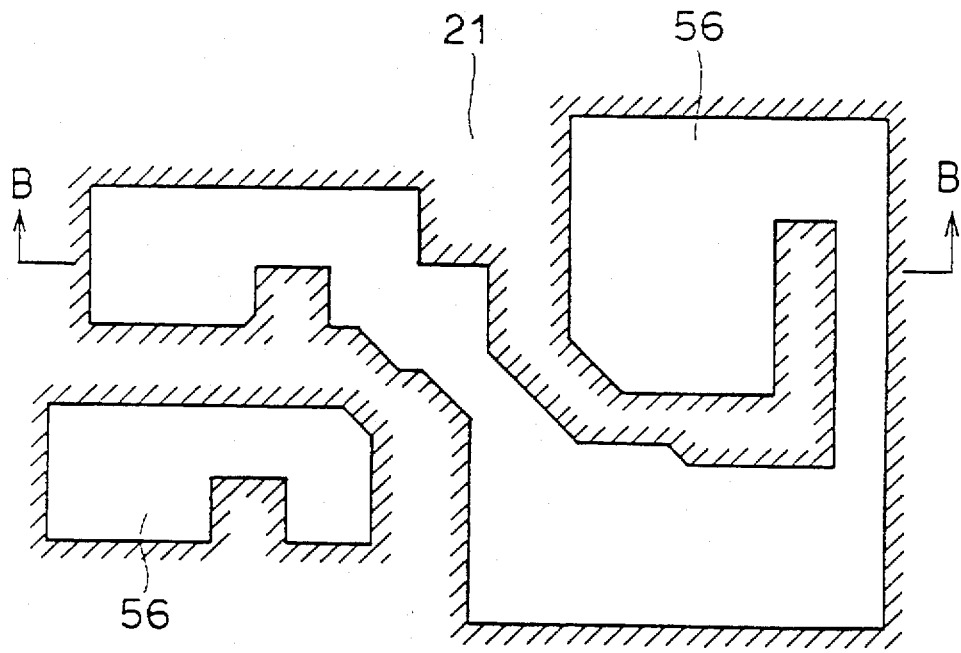
Figure 56B:
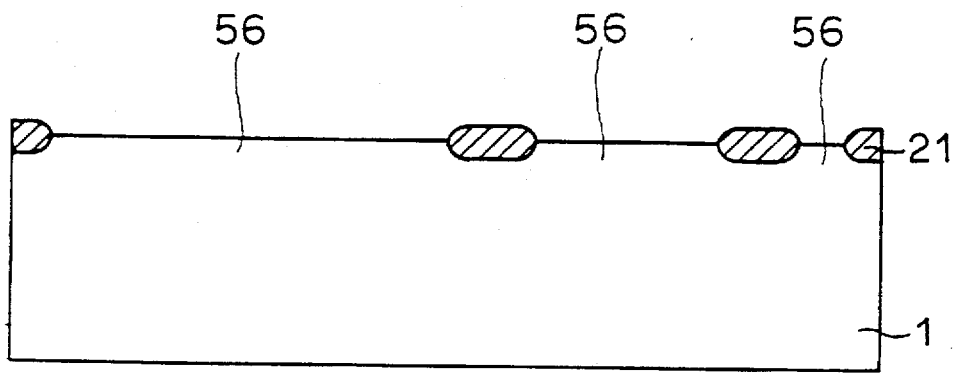

Referring to FIGS. 56A and 56B, the monocrystal silicon substrate 1 is selectively subjected to thermal oxidation by the LOCOS method, whereby the isolating oxide film 21, i.e., silicon oxide film of 4000 Å in thickness is formed, isolating the active regions 56. The temperature for this thermal oxidation is 950° C.

Figure 57A:
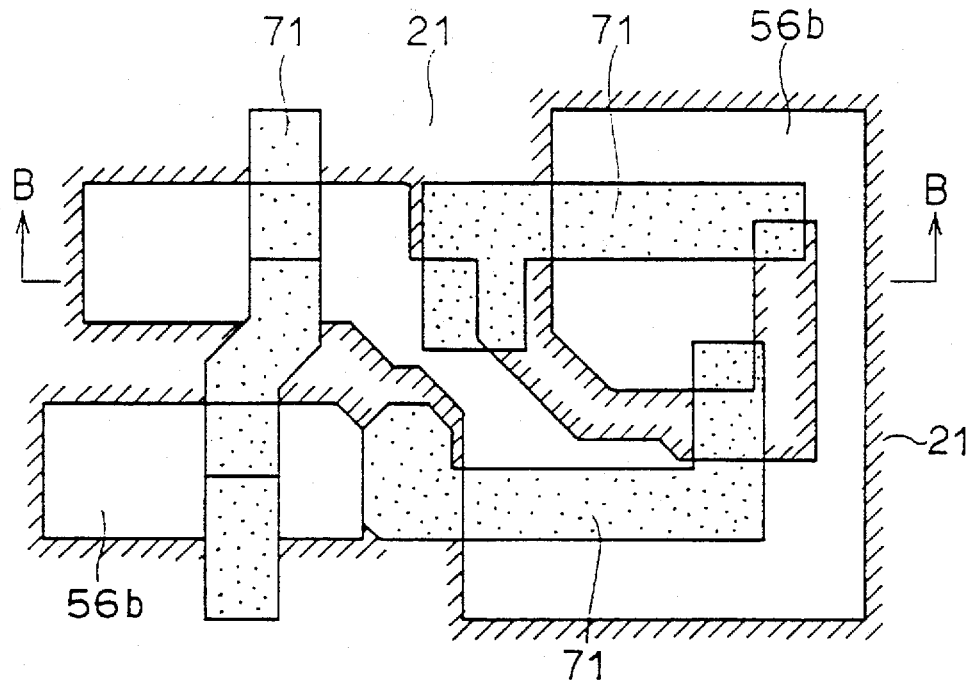
Figure 57B:
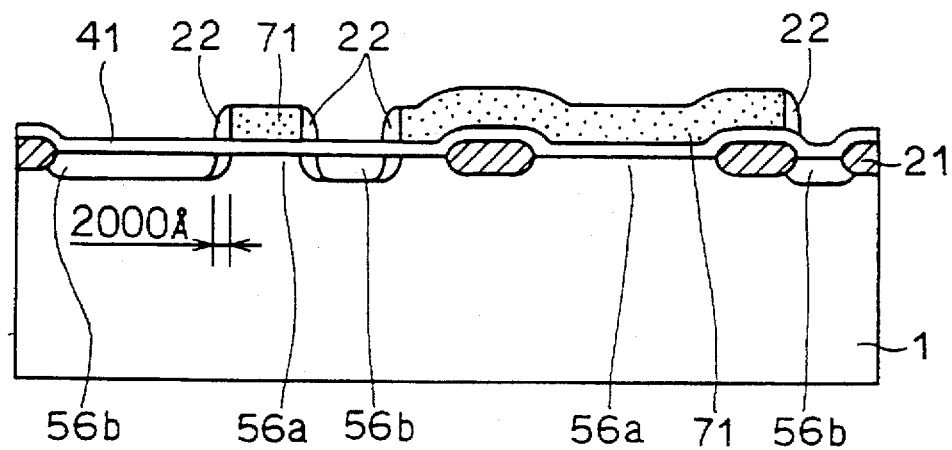

As shown in FIGS. 57A and 57B, thermal oxidation is carried out at a temperature of 850° C. to form the gate insulating film 41, i.e., silicon oxide film of 100 Å in thickness on the silicon substrate 1. Then, the gate electrode 71 is formed on the gate insulating film 41. The gate electrode 71 is made of a polysilicon layer of 1500 Å in thickness containing phosphorus at a concentration of about $10^{20}/cm^3$ and a tungsten silicide ($WSi_2$) layer of 2000 Å in thickness formed thereon by the sputter method. After patterning the gate electrode 71, phosphorus is selectively implanted into the silicon substrate 1 at a dosage of $1 \times 10^{13}/cm^2$ with an implanting energy of 50 keV. Thereafter, the side walls 22 made of oxide films are formed on the side walls of gate electrodes 71 by the CVD method. Each side wall 22 is in contact with the gate insulating film 41 through a region of 2000 Å in width. Thereafter, arsenic is ion-implanted at an implanting rate of $2 \times 10^{15}/cm^2$ with an implanting energy of 50 keV. Heat treatment is carried out in a nitrogen atmosphere at a temperature of 850° C. for 30 minutes to form the n-type source/drain regions 56b of the LDD structure. The regions of silicon substrate 1 immediately under the gate electrodes 71 form the channel regions 56a.

Figure 58A:
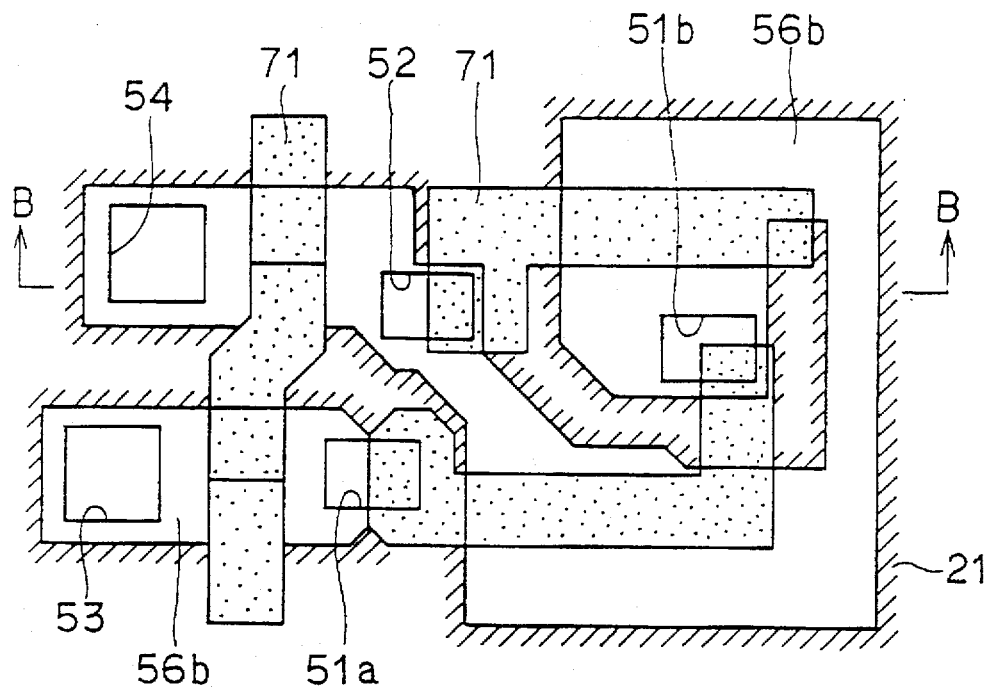
Figure 58B:
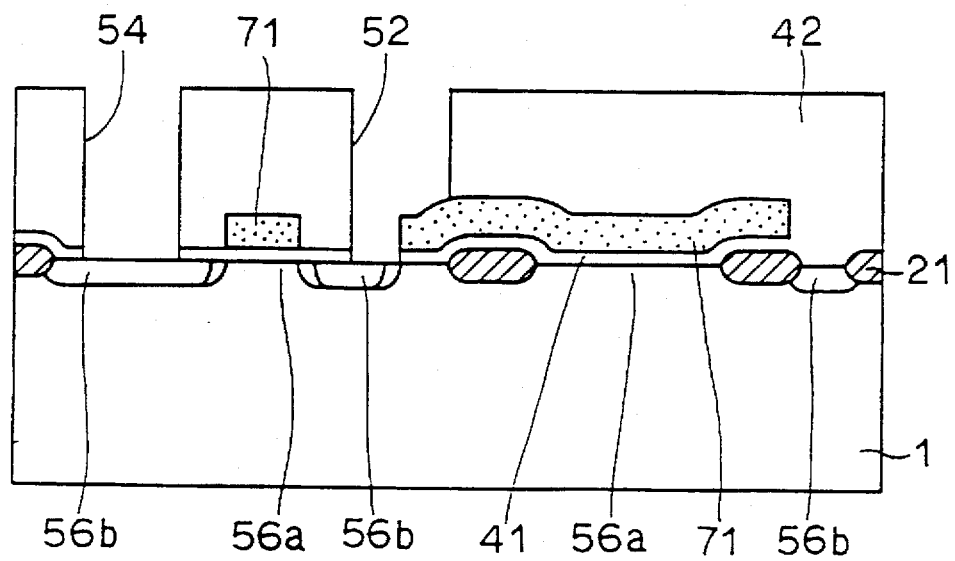

As shown in FIGS. 58A and 58B, an oxide film of 10000 Å in thickness is formed by the CVD method, and is etched by about 7000 Å in thickness by the etchback method for flattening the same. Thereby, the interlayer insulating film 42 is formed. The through holes 51a, 51b, 52, 53 and 54 are formed in the interlayer insulating film 42.

Figure 59A:
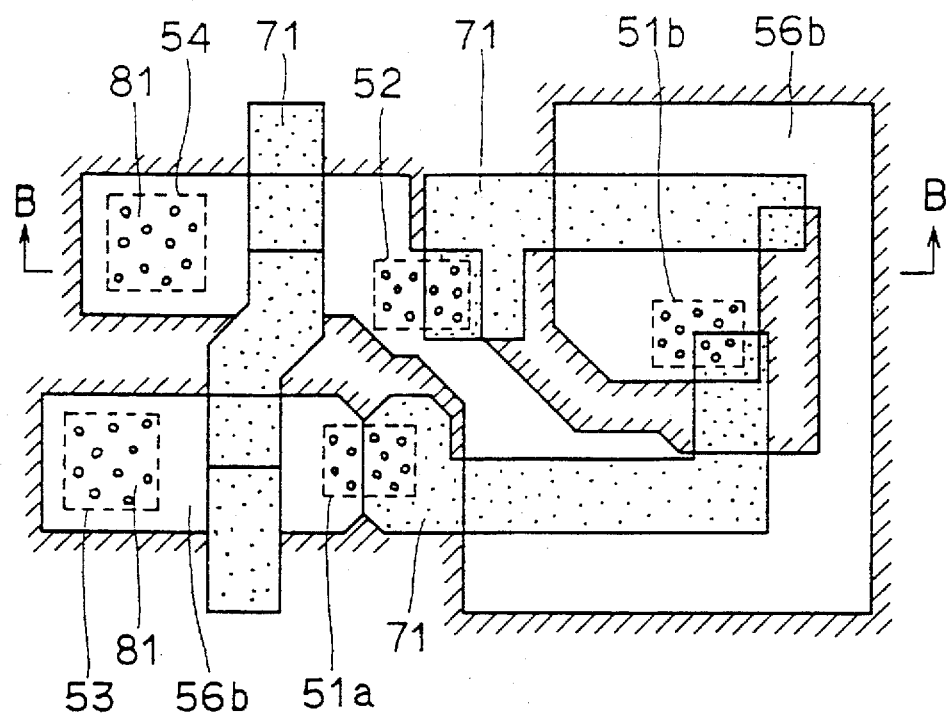
Figure 59B:
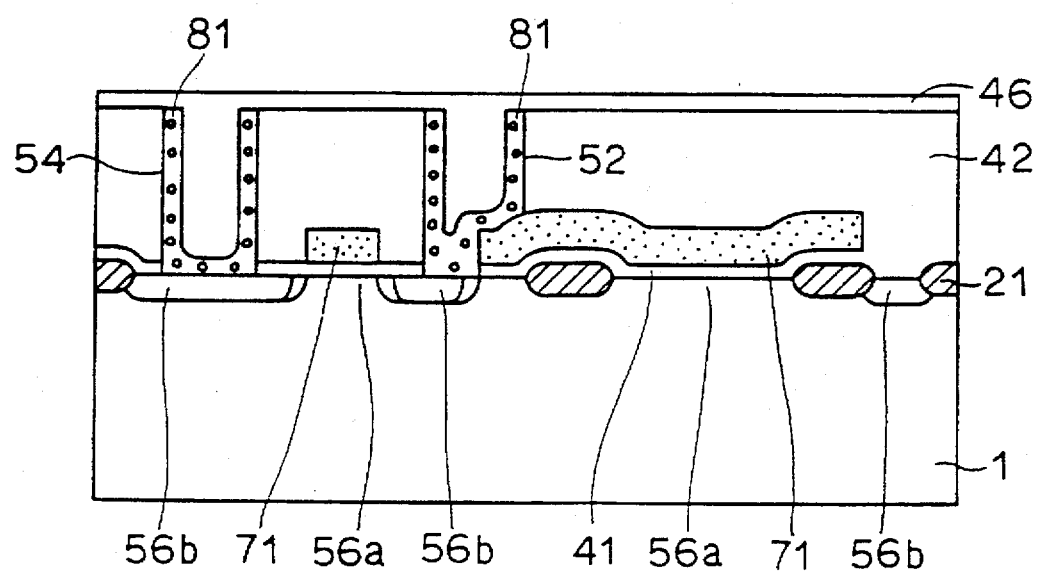

Referring to FIGS. 59A and 59B, a polysilicon film of 2000 Å in thickness is formed in each of the through holes 51a, 51b, 52, 53 and 54. Arsenic is ion-implanted into the polysilicon film at a dosage of $2 \times 10^{15}/cm^2$ with an implanting energy of 50 keV. A tungsten silicide layer of 2000 Å in thickness is formed on the polysilicon film. The polysilicon film and tungsten silicide layer are removed from the region other than the through holes 51a, 51b, 52, 53 and 54. Thereby, the electrically conductive films 81 are formed in the through holes 51a, 51b, 52, 53 and 54. Thereafter, the oxide film 46 filling the through holes is formed at a thickness of about 1000 Å by the CVD method.

Thereafter, the oxide film 46 is removed from the regions of the through holes 52 and 51b. A polysilicon layer of 2000

Figure 60A:
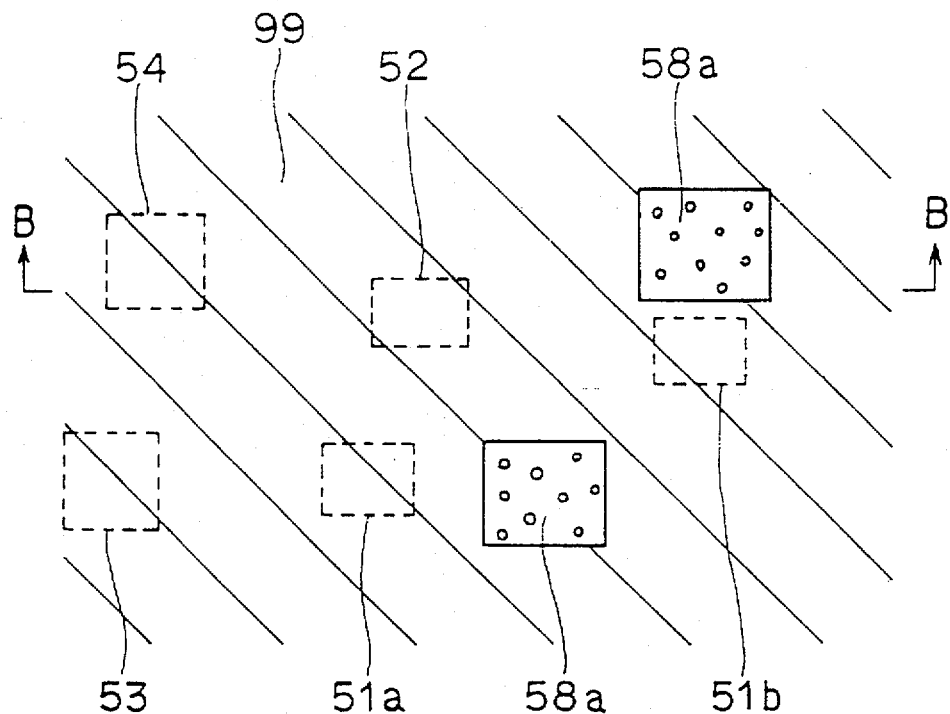
Figure 60B:
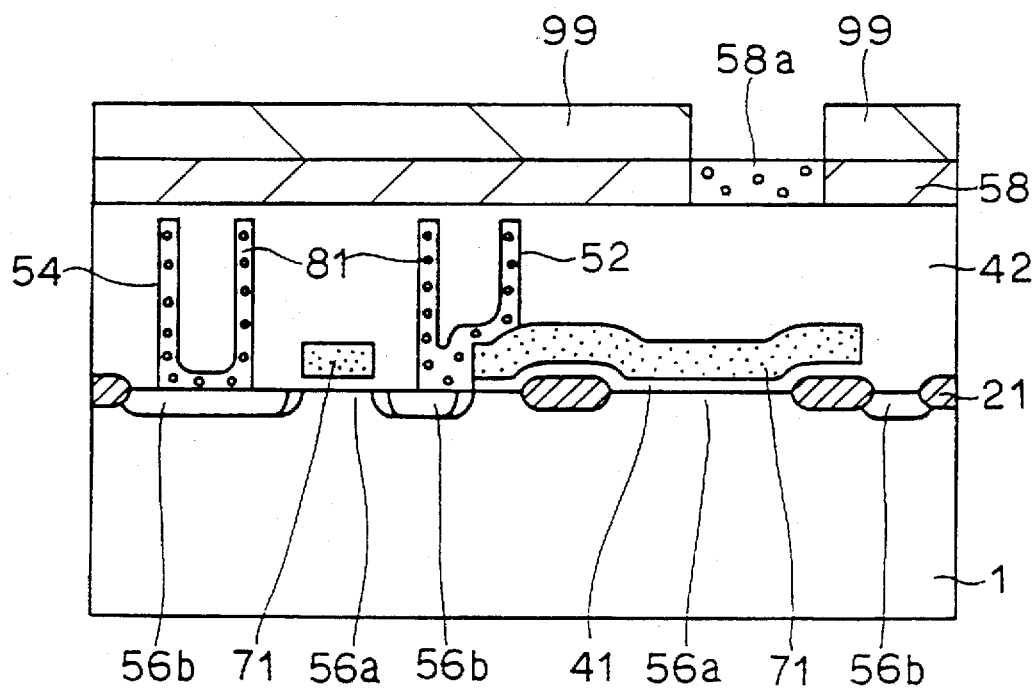

Å in thickness is formed on the whole surface. As shown in FIGS. 60A and 60B, silicon ions are implanted into the whole surface of this polysilicon layer at an implanting rate of $2\times10^{15}/cm^2$ with an implanting energy of 10 keV, whereby the amorphous silicon layer 58 is formed. A resist film 99, which is patterned to expose surfaces of portions corresponding the channel regions only, is formed on the amorphous silicon layer 58. Using this resist film 99 as a mask, silicon ions are implanted into the amorphous silicon layer 58 at a dosage of $5\times10^{15}/cm^2$ with an implanting energy of 100 keV. Thereby, the amorphous silicon layers 58a in which the crystal grains of silicon are generated at a low density are formed in the portions corresponding to the channel regions of p-channel MOS transistors (TFTs). The resist film 99 is removed. Heat treatment is carried out in a nitrogen atmosphere at a temperature of 600° C. for five hours, so that the regions of amorphous silicon layers 58a are monocrystalized.

The plans of FIGS. 60A–64A show portions located higher than the positions of through holes only.

Figure 61A:
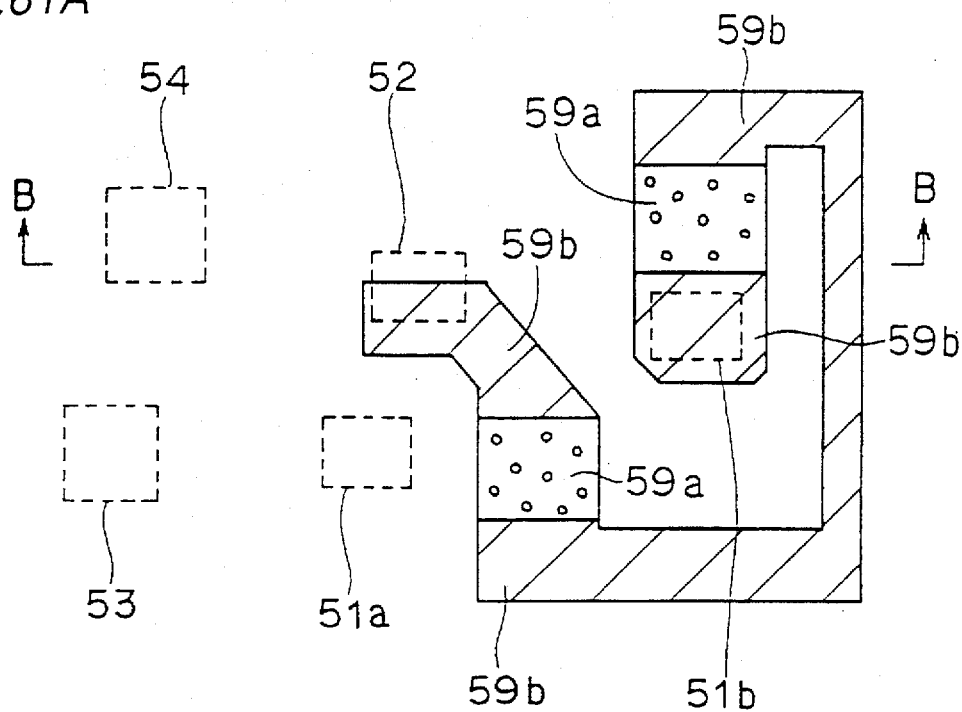
Figure 61B:
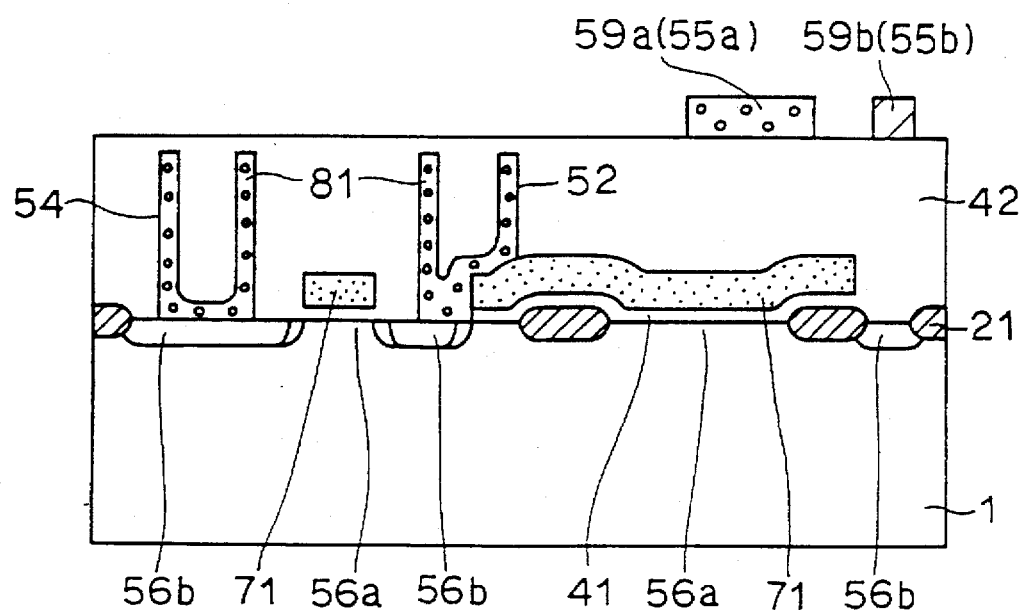

As shown in FIGS. 61A and 61B, the crystallized silicon layer is removed in accordance with a predetermined pattern, so that monocrystal silicon layers 59a (55a) and polysilicon layers 59b (55b) constituting the active layer are formed.

Figure 62A:
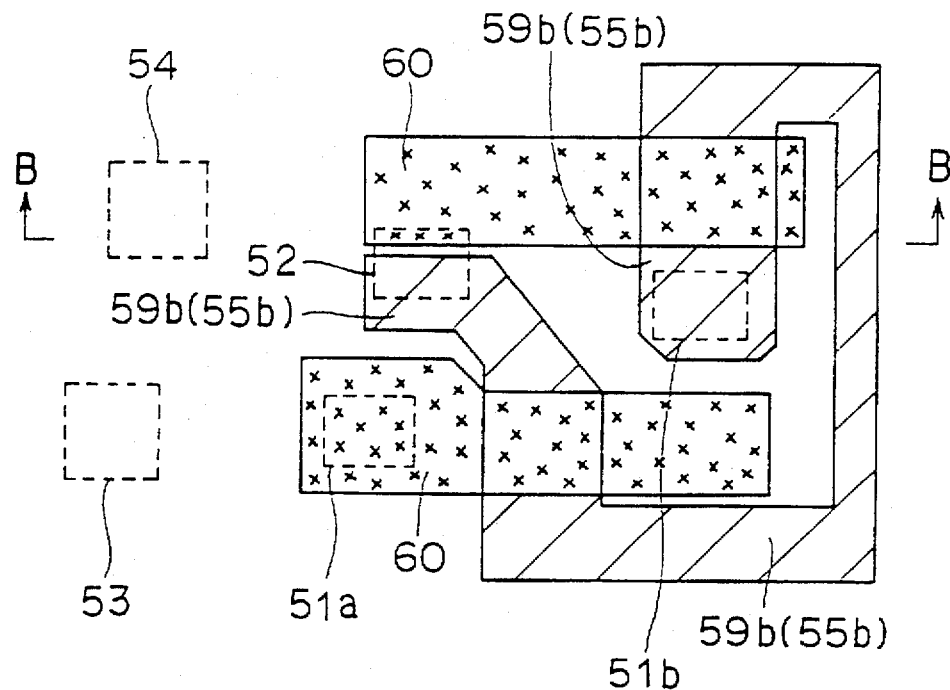
Figure 62B:
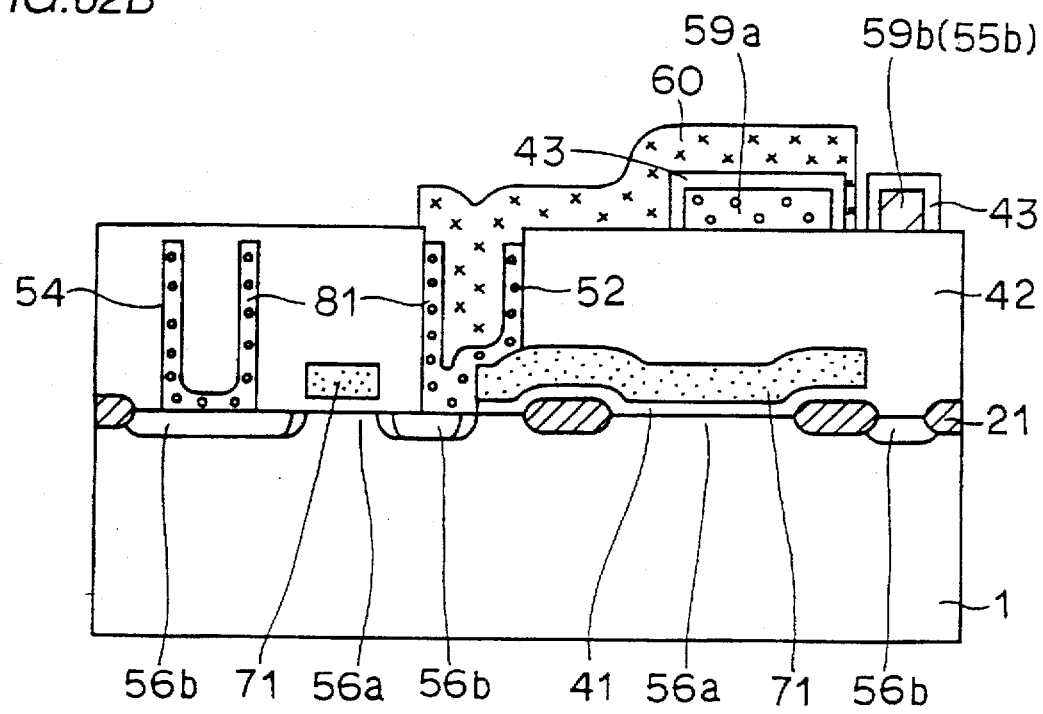

Referring to FIGS. 62A and 62B, the monocrystal silicon layers 59a and polycrystal silicon layers 59b are covered with the silicon oxide film, i.e., gate insulating film 43 of 200 Å in thickness formed at a temperature of 850° C. by the CVD method. Portions of the silicon oxide film 46 located above the regions of through holes 52 and 51a, are removed. A polysilicon layer of 2000 Å in thickness is formed over the whole surface by the CVD method. Arsenic is ion-implanted into the polysilicon layer at a dosage of $4\times10^{15}/cm^2$ with an implanting energy of 50 keV. This polysilicon layer is patterned to form the gate electrodes 60. Using the gate electrodes 60 as a mask, boron (B) is ion-implanted into the polysilicon layer 59b at a dosage of $2\times10^{14}/cm^2$ with an implanting energy of 50 keV. Heat treatment is carried out in a nitrogen atmosphere at a temperature of 850° C. for 30 minutes to form the p-type source/drain regions 55b of p-channel MOS transistors (TFTs).

Figure 63A:
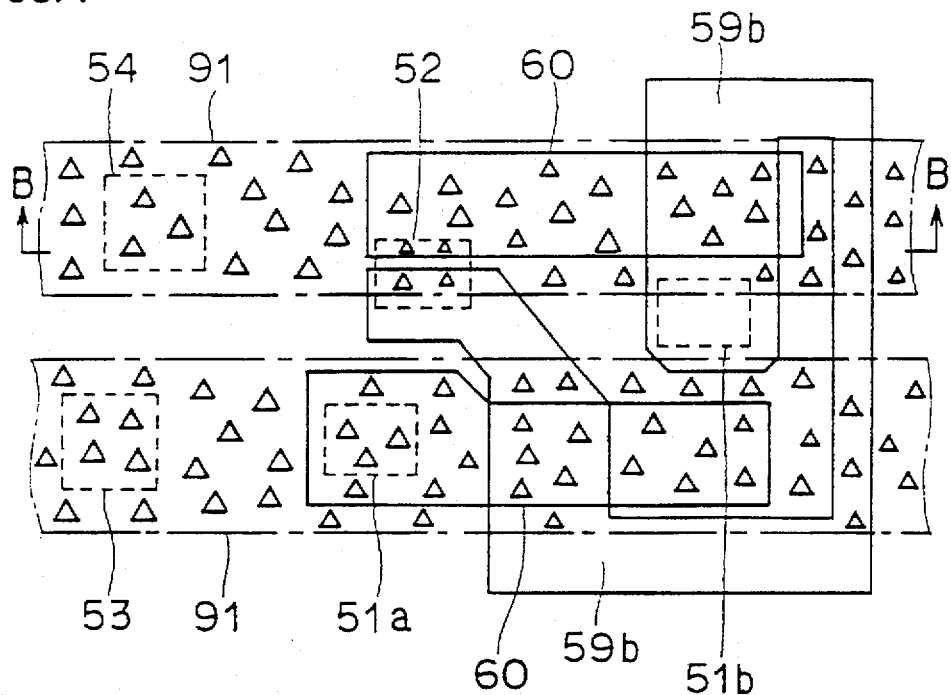
Figure 63B:
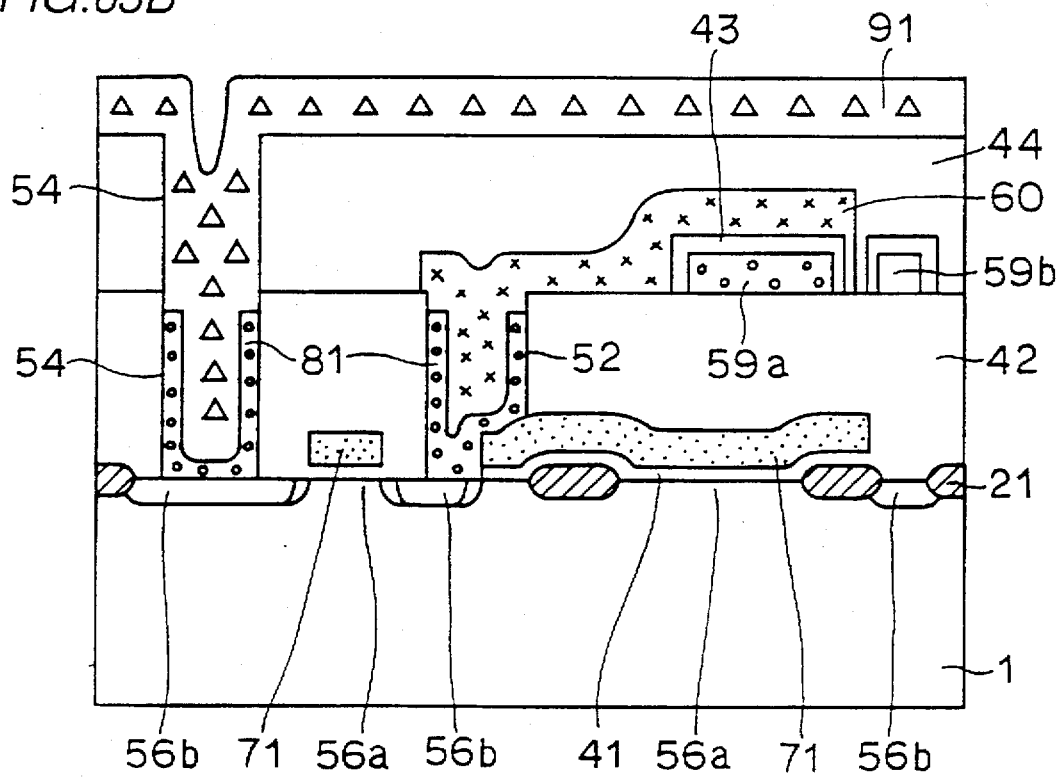

As shown in FIGS. 63A and 63B, the oxide film 44 is formed over the whole surface by the CVD method at a temperature of 700° C. The oxide film 44 is made flat to have the thickness of about 3000 Å. The through holes 53 and 54 are formed in the interlayer insulating film (oxide film) 44. The through holes 53 and 54 are filled with portions of the aluminum interconnection layer 91 which is formed at a thickness of 7000 Å on the interlayer insulating film 44 by the sputter method. This aluminum interconnection layer 91 is patterned to form the bit lines.

Finally, the oxide film 45 is formed on the bit lines 91 by the plasma CVD method in a temperature of 300° C. Although not shown in FIGS. 64A and 64B, through hole are formed to expose at prescribed regions the surface of gate electrode 71. Aluminum interconnection layer 92 which is formed at a thickness of 8000 Å to be in contact with gate electrodes (word line) 71 through the through hole. In this manner, the memory cell of SRAM to which the TFTs of the invention is applied is completed.

Figure 65A:
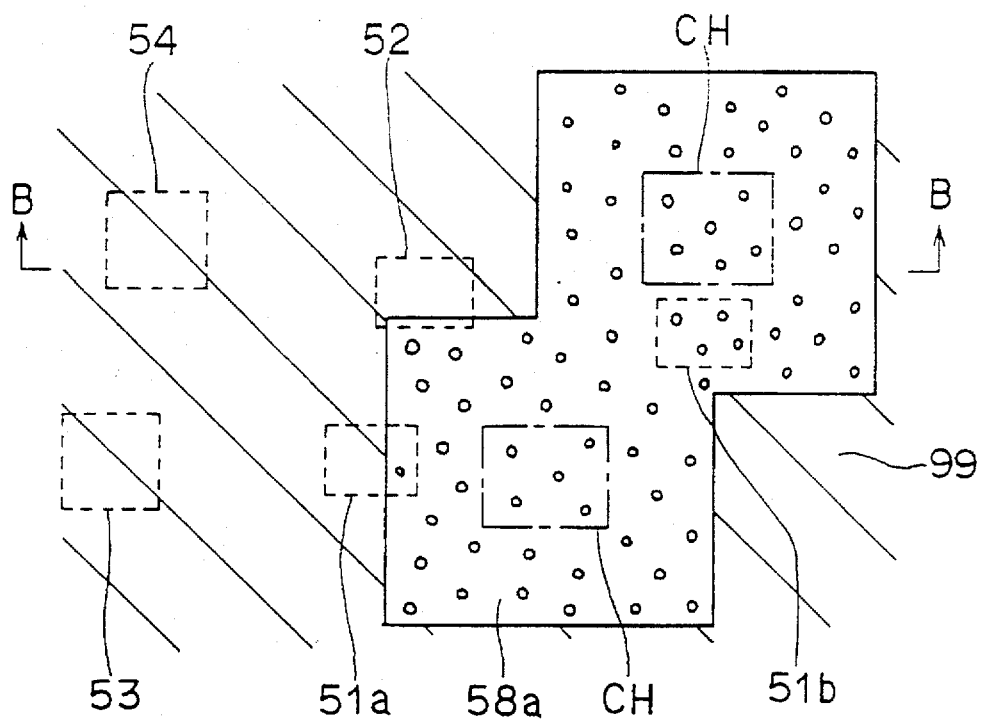
FIGS. 65A and 65B are a plan and a cross section showing modifications of the steps shown in FIGS. 60A and 60B of the embodiment 1 of the method of manufacturing the memory cell of SRAM to which the thin-film transistor of the invention is applied.
Figure 65B:
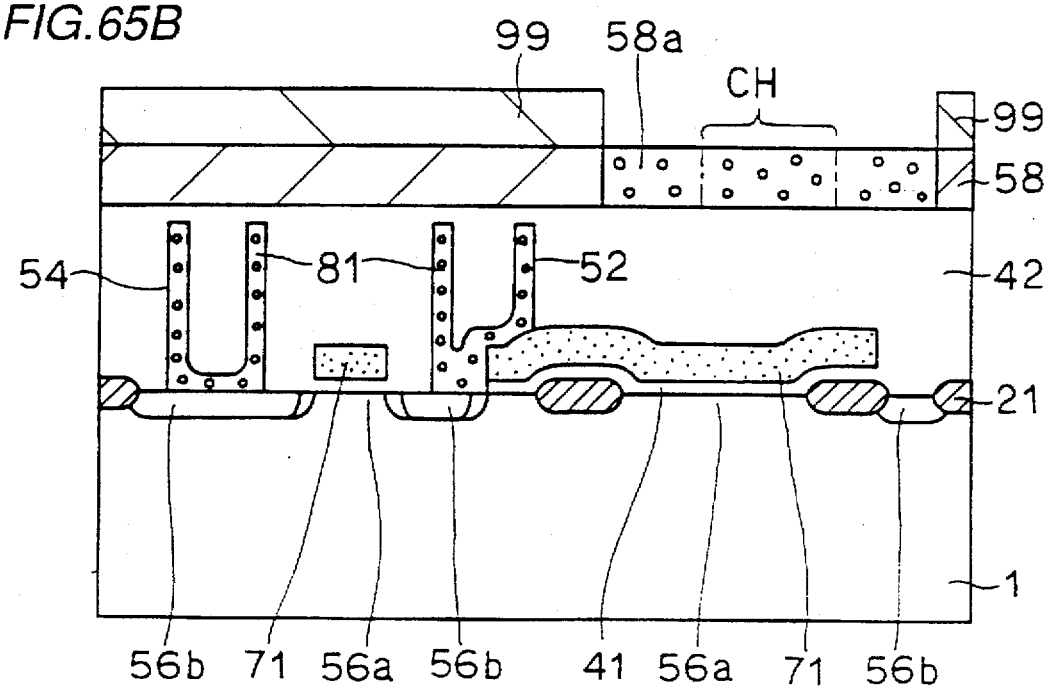

In the step of the above embodiment shown in FIGS. 60A and 60B, the resist film 59 may be patterned to expose a portion of the surface of amorphous silicon layer 58 which is larger than the channel region CH, as shown in FIGS. 65A and 65B.

Embodiment 2 of a method of manufacturing SRAM

This embodiment represents a method of manufacturing semiconductor thin film, which employs the method B of manufacturing the semiconductor thin film. The embodiment 2 employs the manufacturing steps similar to those of embodiment 1 shown in FIGS. 56A and 56B to FIGS. 59A and 59B, and thus only steps subsequent to them will be described below.

Figure 66A:
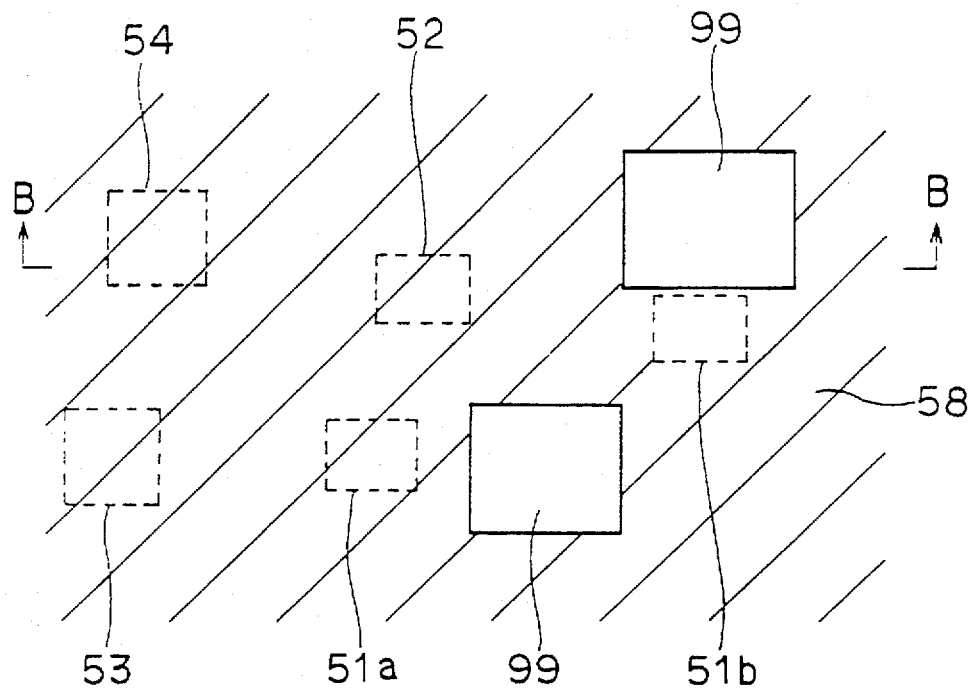
Figure 66B:
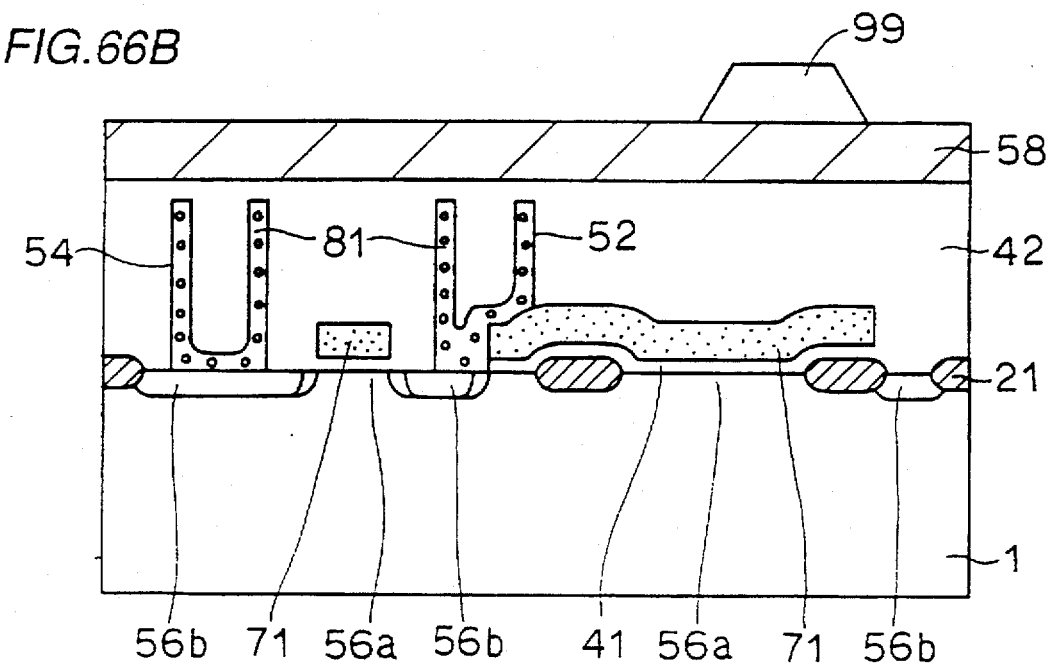

Referring to FIGS. 66A and 66B, the amorphous silicon layer 58 is formed at a thickness of 2000 Å on the interlayer insulating film 42 by the CVD method at a temperature of 450° C. using disilane ($Si_2H_6$) gas as material gas. The resist film 99 is patterned to be larger by about 0.1 to 0.2 μm at its periphery than the channel region of p-channel MOS transistor (TFT) to be formed. During this patterning, time periods for exposure and development are made longer to form the tapered or inclined side walls of resist film 99.

Figure 67A:
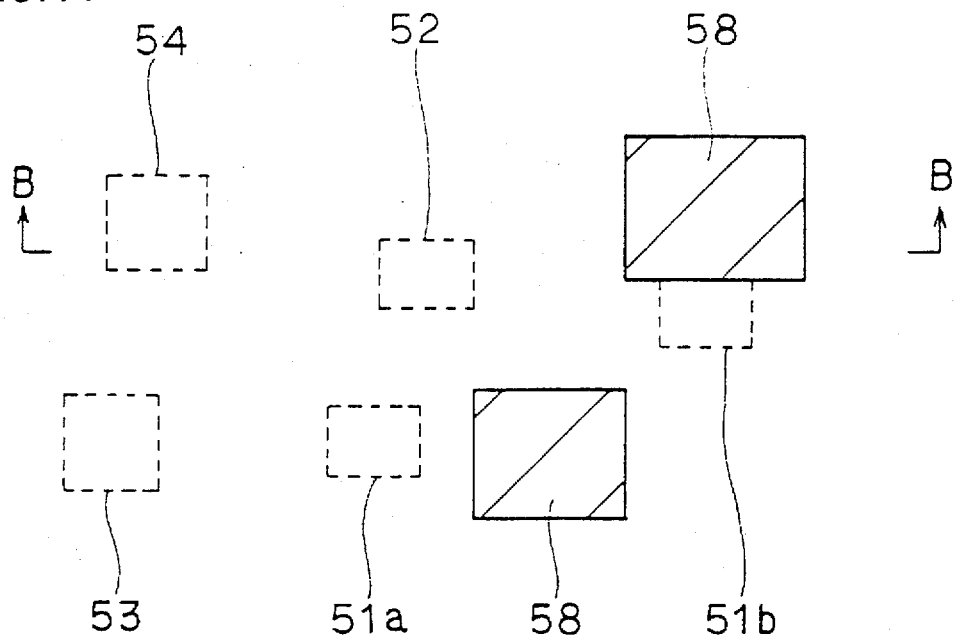
Figure 67B:
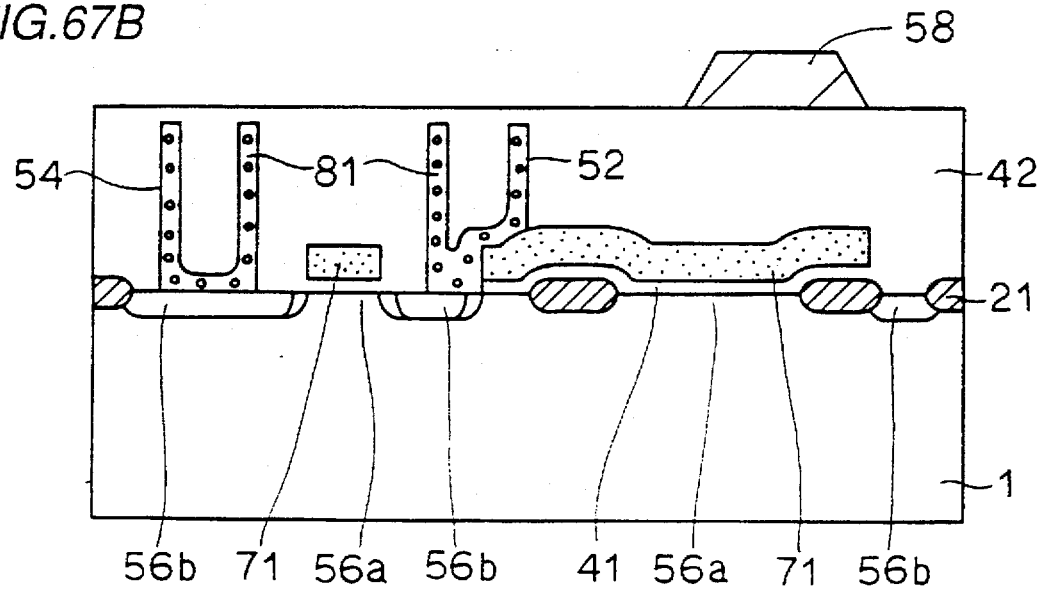

As shown in FIGS. 67A and 67B, the amorphous silicon layer 58 is etched using the resist film 99 as a mask. Then, the resist film 99 is removed. In this step, the side walls of amorphous silicon layer 58 are etched into. inclined shapes because the side walls of resist film 99 are inclined. In the dry etching method, the etching rate of resist is generally twice that of amorphous silicon. Therefore, the amorphous silicon layer having the inclined side surfaces can be obtained by using the resist film 99 as a mask. Thereafter, silicon ions may be implanted into a peripheral portion of the amorphous silicon layer 58. The amorphous silicon layer 58 may have the side walls which are inclined oppositely to those shown in FIG. 67B, for example, by a method in which the pressure of etching gas is successively increased during the etching for increasing an amount of etching gas supplied in a lateral direction and thereby forming oppositely inclined shapes.

Thereafter, the amorphous silicon layer 58 is subjected to the heat treatment in a nitrogen atmosphere at a temperature of 600° C. for five hours. Thereby, a central region of the amorphous silicon layer 58 other than a peripheral region is monocrystallized. The whole amorphous silicon layer 58 is monocrystallized if the above heat treatment is carried out on the amorphous silicon layer having the inclined shape opposite to that shown in FIGS. 67A and 67B, or if the above heat treatment is carried out on the amorphous silicon layer 58 of which peripheral region is subjected to the ion implantation of silicon ion.

Figure 68A:
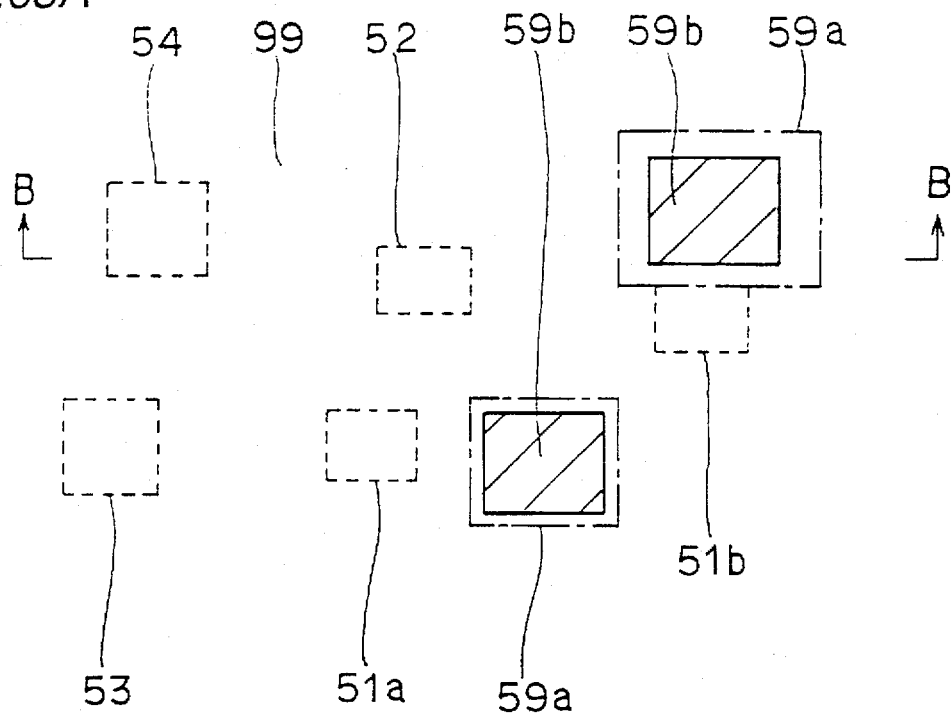
Figure 68B:
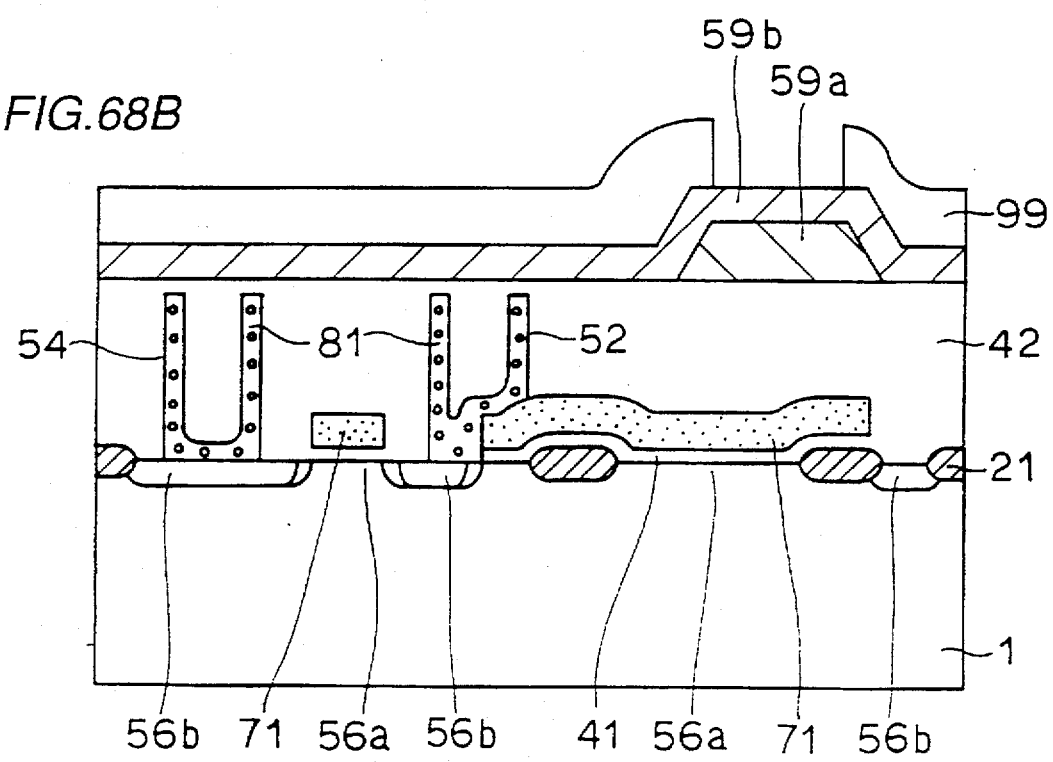

As shown in FIGS. 68A and 68B, the polycrystal silicon film 59b covering the monocrystal silicon layer 59a is formed at a thickness of 1000Å on the interlayer insulating film 42. The resist film 99 is formed on the polysilicon layer 59b, and is patterned to form openings at portions corresponding to the channel regions of p-channel MOS transistors (TFTs).

Figure 69A:
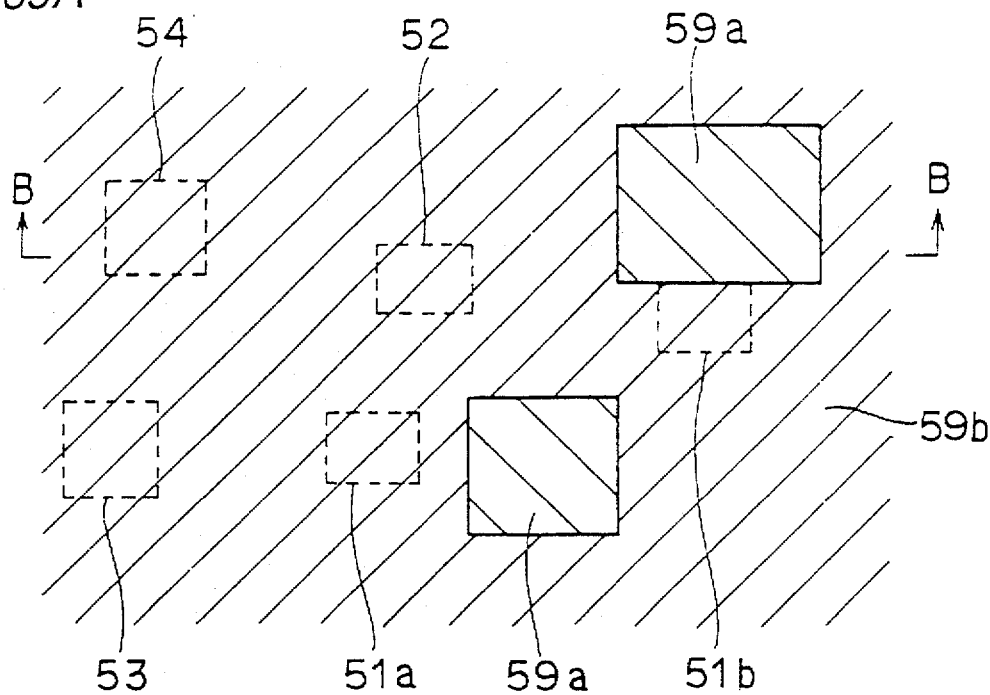
Figure 69B:
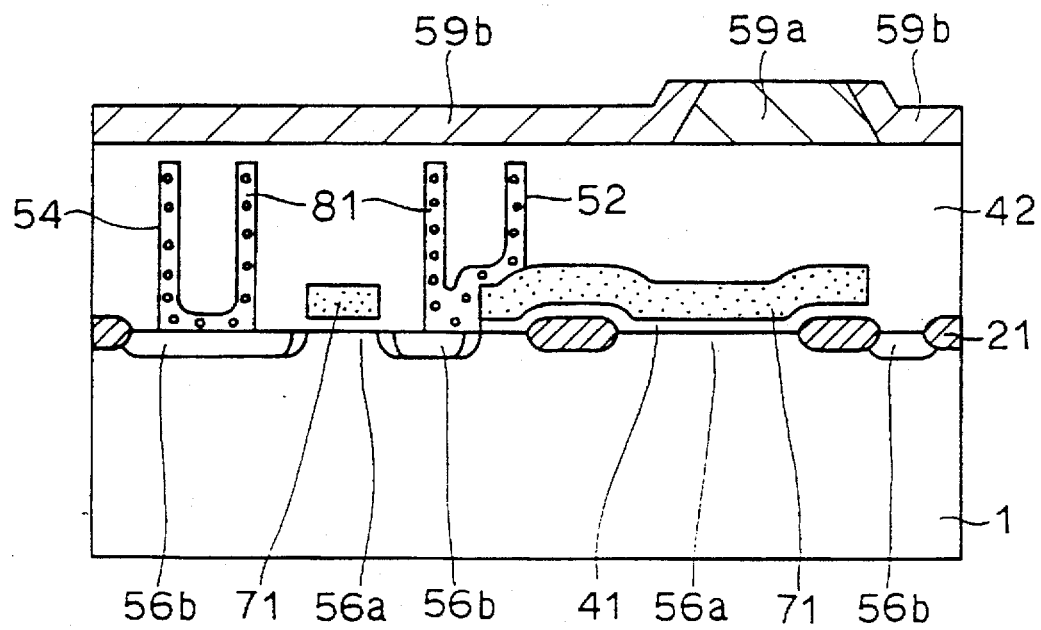

As shown in FIGS. 69A and 69B, the polysilicon layer 59b on the monocrystal silicon layer 59a is removed, using the resist film 99 as a mask. Thereafter, the resist film 99 is removed.

Figure 70A:
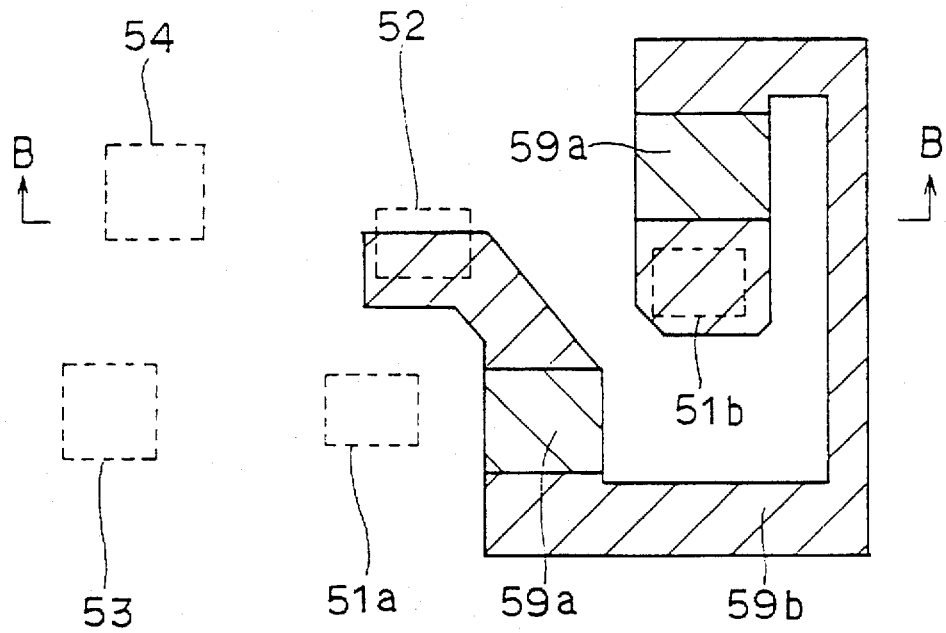
Figure 70B:
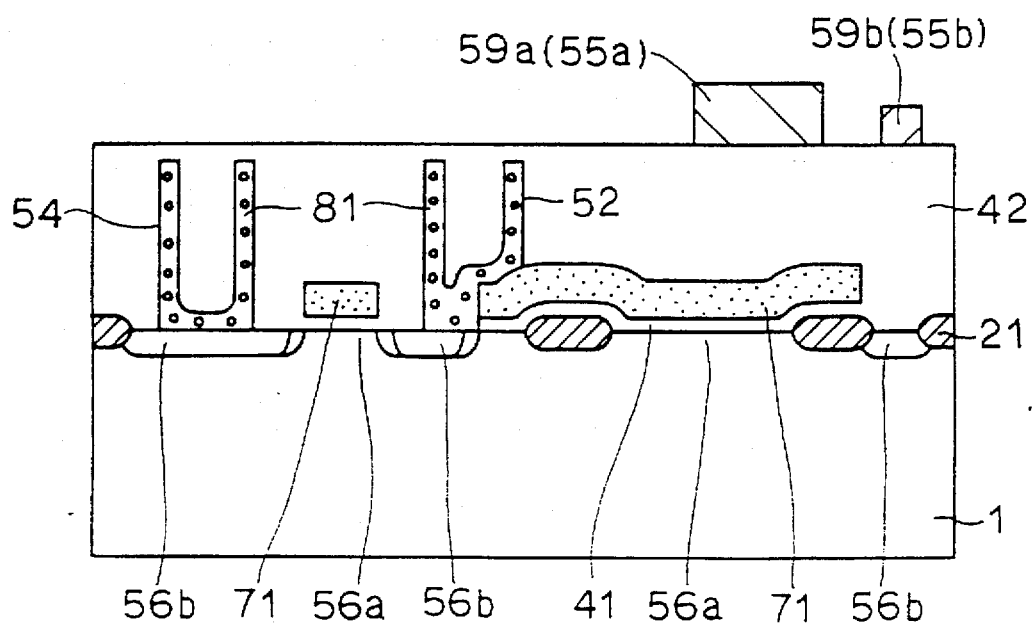

As shown in FIGS. 70A and 70B, the monocrystal silicon layers 59a (55a) and polycrystal silicon layers 59b (55b) are formed in accordance with a predetermined pattern. In this manner, the active layers of p-channel MOS transistors (TFTs) are formed.

Thereafter, the manufacturing process is carried out in accordance with the steps of embodiment 1 shown in FIGS. 62A and 62B to FIGS. 64A and 64B.

Embodiment 3 of a method of manufacturing SRAM

Figure 71A:
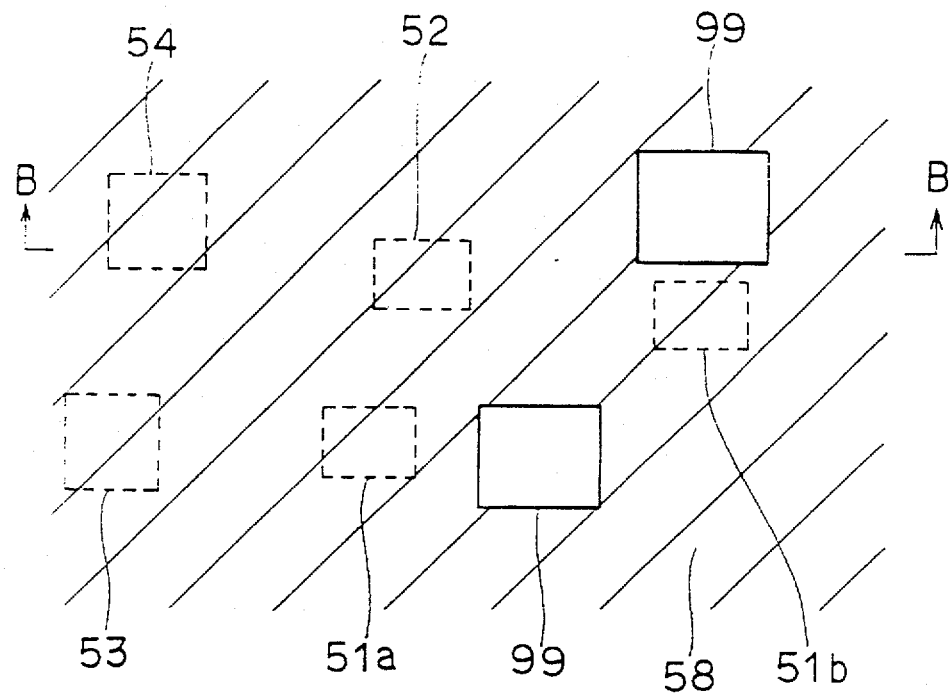
FIG. 71A is a plan showing a certain step in embodiment 3 of a method of manufacturing a memory cell of SRAM to which the thin-film transistor of the invention is applied.
Figure 71B:
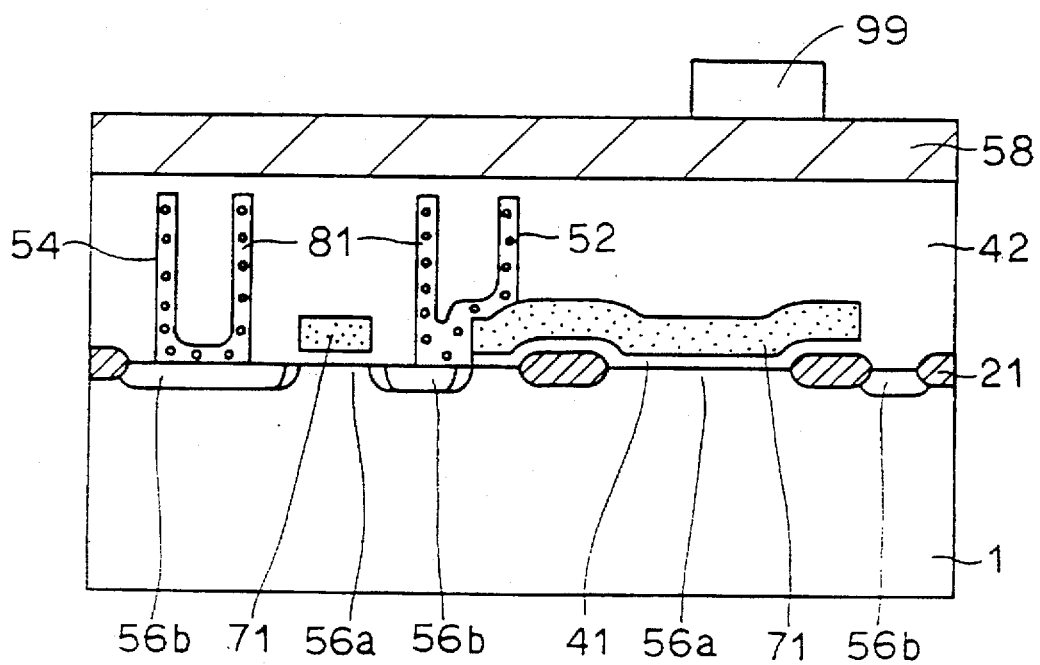
FIG. 71B is a cross section showing the same.

This embodiment represents a method of manufacturing a memory cell of SRAM using the method C of manufacturing the semiconductor thin film. The process of manufacturing the memory cell of SRAM employs steps similar to those of the embodiment 1 shown in FIGS. 56A and 56B to FIGS. 59A. and 59B, and these similar steps will not be described below. FIGS. 71A and 71B are a plan and a cross section showing a step subsequent to the manufacturing step of the embodiment 1 in FIGS. 59A and 59B, respectively.

Referring to FIGS. 71A and 71B, the amorphous silicon layer 58 is formed at a thickness of 1000 Å on the interlayer insulating film 42 by the CVD method at a temperature of 450° C. using disilane ($Si_2H_6$) gas as material gas. The resist film 99 is formed on the portions of amorphous silicon layer 58 corresponding to the channel regions of p-channel MOS transistors (TFTs). Using the resist film 99 as a mask, hydrogen ions or fluorine ions are implanted into the amorphous silicon layer 58 at a dosage of $1\times10^{15}/cm^2$ with an implanting energy of 5 kev. Thereafter, the resist film 99 is removed. Heat treatment is carried out on the amorphous silicon layer 58 in a nitrogen atmosphere at a temperature of 600° C. for five hours. Since the portion of amorphous silicon layer 58 corresponding to the channel region contains the nucleuses generated at a low density, the portion corresponding to the channel region is monocrystallized. Implantation of silicon ions serves to destroy minute nucleuses in the amorphous silicon and thereby to reduce the density of generated nucleuses in amorphous silicon. Meanwhile, if hydrogen ions or fluorine ions are implanted into the amorphous silicon, the implanted hydrogen or fluorine serves to generate minute nucleuses in the amorphous silicon. Thus, the minute nucleus is not generated in the channel region, i.e., region in which neither hydrogen ion nor fluorine ion is implanted, and a low density of generated nucleuses is maintained. Therefore, the above heat treatment causes monocrystallization of only the channel regions.

Thereafter the process is carried out in accordance with the steps of embodiment 1 shown in FIGS. 61 and 61B to FIGS. 64A and 64B.

Embodiment 4 of a method of manufacturing SRAM

Figure 72A:
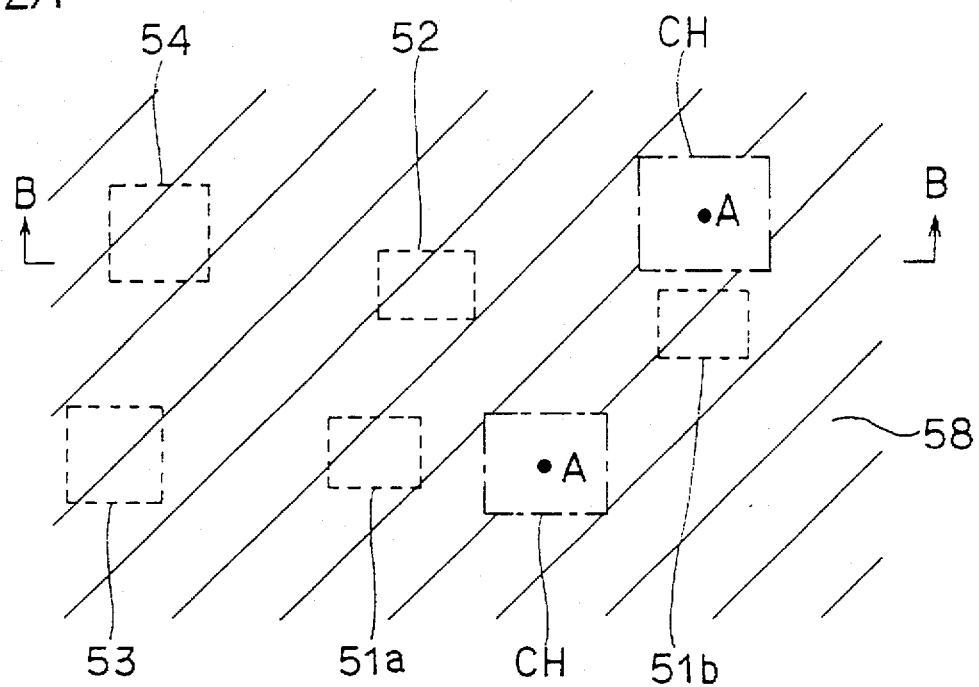
FIG. 72A is a plan showing a certain step in embodiment 4 of a method of manufacturing a memory cell of SRAM to which the thin-film transistor of the invention is applied.
Figure 72B:
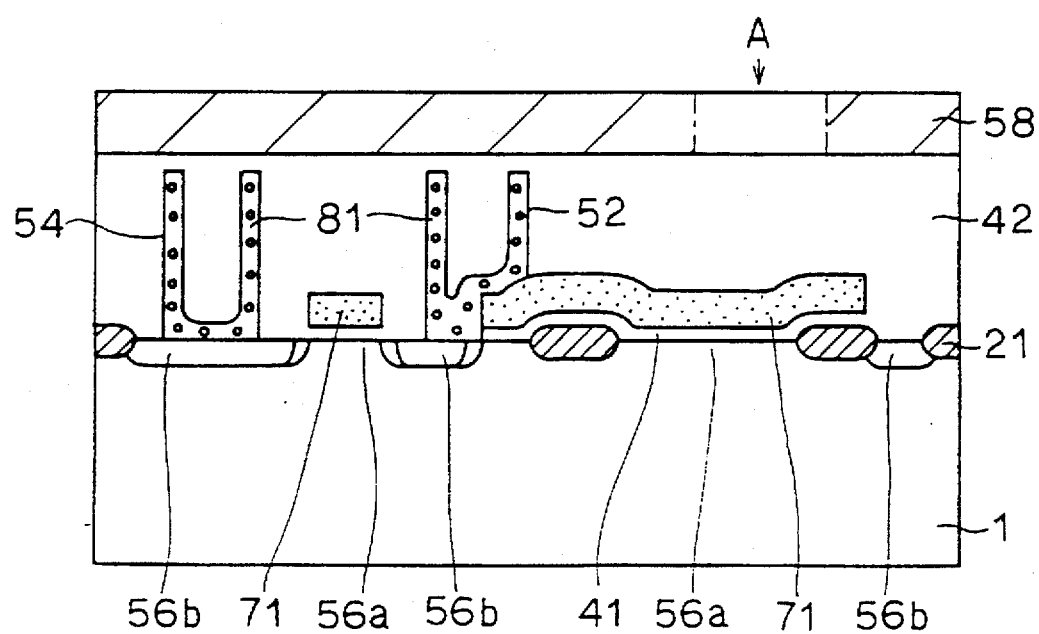
FIG. 72B is a cross section showing the same.

This embodiment represents a method of manufacturing SRAM to which the method D of manufacturing the semiconductor thin film is applied. FIGS. 72A and 72B are a plan and a cross section showing a manufacturing step subsequent to the manufacturing steps of embodiment 1 shown in FIGS. 56A and 56B to FIGS. 59A and 59B, respectively.

Referring to FIGS. 72A and 72B, the amorphous silicon layer 58 is formed at a thickness of 2000 Å on the interlayer insulating film 42. The amorphous silicon layer 58 may be formed by the CVD method at a temperature of 450° C. using disilane ($Si_2H_6$) as material gas, or may be formed by forming a polysilicon layer of 2000 Å in thickness and implanting silicon ions into the polysilicon layer at a dosage of $5\times10^{15}/cm^2$ with an implanting energy of 100 keV. Thereafter, an electron beam is directed into a center (point A in FIGS. 72A and 72B) of a portion corresponding to each channel region of TFT to be formed. The diameter of the electron beam is 0.05 μm, accelerating voltage is 10 keV, current is 50 μA (output: 0.5W), and irradiating time is 1 nsec/point. By the irradiation of electron beam, the amorphous silicon layer at the point A is melted, and is solidified into a minute crystal grain. Owing to the heat treatment in the nitrogen atmosphere at a temperature of 600° C. for five hours, the crystal grows in the amorphous silicon layer 58 from the nucleus formed of the minute crystal grain at the point A. Thereby, the portions corresponding to the channel regions are monocrystallized.

Thereafter, the manufacturing process is carried out in accordance with the steps of embodiment 1 shown in FIGS. 61A and 61B to FIGS. 64A and 64B.

Embodiment 5 of a method of manufacturing SRAM

Figure 73A:
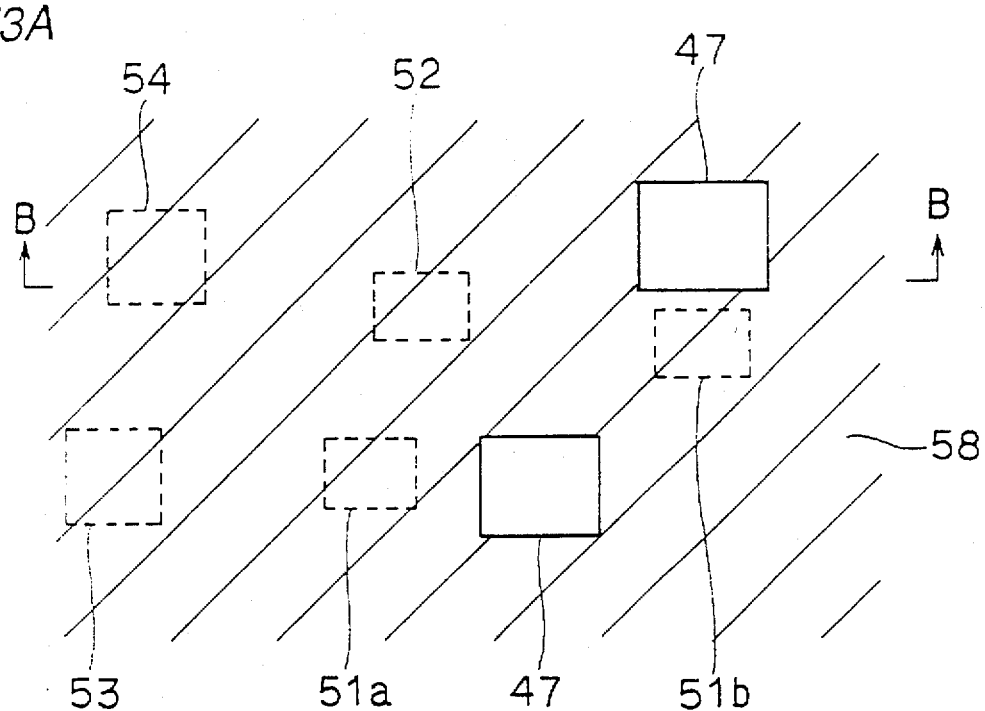
FIG. 73A is a plan showing a certain step in embodiment 5 of a method of manufacturing a memory cell of SRAM to which the thin-film transistor of the invention is applied.
Figure 73B:
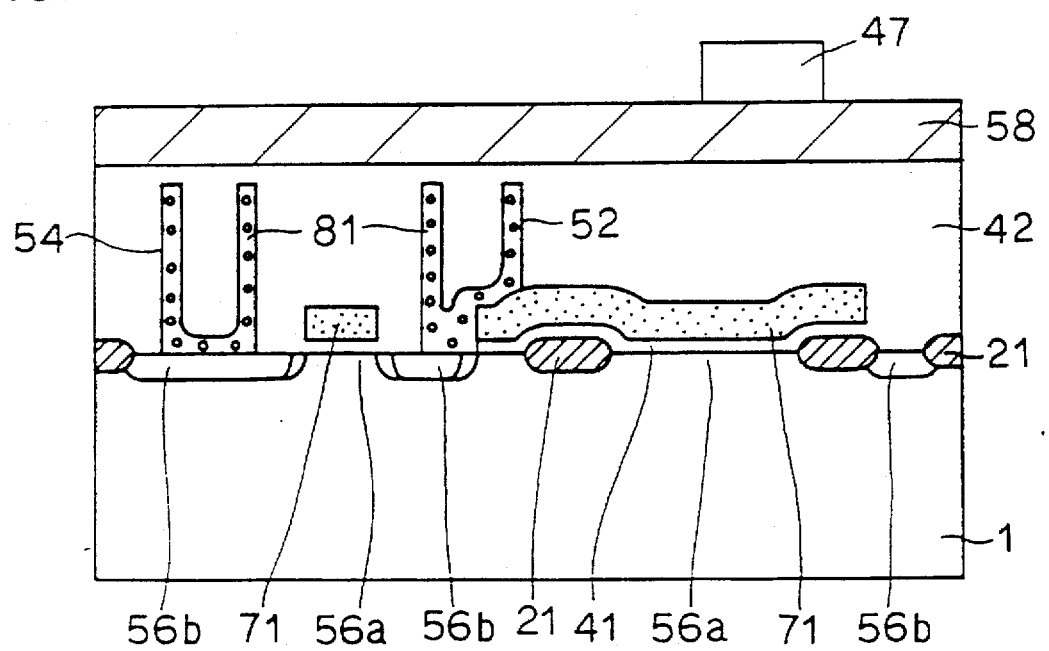
FIG. 73B is a cross section showing the same.

This embodiment represents a method of manufacturing a memory cell of SRAM using the method E of manufacturing the semiconductor thin film. FIGS. 73A and 73B are a plan and a cross section showing a manufacturing step subsequent to those of the embodiment 1 shown in FIGS. 5A and 56B to 59A and 59B, respectively.

Referring to FIGS. 73A and 73B, the amorphous silicon layer 58 is formed at a thickness of 1000 Å on the interlayer insulating 42. This amorphous silicon layer 58 may be formed by the CVD method at a temperature of 450° C. using gas of disilane, or may be formed by forming a polysilicon layer and ion-implanting silicon ions into the polysilicon layer at a dosage of $5\times10^{15}/cm^2$ with an implanting energy of 100 keV. The oxide film 47 is selectively formed on portions of the amorphous silicon layer 58 corresponding to the channel regions. This oxide film 47 is formed at a thickness of 1000 Å by an ECR-CVD method (electron cyclotron resonance CVD method) at a temperature of 500° C. Gas mixture of $SiH_4$ and $N_2O$ is used as material gas of the oxide film 47. The oxide film 47 which serves as a film for changing an internal stress of the amorphous silicon layer 58 must be formed at a temperature of not more than 600° C. At the temperature exceeding 600° C. amorphous silicon layer 58 would be crystallized during formation of the oxide film 47. Heat treatment is carried out in a nitrogen atmosphere at 600° C. for five hours while maintaining the oxide film 47 on the amorphous silicon layer 58. Thereby, portions of the amorphous silicon layer 58 covered with the oxide film 47, i.e., channel regions are monocrystalized. Thereafter, the oxide film 47 is removed.

The reason that only the channel regions are monocrystallized is that the speed of crystal growth increases to twice or more when there is a compression stress of $10^9$ dync/$cm^2$ in the amorphous silicon. Since the speed of growth is large only in the channel regions, only the channel regions are monocrystalized. Thus, if the oxide film is formed only on the channel region, a stress is generated in the amorphous silicon due to a difference between thermal expansion coefficients of $SiO_2$ and Si. In this embodiment, since the oxide film 47 is formed at the temperature of 100° C. a stress does not generate at the temperature of 100° C. between the amorphous silicon layer 58 and oxide film 47. When the temperature is increased to 600° C. in this state, $SiO_2$ of which thermal expansion coefficient is smaller than that of Si acts to suppress expansion of Si atoms, and thus a compression stress is generated in the amorphous silicon layer 58.

Thereafter the manufacturing process is carried out in accordance with the steps of embodiment 1 shown in FIGS. 61A and 61B to FIGS. 64A and 64B.

Embodiment 6 of a method of manufacturing SRAM

Figure 74A:
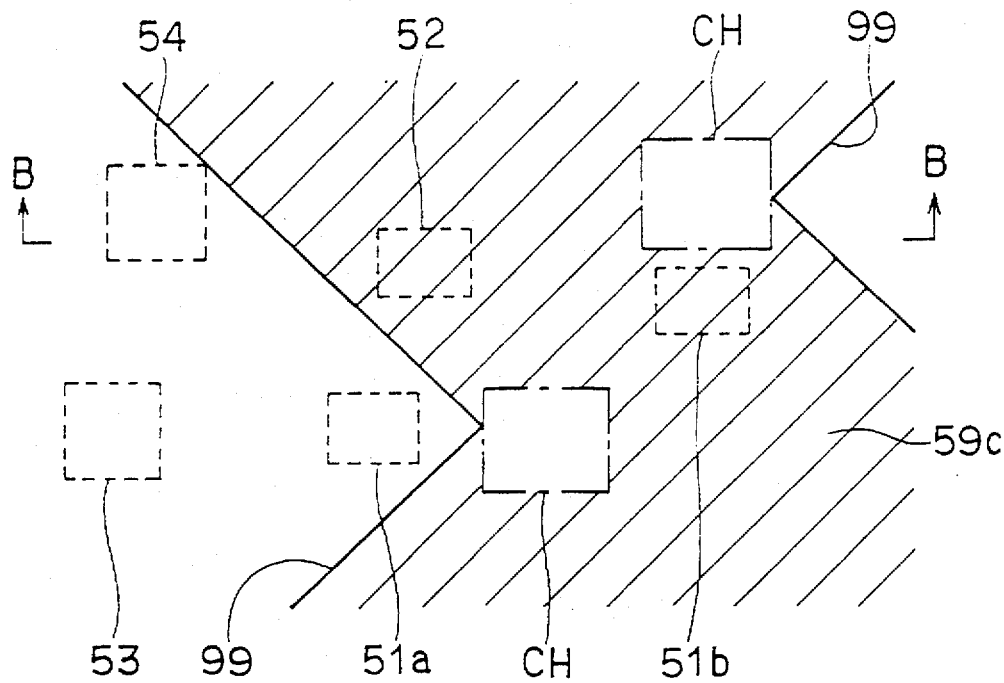
FIG. 74A is a plan showing a certain step in embodiment 6 of a method of manufacturing a memory cell of SRAM to which the thin-film transistor of the invention is applied.
Figure 74B:
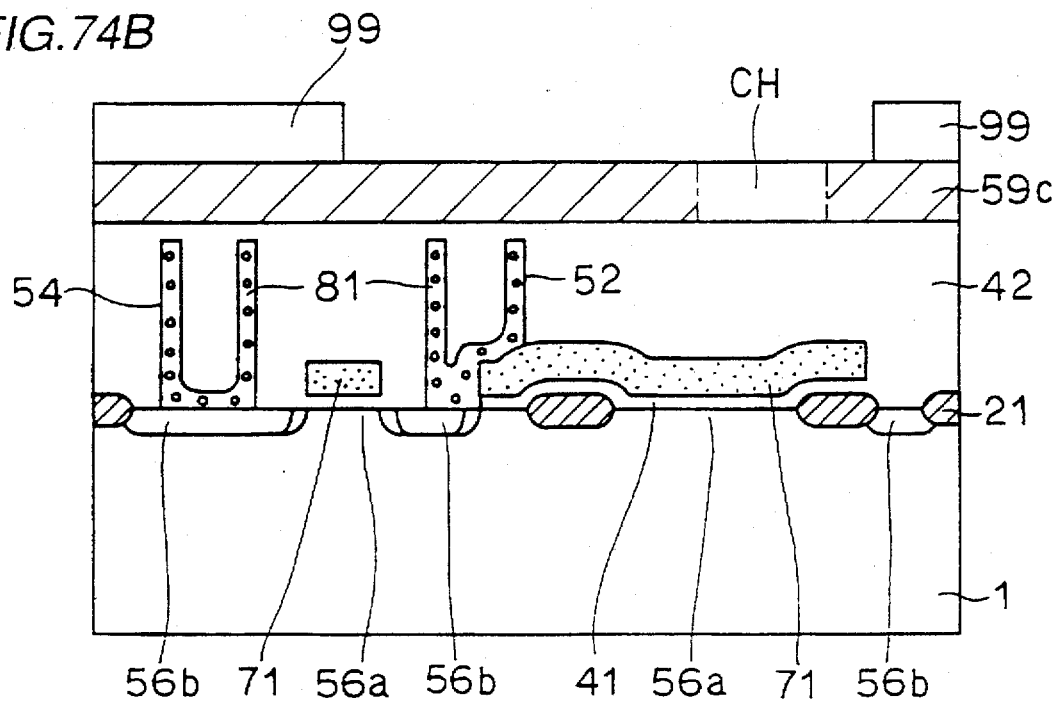
FIG. 74B is a cross section showing the same.

This embodiment represents a method of manufacturing a memory cell of SRAM to which the method F of manufacturing the semiconductor thin film is applied. FIGS. 74A and 74B are a plan and a cross section showing steps subsequent to the manufacturing steps of the embodiment 1 shown in FIGS. 56A and 56B to 59A and 59B, respectively.

Referring to FIGS. 74A and 74B, a polysilicon layer 59c is formed at a thickness of 1000 Å on the interlayer insulating film 42. The resist film 99 is selectively formed on the polysilicon layer 59c, exposing surface portions of the polysilicon layer 59c including the channel regions. The resist film 99 is patterned so that each corner or projected portion thereof is in point-contact with the channel region CH. Using the resist film 99 as a mask, silicon ions are implanted into the polysilicon layer 59c at a dosage of $5 \times 10^{15}/cm^2$ with an implanting energy of 100 keV. Thereby, portions of the polysilicon layer 59c not covered with the resist film 99 change into amorphous silicon, and the portions of the polysilicon layer 59c covered with the resist film 99 remain as polysilicon. Thereafter, the resist film 99 is removed. The polysilicon layer 59, which has been partially changed into amorphous silicon, is thermally processed in a nitrogen atmosphere at a temperature of 600° C. for five hours. Crystal growth in the amorphous silicon starts from the points contacting the polysilicon regions. Since each channel region CH is in contact with the polysilicon region only through one point, the crystal growth in amorphous silicon originates from the nucleus formed of the crystal grain at the tip end of the polysilicon region contacting the same. Therefore, the portions of amorphous silicon of the channel regions CH are monocrystallized.

Thereafter the manufacturing process is carried out in accordance with the steps of embodiment 1 shown in FIGS. 61A and 61B to FIGS. 64A and 64B.

Embodiment 7 of a method of manufacturing SRAM

Figure 75A:
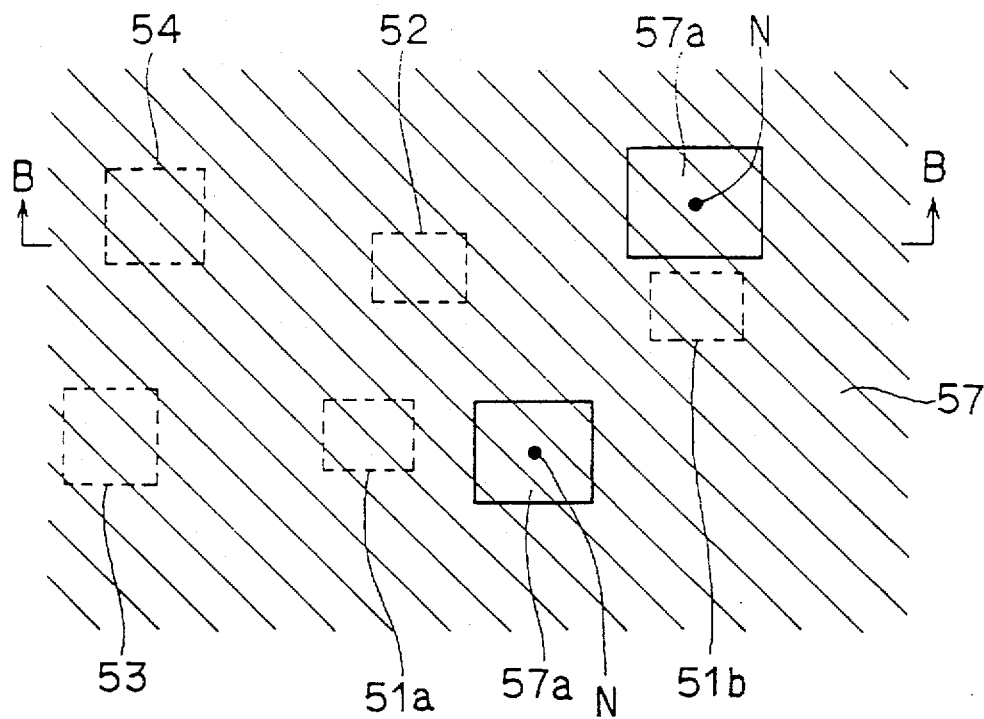
Figure 75B:
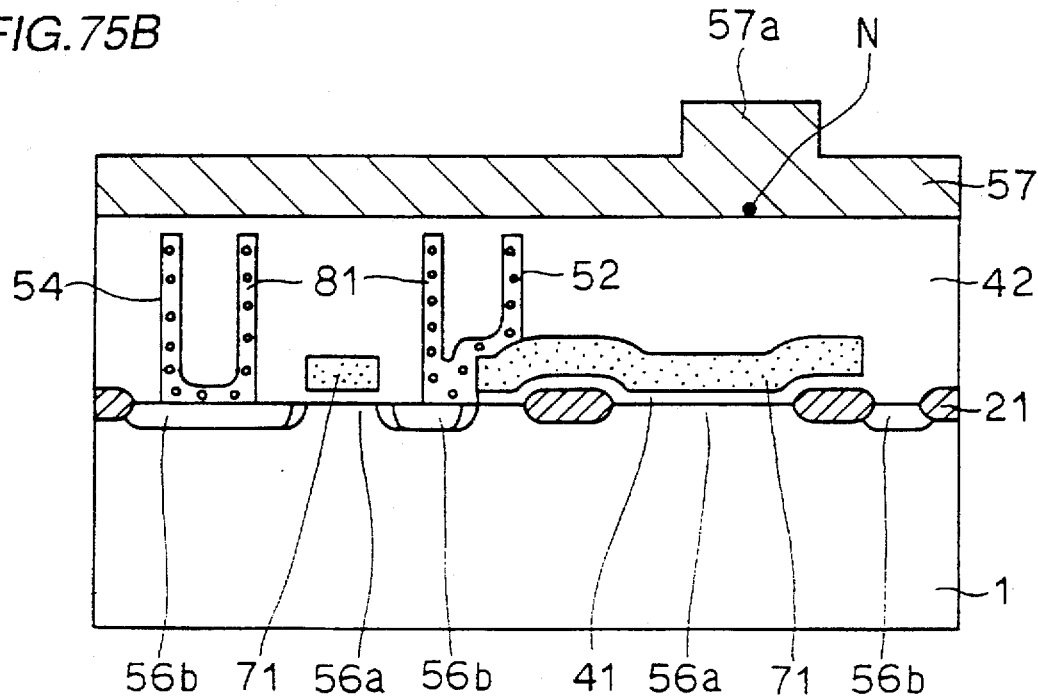
Figure 76A:
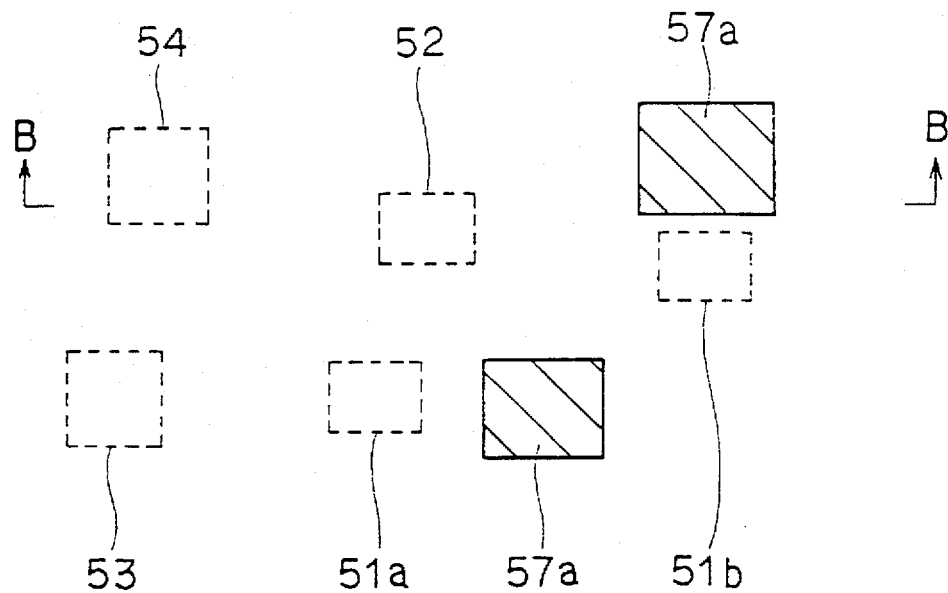
Figure 76B:
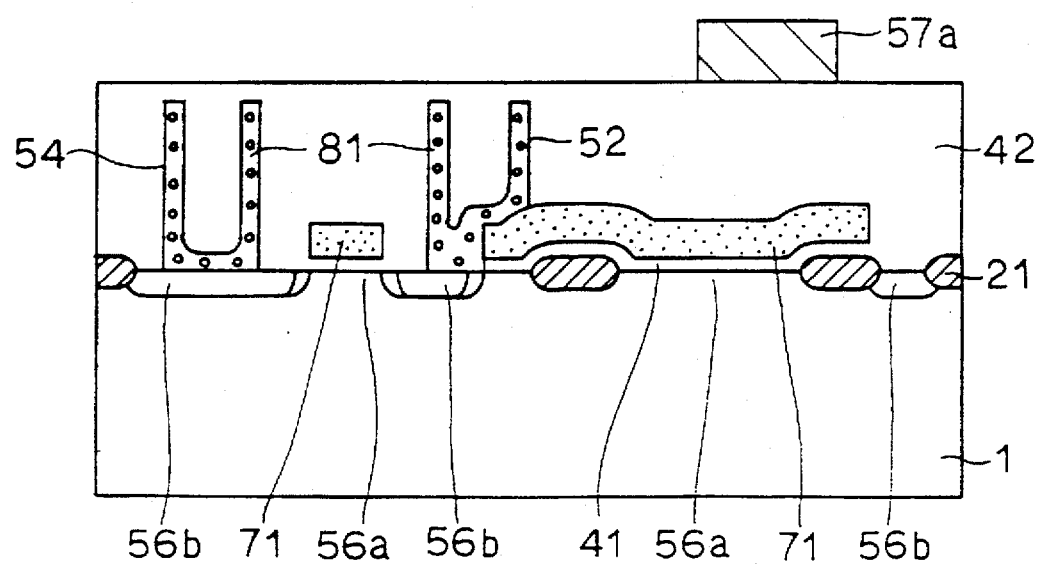

This embodiment represents a method of manufacturing a memory cell of SRAM to which the method G of manufacturing the semiconductor thin film is applied. FIGS. 75A and 75B as well as FIGS. 76A and 76B are plans and cross sections which successively show steps subsequent to the manufacturing steps of embodiment 1 shown in FIGS. 56A and 56B to FIGS. 59A and 59B. Referring to FIGS. 75A and 75B, an amorphous silicon layer having portions of different thicknesses is formed on the interlayer insulating film 42. The amorphous silicon layer is formed of the amorphous silicon layer 57 of 1000 Å in thickness and the amorphous silicon layers 57a of 2000 Å in thickness. Thereafter, heat treatment is carried out on the amorphous silicon layer in a nitrogen atmosphere at a temperature of 600° C. for 30 minutes. The temperature. and time period for this heat treatment are controlled to generate only one nucleus in the thick region of amorphous silicon layer 57a. A nucleus is not generated in the thin region of amorphous silicon layer 57 owing to a time delay of generation of nucleus in the amorphous silicon layer of the small thickness. In other words, the reason of the above is that the speed of growth of the thin portion of amorphous silicon layer 57 is lower than that of the thick portion of amorphous silicon layer 57a. In this manner, one crystal nucleus N is generated in each thick amorphous silicon layer 57a.

As shown in FIGS. 76A and 76B, the amorphous silicon layer is etched by a thickness of 1000 Å, so that the thin portions of amorphous silicon layer 57 is removed, and only the amorphous silicon layers 57a which have the large thickness are left at a thickness of 1000 Å. The amorphous silicon layers 57a are thermally processed in the nitrogen atmosphere at a temperature of 600° C. for five hours. This heat treatment causes monocrystallization of the amorphous silicon layers 57a remaining in the channel regions, because one crystal nucleus exists in each amorphous silicon layer 57a.

Thereafter manufacturing process is carried out in accordance with the steps of embodiment 2 and in FIGS. 68A and 68B to FIGS. 70A and 70B. Manufacturing steps subsequent to FIGS. 70A and 70B are carried out in accordance with the steps shown in FIGS. 62A and 62B to FIGS. 64A and 64B.

Figure 77A:
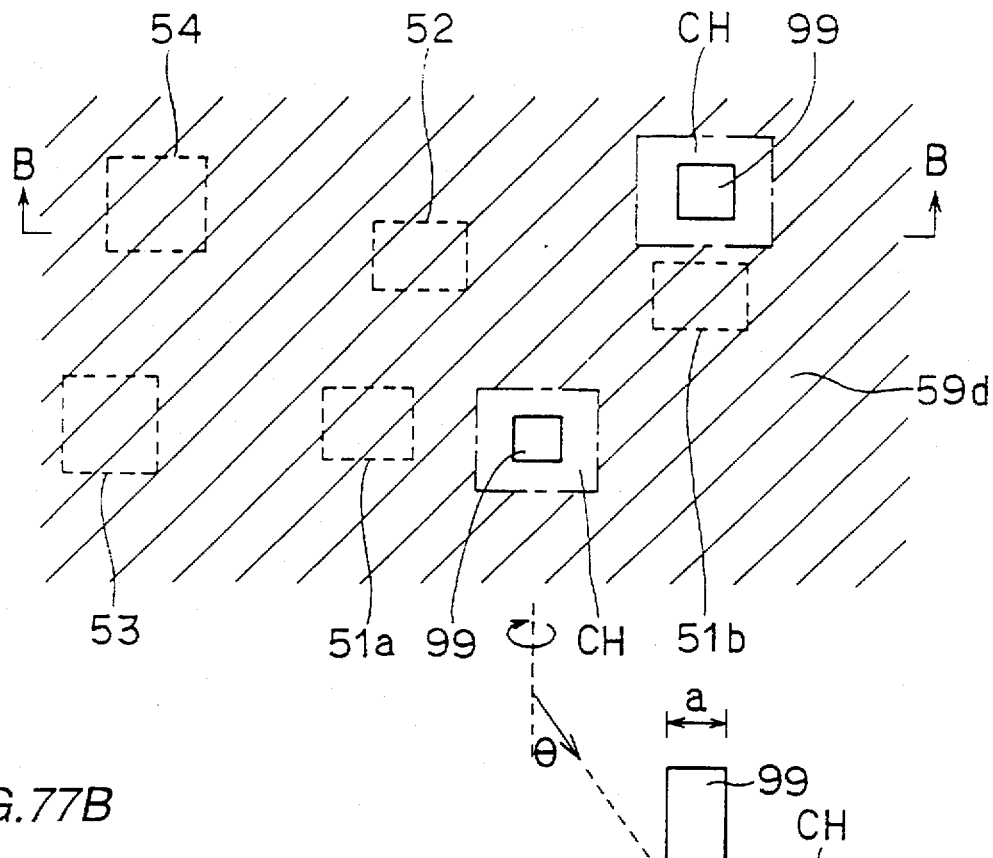
Figure 77B:
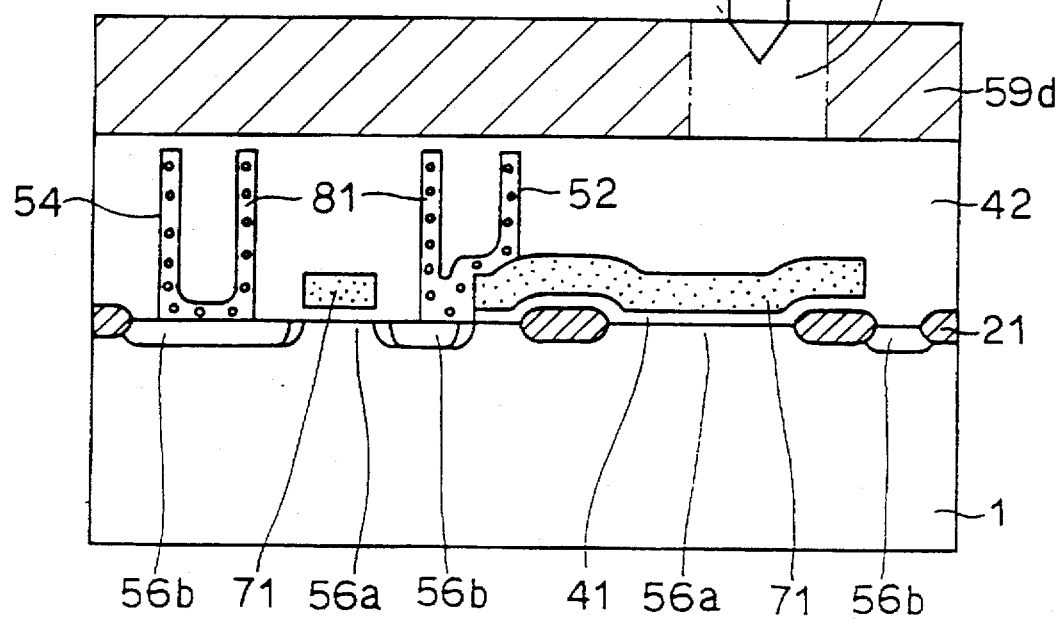

FIGS. 77A and 77B are a plan and a cross section showing another manufacturing step in this embodiment subsequent to that of the embodiment 1 shown in FIGS. 59A and 59B, respectively. Referring to FIGS. 77A and 77B, a polysilicon layer 59d is formed at a thickness of 2000 Å on the interlayer insulating film 42. This polysilicon layer 59d is formed of silicon having a crystal grain diameter of 0.8 μm (=d). The resist film 99 is selectively formed on portions of the polysilicon layer 59d corresponding to the channel regions. Each portion of the resist film 99 has a planer area of 0.4 mm×0.4 mm (=a). The thickness of the resist film 99 is 1 mm. In connection with this, an oxide film may be formed in stead of the resist film. Using the resist film 99 as a mask, silicon ions are implanted into the polysilicon layer 59d at a dosage of $5 \times 10^{15}/cm^2$ with an implanting energy of 100 keV. This ion implantation is carried out by a continuous rotary implanting method at an angle θ of 30 degrees. Thus, the silicon ions are implanted at the angle of 30 degrees while rotating the wafer. Thereby, the silicon ions are not implanted into the regions located immediately under the resist film 99 and having a triangular section, so that crystal remains therein. Other regions are changed into amorphous silicon by the implantation of silicon ions. Thereafter, the resist film 99 is removed. Heat treatment is carried out in a nitrogen atmosphere at a temperature of 600° C. for five hours, so that the regions having the triangular section each form a nucleus from which the growth of crystal originates. Thereby, the channel regions CH are monocrystalized. It is necessary to determine the grain diameter (d) of polysilicon layer 59d and the size (a) of resist film 99 so as to satisfy the condition of a<d (preferably, a≦d/2). Under this condition, the region of the triangular section immediately under the resist film 99 is made of only one crystal grain.

Manufacturing process subsequent to the above is carried out similarly to that of the embodiment 1 shown in FIGS. 61A and 61B to FIGS. 64A and 64B.

Embodiment 8 of a method of manufacturing SRAM

This embodiment represents a method of manufacturing a memory cell of SRAM to which the method H of manufacturing the semiconductor thin film is applied.

FIGS. 78A and 78B to FIGS. 82A and 82B are plans and cross sections which successively show steps subsequent to the manufacturing steps of the embodiment 1 shown in FIGS. 56A and 56B to FIGS. 59A and 59B.

Figure 78A:
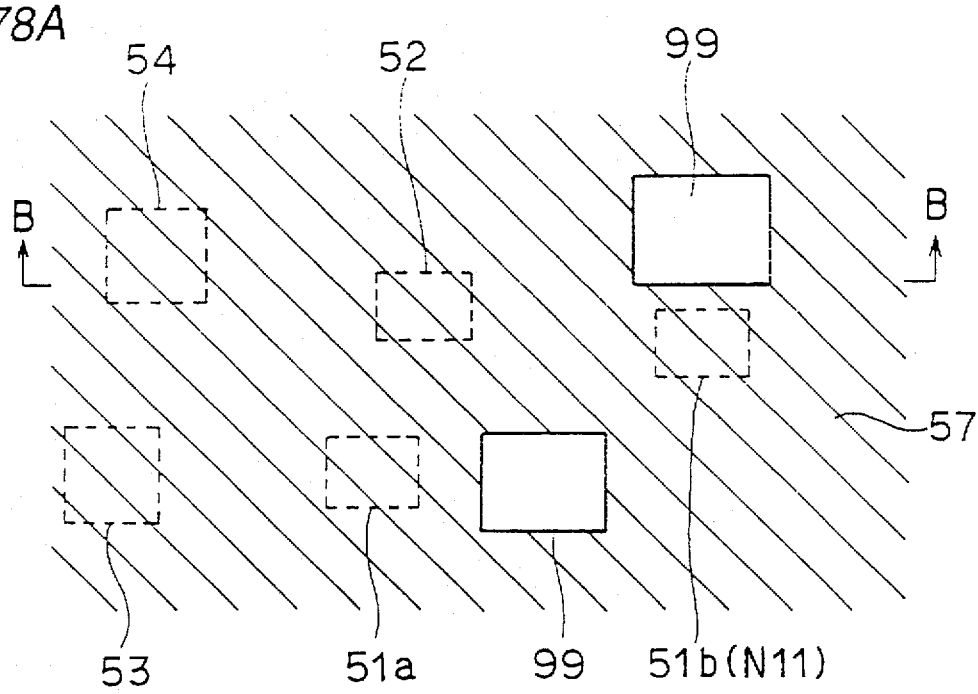
Figure 78B:
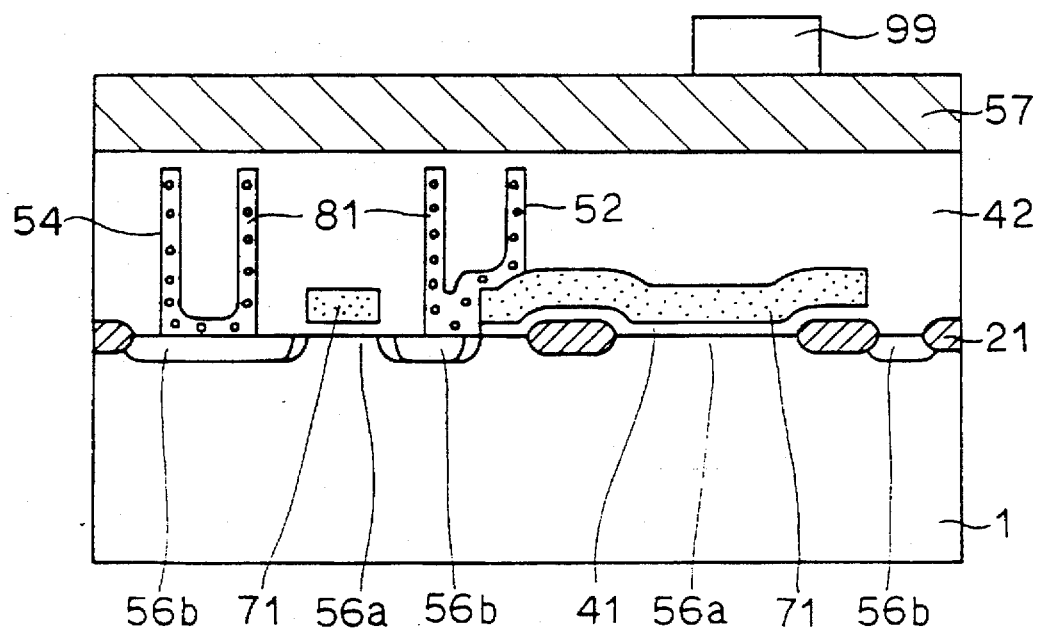

Referring to FIGS. 78A and 78B, amorphous silicon layer 57 is formed at a thickness of 2000 Å on the flattened interlayer insulating film 42. The resist film 99 is selectively formed on portions of the amorphous silicon layer 57 corresponding to the channel regions of p-channel MOS transistors (TFTs).

Figure 79A:
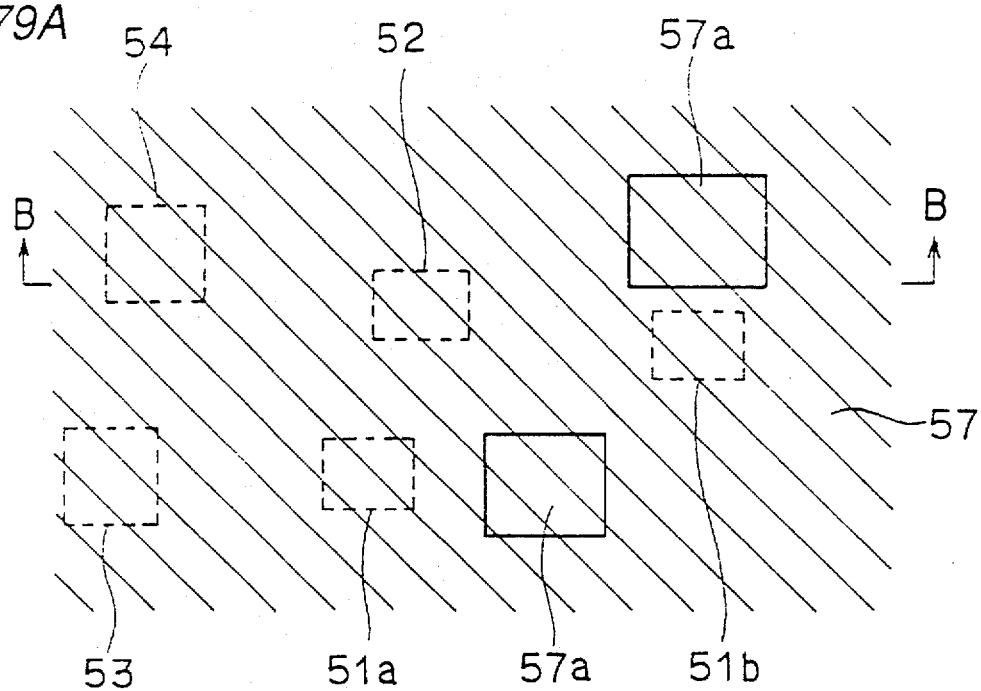
Figure 79B:
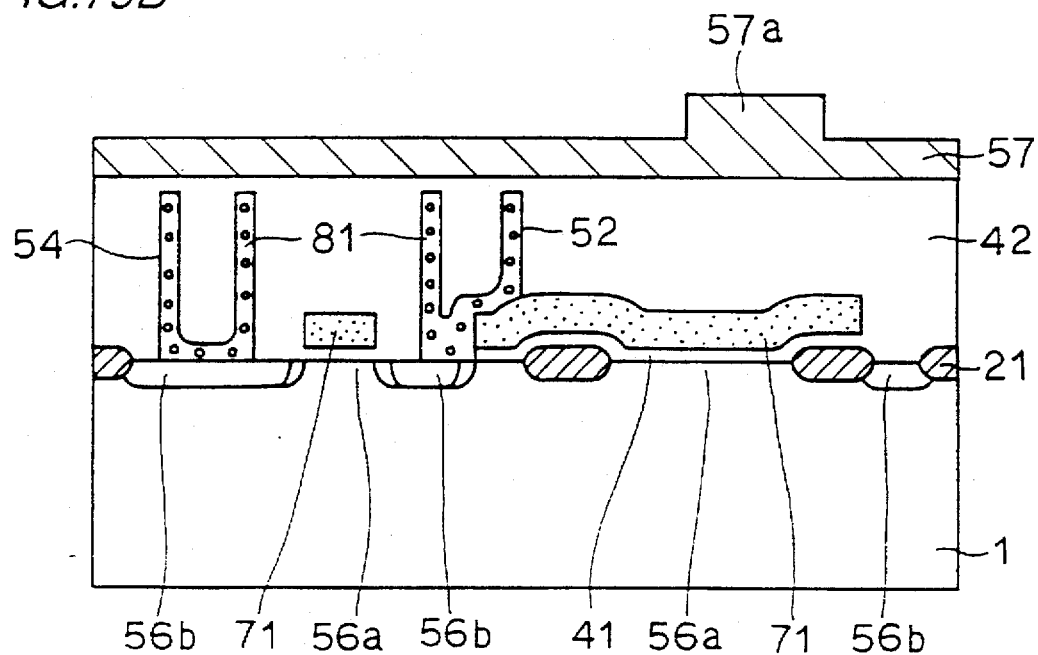

As shown in FIGS. 79A and 79B, the amorphous silicon layer 57 is removed by a thickness of 1000 Å, using the resist film 99 as a mask. Thereafter, the resist film 99 is removed. Thereby, the thick amorphous silicon layers 57a are formed on the regions corresponding to the channel regions.

Figure 80A:
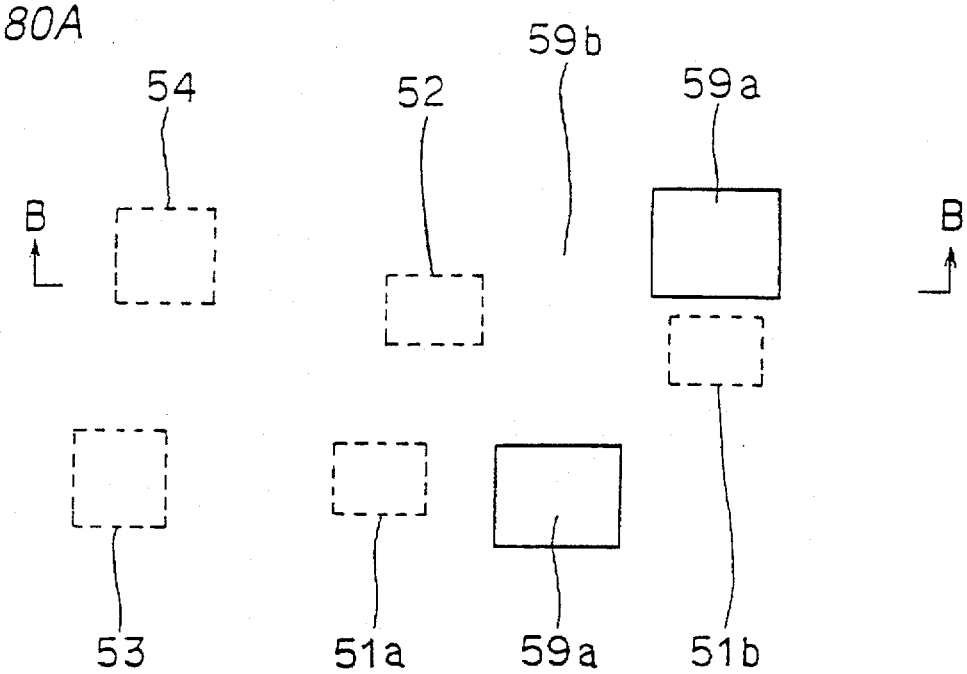
Figure 80B:
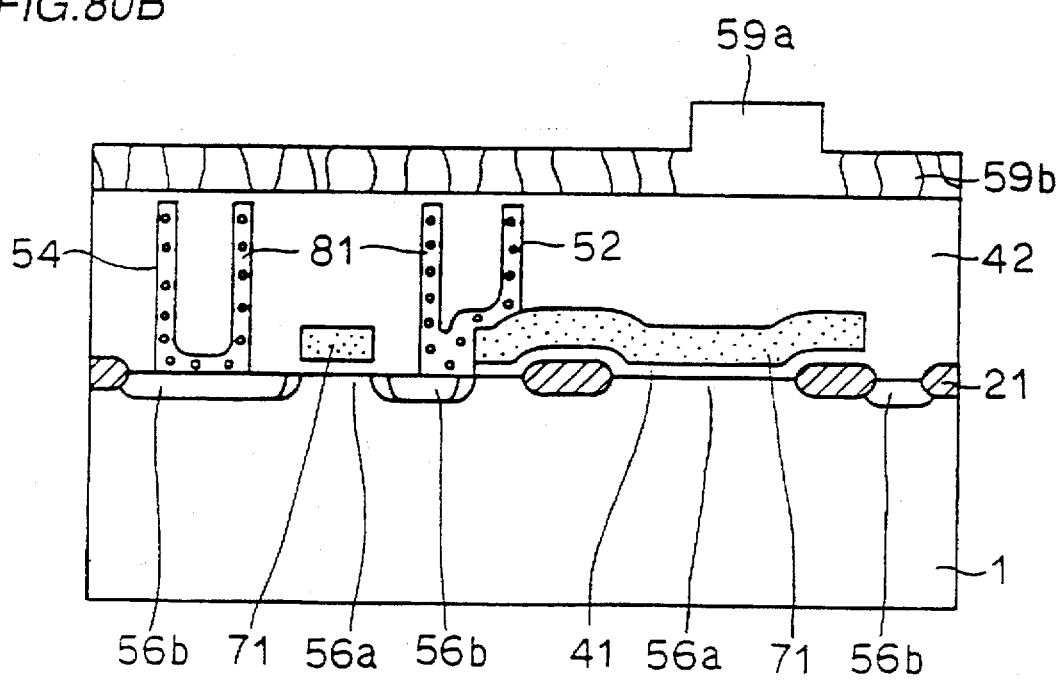

As shown in FIGS. 80A and 80B, heat treatment is carried out on the amorphous silicon layer 57 in a nitrogen atmosphere at a temperature of 600° C. for five hours. Thereby, the amorphous silicon layers 57 and 57a are crystallized. However, each thick amorphous silicon layer 57a is monocrystallized because the speed of crystal growth is high. Thus, the portions 57a of amorphous silicon layer are crystallized to form monocrystal silicon layers 59a. Meanwhile, the portion of amorphous silicon layer 57 is crystallized to form a polysilicon layer 59b. Crystal grain boundaries are schematically shown together with the polysilicon layer 59b in FIG. 80B.

Figure 81A:
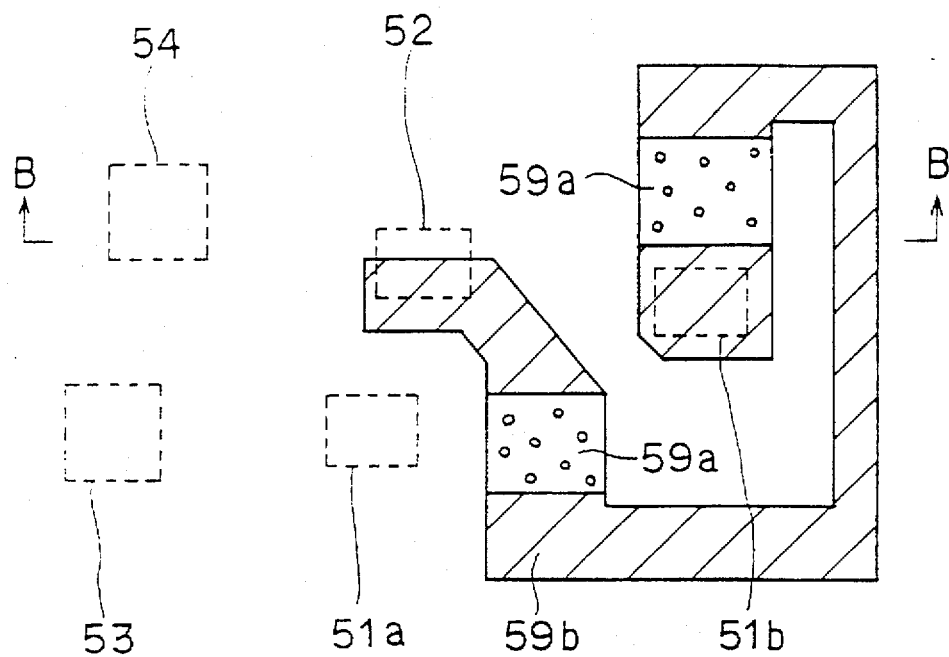
Figure 81B:
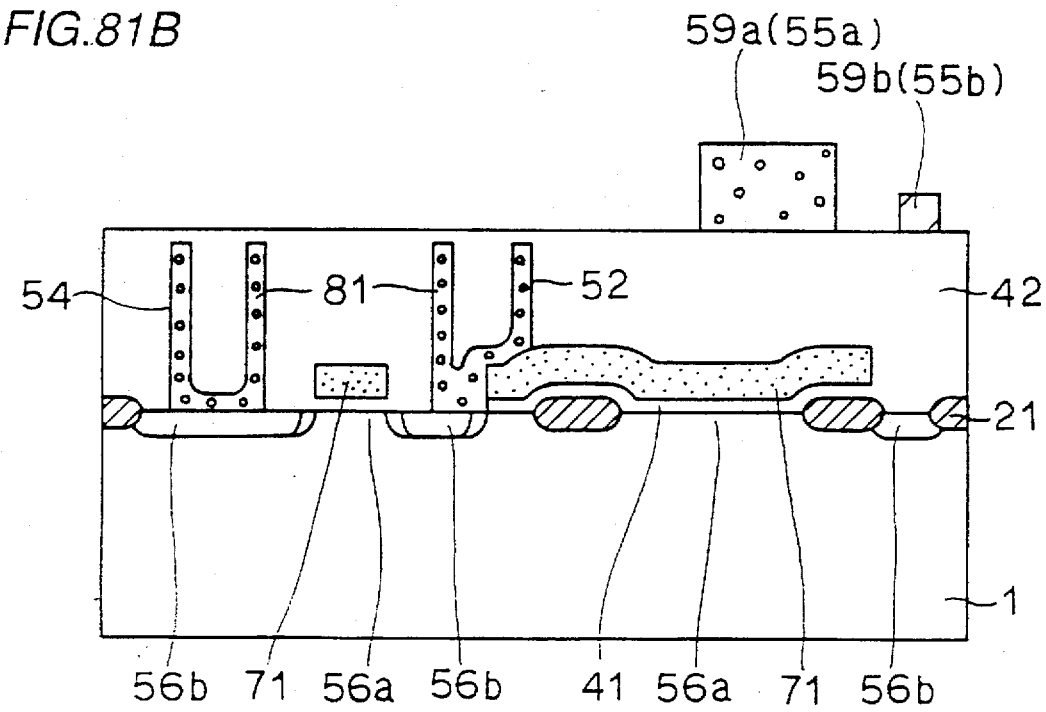

As shown in FIGS. 81A and 81B, the crystallized monocrystal silicon layers 59a and polysilicon layer 59b are selectively removed in accordance with a predetermined pattern.

Figure 82A:
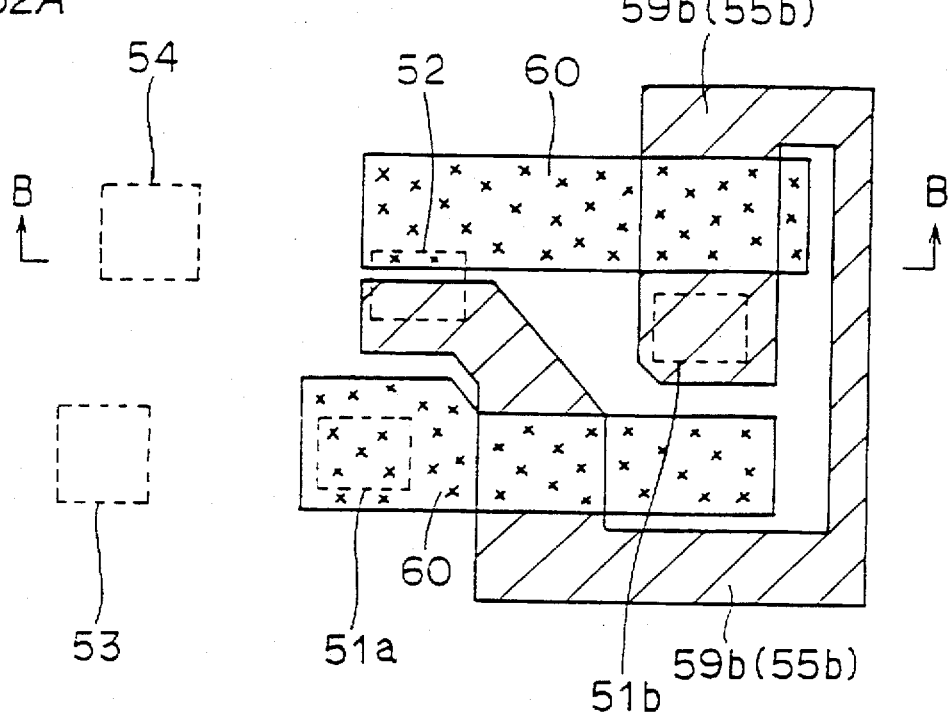
Figure 82B:
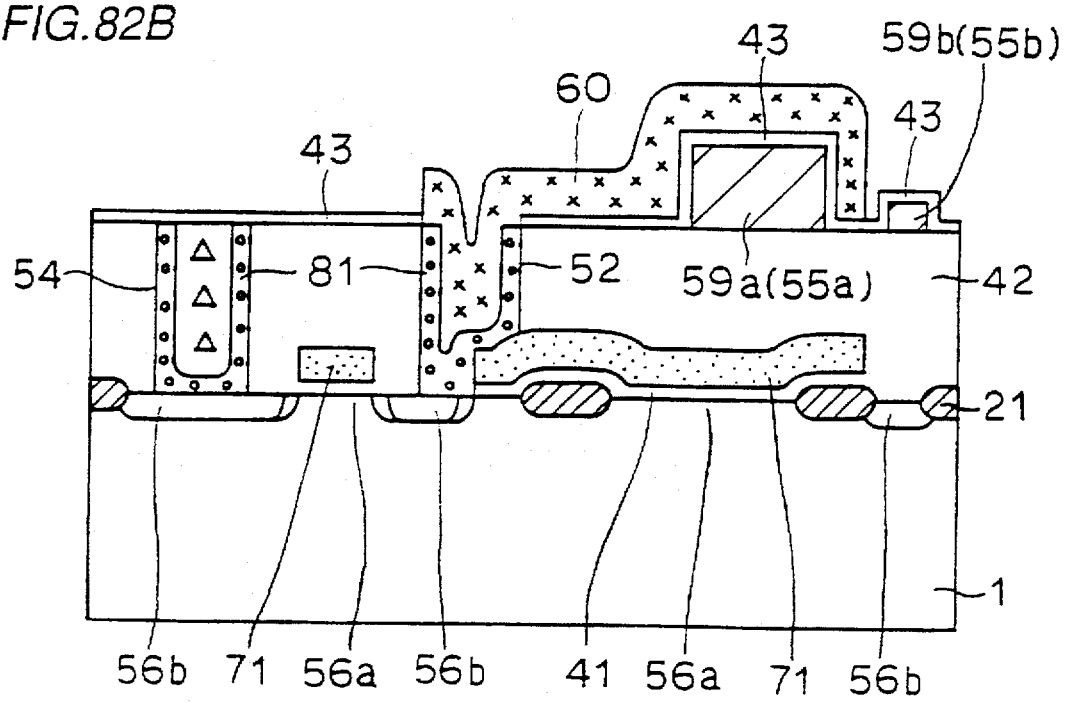

As shown in FIGS. 82A and 82B the monocrystal silicon layers 59a and polysilicon layers 59b are covered with the gate insulating film 43 formed of an oxide film. Then, only portions of the oxide film 43 which are located in the region of through hole 51a and the half region (upper half region in FIG. 82A) of through hole 52 are removed. The gate electrode 60 is formed on the gate insulating film 43 in accordance with a predetermined pattern. Then, boron is ion-implanted, using the gate electrode 60 as a mask, to form source/drain regions 55b of p-channel MOS transistors.

Figure 64A:
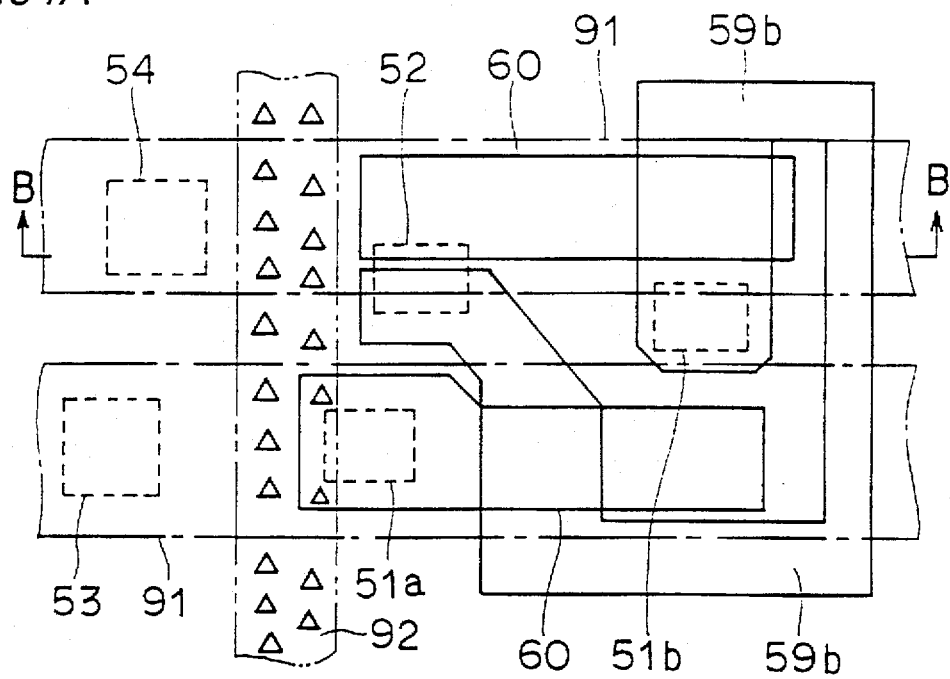
Figure 64B:
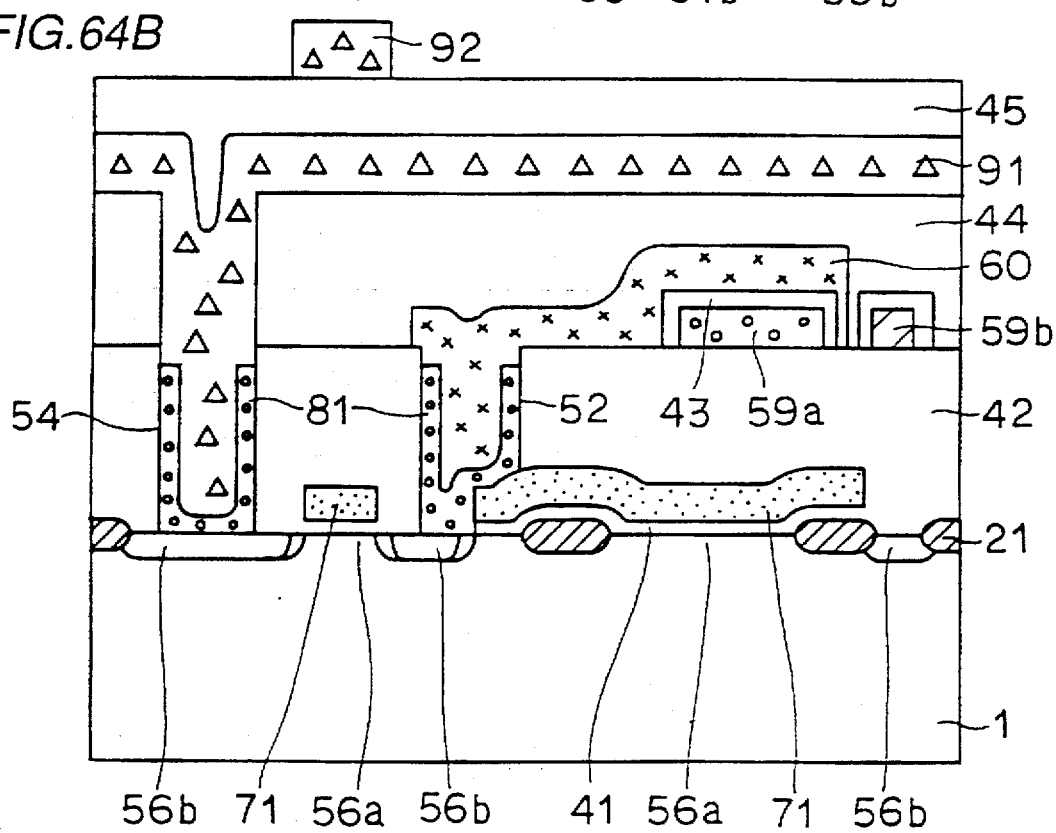

Thereafter the manufacturing process is carried out in accordance with the steps of the embodiment 1 shown in FIGS. 63A and 63B as well as FIGS. 64B and 64B.

In the method of manufacturing the memory cell of SRAM, the monocrystal layer constituting the channel regions of TFTs is produced from the amorphous silicon layer. The density (pieces/cm$^2$) of generated nucleuses in the amorphous silicon layer and the number of crystal nucleuses in the channel region (0.4 µm×0.8 µm) will be described below in connection with various methods of manufacturing the amorphous silicon layer.

(i) When an amorphous silicon layer is formed by the CVD method at a temperature of 550° C. using the silane (SiH$_4$) as material gas.

Density of generated nucleuses: $1 \times 10^{10}$ pieces/cm$^2$ or less; number of crystal nucleuses in the channel region: 32 pieces (ii) When an amorphous silicon layer is formed by the CVD method at a temperature of 450° C. using the disilane (Si$_2$H$_6$) as material gas.

Density of generated nucleuses: $6 \times 10^7$ pieces/cm$^2$ or less; number of crystal nucleuses in the channel region: 0.2 pieces (iii) When an amorphous silicon layer is formed by implanting silicon ion into a polysilicon layer at an implanting rate of $5 \times 10^{15}$/cm$^2$.

Density of generated nucleuses: $5 \times 10^7$ pieces/cm$^2$ or less; number of crystal nucleuses in the channel region: 0.16 pieces (iv) When an amorphous silicon layer is formed by implanting silicon ion into a polysilicon layer at an implanting rate of $2 \times 10^{15}$/cm$^2$.

Density of generated nucleuses: $3 \times 10^8$ pieces/cm$^2$ or less; number of crystal nucleuses in the channel region: 1 piece In view of the densities of generated nucleuses in the channel region in connection with the respective methods of manufacturing the amorphous silicon layer, it is necessary to employ the method (ii) or (iii) for manufacturing the amorphous silicon layer in order to form the whole channel region (0.4 µm×0.8 µm) of the TFT in the memory cell of miniaturized SRAM consisting of the monocrystal layer. Thus, the minute channel region of TFT in the memory cell of miniaturized SRAM can be formed by carrying out the monocrystallization according to the manufacturing methods A–H described above, while maintaining the density of generated nucleuses in the amorphous silicon layer at 1 or less. By manufacturing the monocrystal layer from the amorphous silicon layer containing the crystal nucleuses generated at a reduced density, the monocrystal layer of which density of defects is suppressed at a low value can be obtained. Thereby, it is possible to obtain the TFT satisfying intended and required values (i.e., ON current of 0.25 µA or more and OFF current of 15 fA or less).

As described above, the field effect thin-film transistor of the invention can be applied to the miniaturized memory cell of SRAM for stabilizing the reading and writing operations and reducing the power consumption of SRAM.

According to the field effect thin-film transistor of the invention, the high ON current and low OFF current can be achieved, compared with the conventional thin-film transistor.

According to the method of manufacturing the field effect thin-film transistor of the invention, the channel region is controlled to be formed of the monocrystal, and the density of defects thereof is maintained at an intended low value. Therefore, the thin-film transistor shows the higher ON current and lower OFF current.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a field effect thin-film transistor, having a channel region, formed on an insulator, comprising the steps of:

forming a polycrystalline semiconductor film;

implanting ions selectively into said polycrystalline semiconductor film at an implanting rate to form an amorphous semiconductor film controlled to include a region in which the number of generated crystal nucleus is one or less;

thermally processing said amorphous semiconductor film to form a crystalline semiconductor thin film including a region made of monocrystal;

forming a gate insulating film on said region;

forming a gate electrode on said gate insulating film; and introducing impurity into two regions located at opposite sides of said region in said crystalline semiconductor thin film to form source and drain regions, wherein a region rendered amorphous by ion implantation and monocrystalized by thermal processing includes the channel region.

2. A method of manufacturing a field effect thin-film transistor, having a channel region, formed on an insulator, comprising the steps of:

forming an amorphous semiconductor film having a main surface and including a region, in which the number of generated crystal nucleus is controlled to be one or less;

selectively removing said amorphous semiconductor film to form a side surface of said amorphous semiconductor film forming an acute angle with respect to said main surface;

thermally processing said amorphous semiconductor film to form a crystalline semiconductor thin film including a region made of monocrystal;

forming a gate insulating film on said region;

forming a gate electrode on said gate insulating film; and introducing impurity into two regions located at opposite sides of said region in said crystalline semiconductor thin film to form source and drain regions, wherein a region changed from amorphous to monocrystalline includes the channel region.

3. The method according to claim 1, wherein:

the source and drain regions are separated by the channel region; and the region made of a monocrystal is larger than the channel region.

4. The method according to claim 2, wherein:

the source and drain regions are separated by the channel region; and the region made of a monocrystal is larger than the channel region.

* * * * *